US008747700B2

(12) United States Patent
Nakaie et al.

(10) Patent No.: US 8,747,700 B2
(45) Date of Patent: Jun. 10, 2014

(54) CHARGE-TRANSPORTING VARNISHES

(75) Inventors: Naoki Nakaie, Funabashi (JP); Tomohisa Yamada, Funabashi (JP)

(73) Assignee: Nissan Chemical Industries, Ltd., Tokyo (JP)

(*) Notice: Subject to any disclaimer, the term of this patent is extended or adjusted under 35 U.S.C. 154(b) by 537 days.

(21) Appl. No.: 13/123,293

(22) PCT Filed: Oct. 8, 2009

(86) PCT No.: PCT/JP2009/067530
§ 371 (c)(1),
(2), (4) Date: Apr. 8, 2011

(87) PCT Pub. No.: WO2010/041701
PCT Pub. Date: Apr. 15, 2010

(65) Prior Publication Data
US 2011/0195355 A1    Aug. 11, 2011

(30) Foreign Application Priority Data

Oct. 9, 2008    (JP) ................. 2008-262454

(51) Int. Cl.
  *H01B 1/00*      (2006.01)
  *H01L 29/08*     (2006.01)
  *H01J 1/62*      (2006.01)
(52) U.S. Cl.
  USPC ............................. 252/500; 257/40; 313/483
(58) Field of Classification Search
  USPC ........... 252/500–521.6; 313/504, 483; 257/40
  See application file for complete search history.

(56) References Cited

U.S. PATENT DOCUMENTS

| 5,317,169 A | 5/1994 | Nakano et al. |
| 5,726,457 A | 3/1998 | Nakano et al. |

(Continued)

FOREIGN PATENT DOCUMENTS

| EP | 0901176 A2 | 3/1999 |
| EP | 1246269 A1 | 10/2002 |

(Continued)

OTHER PUBLICATIONS

Extended European Search Report, dated Aug. 21, 2012, for European Application No. 09819235.4.

(Continued)

*Primary Examiner* — Harold Pyon
*Assistant Examiner* — Jaison Thomas
(74) *Attorney, Agent, or Firm* — Birch, Stewart, Kolasch & Birch, LLP

(57) ABSTRACT

Provided are charge-transporting varnishes that can form satisfactory thin films and can provide organic EL elements that can exhibit excellent emission efficiency and luminance characteristics when used for EL elements that have a structure on a substrate. The charge-transporting varnishes comprise quinone diimine derivatives represented by general formula (1) that are oligoaniline derivatives or oxides thereof, electron-accepting dopant substances or hole-accepting dopant substances, and at least one kind of silane compound.

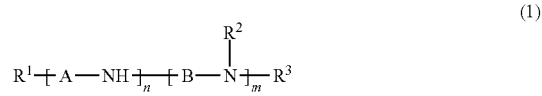

[In the formula, $R^1$, $R^2$ and $R^3$ each independently represents a hydrogen atom, a halogen atom, a hydroxyl group, etc. A and B each independently represents a divalent group represented by general formula (2) or (3).

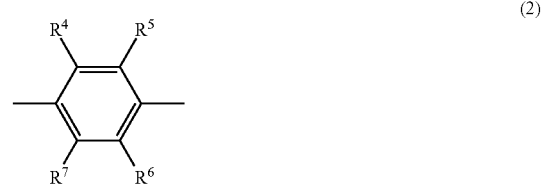

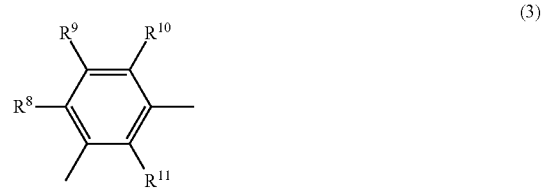

(In the formulas, $R^4$-$R^{11}$ each independently represents a hydrogen atom, a halogen atom, a hydroxyl group, etc.) m and n are each independently integers of 1 or greater and satisfy $m+n \leq 20$.]

12 Claims, 5 Drawing Sheets

(56) References Cited

U.S. PATENT DOCUMENTS

| | | | |
|---|---|---|---|
| 6,017,665 A * | 1/2000 | Grune et al. | 430/58.2 |
| 6,416,885 B1 | 7/2002 | Towns et al. | |
| 6,815,090 B1 * | 11/2004 | Tagami et al. | 428/690 |
| 7,201,859 B2 | 4/2007 | Lee et al. | |
| 7,795,452 B2 | 9/2010 | Yoshimoto et al. | |
| 2002/0011779 A1 | 1/2002 | Towns et al. | |
| 2003/0010959 A1 | 1/2003 | Lee et al. | |
| 2005/0082514 A1 | 4/2005 | Yoshimoto et al. | |
| 2006/0115652 A1 | 6/2006 | Yoshimoto et al. | |
| 2007/0138483 A1 | 6/2007 | Lee et al. | |
| 2007/0205400 A1 | 9/2007 | Kato et al. | |
| 2008/0029742 A1 * | 2/2008 | Yoshimoto et al. | 252/500 |

FOREIGN PATENT DOCUMENTS

| | | |
|---|---|---|
| EP | 1905804 A1 | 4/2008 |
| EP | 1950816 A1 | 7/2008 |
| EP | 2143708 A1 | 1/2010 |
| JP | 3-273087 A | 12/1991 |
| JP | 2002-151272 A | 5/2002 |
| JP | 2003-45667 A | 2/2003 |
| JP | 2007-169593 A | 7/2007 |
| JP | 2008-16336 A | 1/2008 |
| WO | WO 03/071559 A1 | 8/2003 |
| WO | WO 2004/043117 A1 | 5/2004 |
| WO | WO 2005/043962 A1 | 5/2005 |
| WO | WO 2005/107335 A1 | 11/2005 |

OTHER PUBLICATIONS

Lee et al., "The origin of the hole injection improvements at indium tin oxide/molybdenum trioxide/N,N'-bis(1-naphthyl)-N,N'-diphenyl-1,1'-diphenyl-1,1'-diamine interfaces," Applied Physics Letters (2008) vol. 93, pp. 043308-1-043308-3.

Matsushima et al., "Formation of Ohmic hole injection by inserting an ultrathin layer of molybdenum trioxide between indium tin oxide and organic hole-transporting layers," Applied Physics Letters (2007), vol. 91. pp. 253504-1-253504-3.

Tokito et al., "Metal oxides as a hole-injecting layer for an organic electroluminescent device," J. Phys. D: Appl. Phys (1996) vol. 29, pp. 2750-2753.

G. Gustafsson et al., "Flexible light-emitting diodes made from soluble conducting polymers", Letters to Nature, International Weekly Journal of Science, Jun. 11, 1992, vol. 357, No. 6378, pp. 477-479.

International Search Report for PCT/JP2009/067530, mailed on Dec. 22, 2009.

Jayesh Bharathan et al., "Polymer electroluminescent devices processed by inkjet printing: I. Polymer light-emitting logo", Applied Physics Letters, May 25, 1998, vol. 72, No. 21, pp. 2660-2662, U.S.A.

Juzo Nakayama et al., "Preparation of α-Quater-, α-Sexi-, and α-Octithiophenes", Heterocycles, 1987, vol. 26, No. 7, pp. 1793-1796.

Juzo Nakayama et al., "Preparation of α-Quinque- and α-Septithiophenes and Their Positional Isomers", Heterocycles, 1987, vol. 26, No. 4, pp. 939-942.

Miyoko Ochi et al., "Preparation of Linear Oligoaniline Derivatives Using Titanium Alkoxide as a Condensing Agent", Bulletin of Chemical Society of Japan, Jun. 1994, vol. 67, pp. 1749-1752.

S. A. Van Slyke et al., "Organic electroluminescent devices with improved stability", Applied Physics Letters, Oct. 7, 1996, vol. 69, No. 15, pp. 2160-2162, U.S.A.

W. J. Zhang et al., "Synthesis of Oligomeric Anilines", Synthetic Metals, The Journal of Conducting Polymers and Molecular Metals, 1997, vol. 84, pp. 119-120, U.S.A.

* cited by examiner

CHARGE-TRANSPORTING VARNISHES

TECHNICAL FIELD

This invention relates to a charge-transporting varnish and more particularly, to a charge-transporting varnish containing an oligoaniline derivative and a silane compound.

BACKGROUND ART

Regarding low-molecular-weight organic electroluminescence (hereinafter abbreviated as OLED) elements, it has been reported that when a copper phthalocyanine (CuPC) layer is provided as a hole-injecting layer, a lowering of drive voltage, an improvement in initial characteristics such as an emission efficiency, and also an improvement in lifetime characteristic can be achieved (Non-patent Document 1: Applied Physics Letters, USA, 1996, Vol. 69, pp. 2160-2162).

Regarding organic electroluminescence elements using polymer light-emitting materials (hereinafter abbreviated as PLED), on the other hand, it has also been reported that thin films of polyaniline materials (Patent Document 1: JP-A 3-273087, Non-patent Document 2: Nature, Britain, 1992, Vol. 357, pp. 477-479) or polythiophene materials (Non-patent Document 3: Applied Physics Letters, U.S.A., 1998, Vol. 72, pp. 2660-2662) are used to obtain a similar effect as with OLED elements.

In recent years, there has been found charge-transporting varnishes made of homogeneous solutions wherein highly soluble low-molecular-weight oligoaniline materials or oligothiophene materials are used and completely dissolved in organic solvents. It has been reported that when the hole injecting layer obtained from this varnish is inserted into an organic electroluminescence (hereinafter referred to as organic EL) element, there can be obtained a flattening effect of an underlying substrate and excellent EL element characteristics (Patent Document 2: JP-A 2002-151272 and Patent Document 3: WO 2005/043962).

The low-molecular-weight oligomer compounds per se are low in viscosity. When ordinary organic solvents are used, a process margin in film-forming operations is so narrow that when using a variety of coating methods such as spin coating, ink-jet coating and spray coating and a variety of baking conditions, a difficulty has been involved in homogeneous film formation.

However, the use of various types of additive solvents enables the viscosity, boiling point and vapor pressure to be controlled, which, in turn, enables a highly homogenous film-formed surface to be obtained according to the various coating methods (Patent Document 4: WO 2004/043117 and Patent Document 5: WO 2005/107335).

Hence, low-molecular-weight oligomer compounds have been recently used as a hole-injecting layer in organic EL elements.

However, there are demands of a further improvement in solubility of low-molecular-weight compounds sufficient to permit easy matching with a variety of coating methods such as spin coating, ink-jet coating and spray coating, and also of a further improvement in conductivity and emission efficiency and luminance characteristics when applied to organic EL elements.

Especially, improvements of an emission efficiency and luminance characteristics are important for both OLED elements and PLED elements.

Characteristics of a hole-injecting layer include hole injectability into an emission layer, electron blocking capability of from the emission layer, and capability to inhibit deactivation of excitons in the emission layer. These functions greatly influence the emission efficiency and luminance characteristics of such organic EL elements as set forth above. Thus, there is a demand of low-molecular-weight oligomer compounds that are able to realize an excellent function as a hole-injecting layer.

It has been reported that when silane compounds are added to compositions including conductive polymers such as polystyrenesulfonic acid or polyaniline, the lifetime of organic EL elements having a thin film formed from this composition is prolonged (Patent Document 6: JP-A 2003-45667). Nevertheless, no case of adding a silane compound to charge-transporting varnishes including low-molecular-weight oligomers has been reported.

PRIOR ART DOCUMENTS

Patent Documents

Patent Document 1: JP-A 3-273087
Patent Document 2: JP-A 2002-151272
Patent Document 3: WO 2005/043962
Patent Document 4: WO 2004/043117
Patent Document 5: WO 2005/107335
Patent Document 6: JP-A 2003-45667

Non-Patent Documents

Non-patent Document 1: Applied Physics Letters, U.S.A., 1996, Vol. 69, pp. 2160-2162
Non-patent Document 2: Nature, Britain, 1992, Vol. 357, pp. 477-479
Non-patent Document 3: Applied Physics Letters, U.S.A., 1998, Vol. 72, pp. 2660-2662

SUMMARY OF THE INVENTION

Problems to be Solved by the Invention

The invention has been done in view of the above circumstance. An object of the invention is to provide a charge-transporting varnish that can form a good thin film when employed in an EL element having a structure on a substrate and is able to yield an organic EL element having an excellent emission efficiency and luminance characteristics.

Means for Solving the Problems

As a result of intensive studies for achieving the above object, the present inventors have found that when using a charge-transporting varnish including a given type of oligoaniline derivative or quinonediimine derivative that is an oxidized product of the former derivative, an electron-accepting dopant substance or a hole-accepting dopant substance, and a silane compound, a good thin film can be formed on an EL element having a structure on a substrate. The inventors have also found that when the thin film is used as a hole-injecting layer of the organic EL element, a high emission efficiency and luminance characteristics can be achieved. Thus, the present invention was completed.

More particularly, the invention provides:

[1] A charge-transporting varnish comprising an oligoaniline derivative represented by the general formula (1) or a quinonediimide derivative that is an oxidized product thereof, an electron-accepting dopant substance or a hole accepting dopant substance, and at least one kind of silane compound,

[Chemical Formula 1]

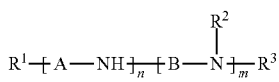
(1)

wherein $R^1$, $R^2$ and $R^3$ are each independently a hydrogen atom, a halogen atom, a hydroxyl group, an amino group, a silanol group, a thiol group, a carboxyl group, a phosphoric group, a phosphoric ester group, an ester group, a thioester group, an amide group, a nitro group, a monovalent hydrocarbon group, an organooxy group, an organoamino group, an organosilyl group, an organothio group, an acyl group or a sulfonic group, A and B are each independently a divalent group represented by the general (2) or (3):

[Chemical Formula 2]

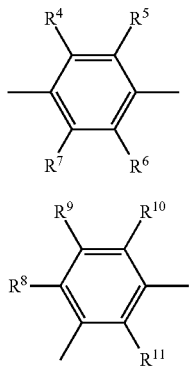
(2)

(3)

wherein $R^4$-$R^{11}$ are each independently a hydrogen atom, a halogen atom, a hydroxyl group, an amino group, a silanol group, a thiol group, a carboxyl group, a phosphoric group, a phosphoric ester group, an ester group, a thioester group, an amide group, a nitro group, a monovalent hydrocarbon group, an organooxy group, an organoamino group, an organosilyl group, an organothio group, an acyl group or a sulfonic group, and m and n are each independently an integer of 1 or over with the proviso that m+n≤20;

[2] The charge-transporting varnish of [1], wherein said oligoaniline derivative or quinonediimine derivative that is an oxidized product thereof is an oligoaniline derivative represented by the general formula (4) or an quinonediimine derivative that is an oxidized product thereof,

[Chemical Formula 3]

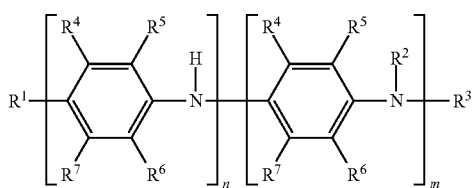
(4)

wherein $R^1$-$R^7$, m and n are as defined above;

[3] The charge-transporting varnish of [1], wherein said electron-accepting dopant substance is an arylsulfonic acid derivative represent by the formula (5):

[Chemical Formula 4]

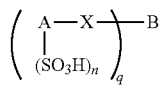
(5)

wherein X is O, S or NH, A is a naphthalene ring or anthracene ring that may have a substituent other than X and n number of $SO_3H$ groups, B is an unsubstituted or substituted hydrocarbon group, a 1,3,5-triazine group or an unsubstituted or substituted group represented by the following group (6) or (7):

[Chemical Formula 5]

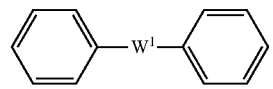
(6)

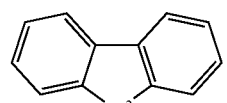
(7)

wherein $W^1$ and $W^2$ are each independently O, S, S(O), S($O_2$), or unsubstituted or substituted group-bonded N, Si, P or P(O), n is the number of sulfonic acid groups bonded to A with the proviso that n is an integer satisfying 1≤n≤4, and q is the bond number between B and X with the proviso that q is an integer satisfying 1≤q;

[4] The charge-transporting varnish of [1], which comprises an organic solvent as a solvent;

[5] The charge-transporting varnish of [4], which comprises 0.0001 to 10 wt % of water relative to said organic solvent;

[6] The charge-transporting varnish of [1], wherein a proportion of silane compound is in the range of 1 to 50 wt % relative to the total weight of solids in said charge-transporting varnish;

[7] The charge-transporting varnish of [1], wherein said silane compound is at least one selected from the group consisting of dialkoxysilane compounds, trialkoxysilane compounds, tetraalkoxysilane compounds and silicone compounds;

[8] A charge transporting thin film prepared from the charge-transporting varnish of any one of [1] to [7]; and

[9] An organic electroluminescence element having the charge transporting thin film of [8].

Advantageous Effect of the Invention

Since the charge-transporting varnish of the invention contains a silane compound, it has a better thin film forming abolity and provides EL elements having more excellent emission efficiency and luminance characteristics than thin films obtained from silane compound-free varnishes when used for EL elements having structures on substrates.

Further, the thin film obtained from the charge-transporting varnish of the invention has high flatness and high charge transportability. Therefore, due to these characteristics, the thin film can be applied to a hole transporting layer of solar cells, an electrode for fuel cells, a protecting film for capacitor electrodes and an antistatic film.

EMBODIMENT FOR CARRYING OUT THE INVENTION

Figure 1:
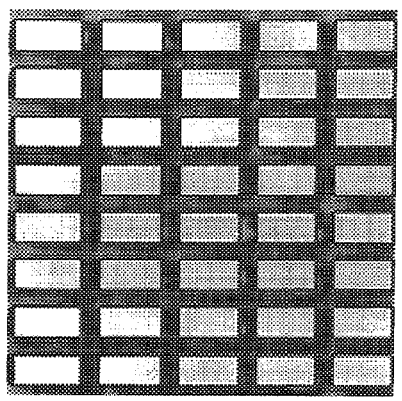
FIG. 1 is a confocal laser microphotograph of a structure-bearing ITO substrate made in Reference 3.

The invention is now described in more detail.

In the oligoaniline derivatives represented by the formulas (1) and (4), the halogen atom includes a fluorine, chlorine, bromine or iodine atom.

Specific examples of the monovalent hydrocarbon group include: alkyl groups such as a methyl group, an ethyl group, an n-propyl group, an i-propyl group, an n-butyl group, an i-butyl group, a t-butyl group, an n-hexyl group, an n-octyl group, a 2-ethylhexyl group and a decyl group; cycloalkyl groups such as a cyclopentyl group and a cyclohexyl group; bicycloalkyl groups such as a bicyclohexyl group; alkenyl groups such as a vinyl group, a 1-propenyl group, a 2-propenyl group, an isopropenyl group, a 1-methyl-2-propenyl group, a 1-, 2- or 3-butenyl group and a hexenyl group; aryl group such as a phenyl group, a xylyl group, a tolyl group, a biphenyl group and a naphthyl group; aralkyl groups such as a benzyl group, a phenylethyl group and a phenylcyclohexyl group; and those monovalent hydrocarbon groups mentioned above wherein a part or all of the hydrogen atoms are substituted with a halogen atom, a hydroxyl group, an alkoxy group, a sulfonic group or the like.

Specific examples of the organooxy group include an alkoxy group, an alkenyloxy group and an aryloxy group wherein the alkyl group, alkenyl group and aryl group thereof are similar to those exemplified above, respectively.

Specific examples of the organoamino group include: alkylamino groups such as a phenylamino group, a methylamino group, an ethylamino group, a propylamino group, a butylamino group, a pentylamino group, a hexylamino group, a heptylamino group, an octylamino group, a nonylamino group, a decylamino group and a laurylamino group; dialkylamino groups such as a dimethylamino group, a diethylamino group, a dipropylamino group, a dibutylamino group, a dipentylamino group, a dihexylamino group, a diheptylamino group, a dioctylamino group, a dinonylamino group and a didecylamino group; a cyclohexylamino group and a morpholino group.

Specific examples of the organosilyl group include a trimethylsilyl group, a triethylsilyl group, a tripropylsilyl group, a tributylsilyl group, a tripentylsilyl group, a trihexylsilyl group, a pentyldimethylsilyl group, a hexyldimethylsilyl group, an octyldimethylsilyl group and a decyldimethylsilyl group.

Specific examples of the organothio group include alkylthio groups such as a methylthio group, an ethylthio group, a propylthio group, a butylthio group, a pentylthio group, a hexylthio group, a heptylthio group, an octylthio group, a nonylthio group and a decylthio group.

Specific examples of the acyl group include a formyl group, an acetyl group, a propionyl group, a butyryl group, an isobutyryl group, a valeryl group, an isovaleryl group and a benzoyl group.

The phosphoric ester group includes —P(O)(OQ$^1$)(OQ$^2$).
The ester group includes —C(O)OQ$^1$ and —OC(O)Q$^1$.
The thioester group includes —C(S)OQ$^1$ and —OC(S)Q$^1$.
The an amide group includes —C(O)NHQ$^1$, —NHC(O)Q$^1$, —C(O)NQ$^1$Q$^2$ and —NQ$^1$C(O)Q$^2$.

In the above formulas, Q$^1$ and Q$^2$ are an alkyl group, an alkenyl group or an aryl group, which include similar groups exemplified above as the monovalent hydrocarbon groups.

The number of carbon atoms in the monovalent hydrocarbon group, organooxy group, organoamino group, organosilyl group, organothio group, acyl group, phosphoric ester group, ester group, thioester group and amide group is generally 1 to 20, preferably 1 to 8, but is not limited thereto.

Preferred substituent groups include fluorine, a sulfonic group, an organooxy group, an alkyl group and an organosilyl group.

It is noted that the substituent groups may bond together to contain a cyclic moiety.

In the general formulas (1) and (4), m+n is preferably 4 or over from the standpoint that good charge transportability is shown and is also preferably 16 or below from the standpoint that solubility in solvent is ensured.

The oligoaniline derivatives of the formulas (1) and (4) should preferably have no molecular weight distribution, i.e., have a degree of dispersion of 1, when taking enhanced solubility and uniform charge transportability into consideration.

The lower limit of the molecular weight is generally 200, preferably 400, so as to suppress material volatilization and exert charge transportability, and the upper limit of the molecular weight is generally 5000, preferably 3000, so as to improve solubility.

These charge-transporting materials may be used alone or in combination of two or more.

Specific examples of the compound include oligoaniline derivatives soluble in organic solvents such as phenyltetraaniline, phenylpentaaniline, tetraaniline (aniline tetramer) and octaaniline (aniline octomer).

It is to be noted that synthetic methods of these charge transporting materials include, but are not limited to, synthetic methods of oligoaniline (see Bulletin of Chemical Society of Japan, 1994, Vol. 67, pp. 1749-1752 and Synthetic Metals, U.S.A., 1997, Vol. 84, pp. 119-120), and synthetic methods of oligothiophene (see, for example, Heterocycles, 1987, Vol. 26, pp. 939-942 and Heterocycles, 1987, Vo. 26, pp. 1793-1796).

The charge-transporting varnish according to the invention includes, as a charge-transporting material, the oligoaniline compound represented by the above formula (1) or a quinonediimine compound that is an oxidized product of the oligoaniline compound.

The charge-transporting varnish is one wherein a charge-transporting material made of the inventive oligoaniline compound which serves as an essential body in the charge transporting mechanism, or this charge-transporting material and a charge transporting organic material made of an electron or hole accepting dopant substance, are dissolved or dispersed in at least one solvent.

It will be noted that the term "charge transportability" has the same meaning as "electric conductivity", which means any of hole transportability, electron transportability, and both hole and electron transporabilities. With respect to the charge-transporting varnish of the invention, the varnish per se may have charge transportability, or a solid film obtained by use of the varnish may have charge transportability.

As a charge-accepting dopant substance used, if necessary, so as to improve the charge transportability of the charge-transporting varnish of the invention, an electron-accepting dopant substance may be used for a hole-transporting material, and a hole-accepting dopant substance may be used for an electron transporting material, and both of the substances should preferably have high charge acceptability. Regarding the solubility of the charge-accepting dopant substance, the dopant substance is not limited in so far as it is soluble in at least one solvent used in the varnish.

Specific examples of the electron-accepting dopant substance include: strong inorganic acids such as hydrogen chloride, sulfuric acid, nitric acid and phosphoric acid; Lewis acids such as aluminum(III) chloride ($AlCl_3$), titanium(IV) tetrachloride ($TiCl_4$), boron tribromide ($BBr_3$), boron trifluoride ether complex ($BF_3$—$OEt_2$), iron(III) chloride ($FeCl_3$), copper(II) chloride ($CuCl_2$), antimony(V) pentachloride ($SbCl_5$), arsenic(V) pentachloride ($AsF_5$), phosphorous pentafluoride ($PF_5$) and tris(4-bromophenyl)aluminum hexachloroantimonate (TBPAH); strong organic acids such as benzenesulfonic acid, tosylic acid; camphorsulfonic acid, hydroxybenzenesulfonic acid, 5-sulfosalicylic acid, dodecylbenzenesulfonic acid, polystyrenesulfonic acid, 1,4-benzodioxanedisulfonic acid derivatives set forth in WO 2005/000832, arylsulfonic acid derivatives set forth in WO 2006/025342, and dinonylnaphthalenesulfonic acid derivatives set out in JP-A 2005-108828; and organic or inorganic oxidizing agents such as 7,7,8,8-tetracyanoquinodimethane (TCNQ), 2,3-dichloro-5,6-dicyano-1,4-benzoquinone (DDQ) and iodine.

In particular, preferred electron-accepting dopant substances include strong organic acids such as 5-sulfosalicyclic acid, dodecylbenzenesulfonic acid, polystyrenesulfonic acid, 1,4-benzodioxanedisulfonic acid derivatives described in WO 2005/000832 and dinonylnaphthalenesulfonic acid derivatives described in JP-A 2005-108828.

Alternatively, the arylsulfonic acid derivatives represented by the formula (5) may also be used preferably,

[Chemical Formula 6]

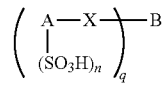

(5)

wherein X is O, S or NH, A is a naphthalene ring or anthracene ring that may have a substituent other than X and n number of $SO_3H$ groups, B is an unsubstituted or substituted hydrocarbon group, a 1,3,5-triazine group or an unsubstituted or substituted group represented by the following group (6) or (7):

[Chemical Formula 7]

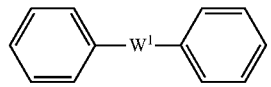

(6)

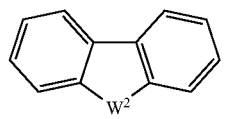

(7)

wherein $W^1$ and $W^2$ are each independently O, S, S(O), S($O_2$), or unsubstituted or substituent group-bonded N, Si, P or P(O), n is the number of sulfonic acid groups bonded to A with the proviso that n is an integer satisfying $1 \leq n \leq 4$, and q is the bond number between B and X with the proviso that q is an integer satisfying $1 \leq q$.

In order to improve durability and charge transportability, B is preferably a divalent or polyvalent unsubstituted or substituted hydrocarbon group containing one or more aromatic rings, a divalent or trivalent 1,3,5-triazine group, or a substituted or unsubstituted divalent diphenylsulfone group. Inter alia, preferred are a divalent or trivalent substituted or unsubstituted benzyl group, a divalent substituted or unsubstituted p-xylylene group, a divalent or trivalent substituted or unsubstituted naphthyl group, a divalent or trivalent 1,3,5-triazine group, a divalent substituted or unsubstituted diphenylsulfone group, a di- to tetravalent perfluorobiphenyl group, a divalent substituted or unsubstituted 2,2-bis((hydroxypropoxy)phenyl)propyl group, and a substituted or unsubstituted polyvinylbenzyl group.

The mixing ratio between the electron-accepting dopant substance and the charge-transporting material may differ depending on the molecular structure of the electron-accepting dopant, the molecular structure of the charge-transporting material, the molecular weight of the electron-accepting dopant, the molecular weight of the charge-transporting material and the intended conductivity of a conductive film. The preferred mixing ratio is such that a ratio of $SO_3H$ in the electron-accepting dopant to the NH structure in the charge-transporting material is 1:0.01 to 20 (molar ratio), more preferably NH:$SO_3H$=1:0.05 to 10 (molar ratio).

Especially, in the case of a combination of the charge-transporting material of the invention and a charge-accepting dopant of a naphthalenedisulfonic acid oligomer (NSO-2) represented by the formula (8) (i.e., the compound set forth in WO 2006/025342), an optimum mixing molar ratio is preferably such that charge transporting material:electron accepting dopant=1:0.01 to 10.0, more preferably charge transporting material:electron accepting dopant=1:0.5 to 4.0, in view of transparency (transmittance is improved if an amount of the host is reduced) and EL characteristics (the host has an absorption in a visible region and is apt to cause the movement of energy from excitons, so the mixing ratio becomes important).

[Chemical Formula 8]

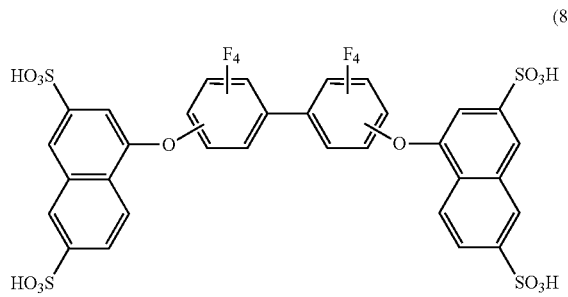

(8)

Specific examples of the hole-accepting dopant include alkali metals (Li, Na, K, Cs), and metal complexes such as lithium quinolate (Liq) and lithium acetylacetonate (Li(acac)), but are not limited thereto.

The charge-transporting varnish of the invention further comprises a silane compound.

The silane compound may be at least one selected from dialkoxysilane compounds, trialkoxysilane compounds, tetraalkoxysilane compounds and silicone compounds, which are preferably ones soluble in at least one solvent employed in the charge-transporting varnish.

If the silane compound is formulated in excess, there is concern that no current is passed into the element. Thus, the amount of the silane compound is preferably at 1 to 50 wt %, more preferably 1 to 40 wt %, and much more preferably at 3 to 35 wt % relative to the total amount of the solids in the charge-transporting varnish.

The trialkoxysilane compound includes, for example, one represented by the formula (9):

$$Y^1Si(OY^2)_3 \quad (9)$$

wherein $Y^1$ is a halogen atom, a hydrogen atom, or an alkyl group having 1 to 12 carbon atoms, an alkenyl group having 2 to 12 carbon atoms, an alkynyl group having 2 to 12 carbon atoms, an aryl group or a heteroaryl group, each of which may be substituted with Z wherein Z is a halogen atom, a hydrogen atom, a haloalkyl group having 1 to 12 carbon atoms, an alkyl group having 1 to 12 carbon atom, a hydroxyl group, a mercapto group, an amino group, a haloalkoxy group having 1 to 12 carbon atoms, an alkoxy group having 1 to 12 carbon atoms, an alkenyl group having 2 to 12 carbon atoms, a haloalkenyl group having 2 to 12 carbon atoms, an alkynyl group having 2 to 12 carbon atoms, a haloalkynyl group having 2 to 12 carbon atoms, an alkylthio group having 1 to 12 carbon atoms, a monoalkylamino group having 1 to 12 carbon atoms, a dialkylamino group having 1 to 12 carbon atoms, a glycidoxy group, an alkylcarbonyl group having 1 to 12 carbon atoms, an alkenylcarbonyl group having 2 to 12 carbon atoms, an alkynylcarbonyl group having 2 to 12 carbon atoms, an alkylcarbonyloxy group having 1 to 12 carbon atoms, an alkenylcarbonyloxy group having 2 to 12 carbon atoms, an alkynylcarbonyloxy group having 2 to 12 carbon atoms, an aryl group, a halogenated aryl group, a heteroaryl group, or a halogenated heteroaryl group.

The dialkoxysilane compound includes, for example, one represented by the formula (10):

$$Y^3Y^4Si(OY^5)_2 \quad (10)$$

$Y^3$ and $Y^4$ are each independently a halogen atom, or an alkyl group having 1 to 12 carbon atoms, an alkenyl group having 2 to 12 carbon atoms, an alkynyl group having 2 to 12 carbon atoms, an aryl group or a heteroaryl group, each of which may be substituted with Z, $Y^5$ is an alkyl group having 1 to 12 carbon atoms, wherein Z is a halogen atom, a hydrogen atom, a haloalkyl group having 1 to 12 carbon atoms, an alkyl group having 1 to 12 carbon atom, a hydroxyl group, a mercapto group, an amino group, a haloalkoxy group having 1 to 12 carbon atoms, an alkoxy group having 1 to 12 carbon atoms, an alkenyl group having 2 to 12 carbon atoms, a haloalkenyl group having 2 to 12 carbon atoms, an alkynyl group having 2 to 12 carbon atoms, a haloalkynyl group having 2 to 12 carbon atoms, an alkylthio group having 1 to 12 carbon atoms, a monoalkylamino group having 1 to 12 carbon atoms, a dialkylamino group having 1 to 12 carbon atoms, a glycidoxy group, an alkylcarbonyl group having 1 to 12 carbon atoms, an alkenylcarbonyl group having 2 to 12 carbon atoms, an alkynylcarbonyl group having 2 to 12 carbon atoms, an alkylcarbonyloxy group having 1 to 12 carbon atoms, an alkenylcarbonyloxy group having 2 to 12 carbon atoms, an alkynylcarbonyloxy group having 2 to 12 carbon atoms, an aryl group, a halogenated aryl group, a heteroaryl group or a halogenated heteroaryl group.

The tetraalkoxysilane compound includes, for example, one represented by the formula (11)

$$Si(OY^6)_4 \quad (11)$$

wherein $Y^6$ is an alkyl group having 1 to 12 carbon atoms.

The halogen atom in $Y^1$, $Y^3$ and $Y^4$ includes those mentioned with respect to the formula (1), of which a fluorine atom is preferred.

The alkyl group having 1 to 12 carbon atoms, which may be substituted with Z, may be any of linear, branched and cyclic groups. Specific examples include, in addition to those exemplified as the alkyl group, cycloalkyl group and bicycloalkyl group in the monovalent hydrocarbon group of the formula (1), s-butyl, n-pentyl, n-heptyl, n-nonyl, n-decyl, n-undecyl, n-dodecyl, c-propyl, c-butyl, c-pentyl and c-hexyl.

Specific examples of the alkenyl group having 2 to 12 carbon atoms, which may be substituted with Z, include those exemplified as the alkenyl group in the monovalent hydrocarbon group of the formula (1).

Specific examples of the alkynyl group having 2 to 12 carbon atoms, which may be substituted with Z, include an ethynyl group, a 1-propynyl group, a 2-propynyl group, a 2-methyl-1-propynyl group, a 1-methyl-2-propynyl group and a 1-, 2- or 3-butynyl group.

Specific examples of the aryl group, which may be substituted with Z, include those aryl groups exemplified in the monovalent hydrocarbon group of the formula (1).

The heteroaryl group, which may be substituted with Z, includes a thiophen-2-yl group, a furan-2-yl group, a pyrrol-2-yl group, an imidazol-2-yl group, a pyridin-2-yl group and a pyrimidin-2-yl group.

Of these, in view of a prolonged lifetime and improved luminance of the organic EL element, preferred $Y^1$, $Y^3$ and $Y^4$ include a fluorine atom, a hydrogen atom, an alkyl group having 1 to 12 carbon atoms, an alkenyl group having 2 to 12 carbon atoms, an alkynyl group having 2 to 12 carbon atoms, an aryl group and a heteroaryl group, which may be substituted with Z.

In Z, specific examples of the alkyl group having 1 to 12 carbon atoms, alkenyl group having 2 to 12 carbon atoms, alkynyl group having 2 to 12 carbon atoms, aryl group or heteroaryl group are the same as those mentioned above, respectively.

Specific examples of the haloalkyl group having 1 to 12 carbon atoms include a trifluoromethyl group, a 2,2,2-trifluoroethyl group, a 1,1,2,2,2-pentafluoroethyl group, a 3,3,3-trifluoropropyl group, a 2,2,3,3,3-pentafluoropropyl group, a perfluoropropyl group, a heptafluoroisopropyl group, a perfluorobutyl group, a perfluoropentyl group, a perfluorohexyl group, a perfluoroheptyl group, a perfluorooctyl group, a perfluorononyl group, a perfluorodecyl group, a perfluoroundecyl group, a perfluorododecyl group and a heptadecafluoro-1,1,2,2-tetrahydrodecyl group.

Specific examples of the haloalkoxy group having 1 to 12 carbon atoms include a trifluoromethoxy group, a 2,2,2-trifluoroethoxy group, a 1,1,2,2,2-pentafluoroethoxy group, a 3,3,3-trifluoropropoxy group, a 2,2,3,3,3-pentafluoropropoxy group, a perfluoropropoxy group, a heptafluoroisopropoxy group, a perfluorobutoxy group, a perfluoropentyloxy group, a perfluorohexyloxy group, a perfluoroheptyloxy group, a perfluorooctyloxy group, a perfluorononyloxy group, a perfluorodecyloxy group, a perfluoroundecyloxy group, a perfluorododecyloxy group and a heptadecafluoro-1,1,2,2-tetrahydrodecyloxy group.

Specific examples of the alkoxy group having 1 to 12 carbon atoms include a methoxy group, an ethoxy group, an n-propoxy group, an i-propoxy group, an n-butoxy group, an s-butoxy group, a t-butoxy group and an n-pentoxy group.

Specific examples of the haloalkenyl group having 2 to 12 carbon atoms include a fluorovinyl group, a difluorovinyl group, a 3,3,3-trifluoro-1-propenyl group, a 3,3,3-trifluoro-2-propenyl group and a 2-propenyl group.

Specific examples of the haloalkynyl group having 2 to 12 carbon atoms include a 3,3,3-trifluoro-1-propynyl group and a 3,3,3-trifluoro-2-propynyl group.

Specific examples of the alkylthio group having 1 to 12 carbon atoms include those exemplified as the organothio group in the formula (1).

Specific examples of the monoalkylamino group and dialkylamino group having 1 to 12 carbon atoms include those exemplified as the organoamino group in the formula (1).

Specific examples of the alkylcarbonyl group having 1 to 12 carbon atoms include a methylcarbonyl group, an ethylcarbonyl group, an n-propylcarbonyl group, an i-propylcarbonyl group, an n-butylcarbonyl group, an s-butylcarbonyl group, a t-butylcarbonyl group and an n-pentylcarbonyl group.

Specific examples of the alkylcarbonyloxy group having 1 to 12 carbon atoms include a methylcarbonyloxy group, an ethylcarbonyloxy group, an n-propylcarbonyloxy group, an i-propylcarbonyloxy group, an n-butylcarbonyloxy group, an s-butylcarbonyloxy group, a t-butylcarbonyloxy group and an n-pentylcarbonyloxy group.

Specific examples of the alkenylcarbonyl group having 2 to 12 carbon atoms include a vinylcarbonyl group, a 1-propenylcarbonyl group, a 2-propenylcarbonyl group, a 2-methyl-1-propenylcarbonyl group and a 1-methyl-2-propenylcarbonyl group.

Specific examples of the alkynylcarbonyl group having 2 to 12 carbon atoms include an ethynylcarbonyl group, a 1-propynylcarbonyl group, a 2-propynylcarbonyl group, a 2-methyl-1-propynylcarbonyl group and a 1-methyl-2-propynylcarbonyl group.

Specific examples of the alkenylcarbonyloxy group having 2 to 12 carbon atoms include a vinylcarbonyloxy group, a 1-propenylcarbonyloxy group, a 2-propenylcarbonyloxy group, a 2-methyl-1-propenylcarbonyloxy group and a 1-methyl-2-propenylcarbonyloxy group.

Specific examples of the alkynylcarbonyloxy group having 2 to 12 carbon atoms include an ethynylcarbonyloxy group, a 1-propynylcarbonyloxy group, a 2-propynylcarbonyloxy group, a 2-methyl-1-propynylcarbonyloxy group and a 1-methyl-2-propynylcarbonyloxy group.

Specific examples of the halogenated aryl group include a 1-fluorophenyl group, a 2-fluorophenyl group, a 3-fluorophenyl group, a 4-fluorophenyl group, a 5-fluorophenyl group and a pentafluorophenyl group.

Specific examples of the halogenated heteroaryl group include a 3-fluorothiphen-2-yl group, a 4-fluorothiophen-2-yl group and a 5-fluorothiophen-2-yl group.

Of these, in view of the prolonged life and improved luminance of the organic EL element, preferred Z include a hydrogen atom, a haloalkyl group having 1 to 12 carbon atoms, an alkyl group having 1 to 12 carbon atoms, an alkenyl group having 2 to 12 carbon atoms, a haloalkenyl group having 2 to 12 carbon atoms, an alkynyl group having 2 to 12 carbon atoms, a haloalkynyl group having 2 to 12 carbon atoms, an aryl group, a halogenated aryl group, a heteroaryl group and a halogenated aryl group.

In the practice of the invention, a silane compound having a fluorine atom or a fluorine atom-containing substituent has excellent surface mobility in the thin film prepared from a varnish containing the compound and thus exists abundantly in the outermost surface of the thin film. Hence, the formulation of such a fluorine atom-containing silane compound in the varnish enables the surface energy of the thin film to be readily controlled.

Accordingly, with regard to the above-mentioned trialkoxysilane, $Y^1$ is preferably a fluorine atom or a fluorine atom-containing substituent. With regard to the dialkoxysilane, at least one of $Y^3$ and $Y^4$ is preferably a fluorine atom or a fluorine atom-containing substituent.

Each of $Y^2$, $Y^5$ and $Y^6$ is an alkyl group having 1 to 12 carbon atoms, preferably, an alkyl group having 1 to 5 carbon atoms in view of the prolonged life and improved luminance of the organic EL element. Especially, a methyl group, an ethyl group and an n-propyl group are preferred.

Specific examples of the trialkoxysilane compound include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, heptyltrimethoxysilane, heptyltriethoxysilane, octyltrimethoxysilane, octyltriethoxysilane, dodecyltrimethoxysilane, dodecyltriethoxysilane, hexadecyltrimethoxysilane, hexadecyltriethoxysilane, octadecyltrimethoxysilane, octadecyltriethoxysilane, phenyltrimethoxysilane, phenyltriethoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-methacryloxypropyltrimethoxysilane, γ-methacryloxypropyltriethoxysilane, triethoxy(4-(trifluoromethyl)phenyl)silane, 3,3,3-trifluoropropyltrimethoxysilane, (triethoxysilyl)cyclohexane, perfluorooctylethyltriethoxysilane, triethoxyfluorosilane, tridecafluoro-1,1,2,2-tetrahydroocytyltriethoxysilane, pentafluorophenylpropyltrimethoxysilane, 3-(heptafluoroisopropoxy)propyltriethoxysilane, heptadecafluoro-1,1,2,2-tetrahydrodecyltriethoxysilane, triethoxy-2-thienylsilane and 3-(triethoxysilyl)furan. These may be used alone or in combination of two or more.

Specific examples of preferred trialkoxysilane compounds include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, phenyltrimethoxysilane, phenyltriethoxysilane, vinyltrimethoxysilane, vinyltriethoxysilane, γ-glycidoxypropyltrimethoxysilane, γ-glycidoxypropyltriethoxysilane, triethoxy(4-(trifluoromethyl)phenyl)silane, 3,3,3-trifluoropropyltrimethoxysilane, (triethoxysilyl)cyclohexane, perfluorooctylethyltriethoxysilane, triethoxyfluorosilane, tridecafluoro-1,1,2,2-tetrahydrooctyltriethoxysilane, pentafluorophenylpropyltrimethoxysilane, 3-(heptafluoroisopropoxy)propyltriethoxysilane, heptadecafluoro-1,1,2,2-tetrahydrodecyltriethoxysilane, triethoxy-2-thienylsilane and 3-(triethoxysilyl)furan.

Specific examples of more preferred trialkoxysilane compounds include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, phenyltrimethoxysilane, phenyltriethoxysilane, vinyltrimethoxysilane, vinyltriethoxysilane, triethoxy(4-(trifluoromethyl)phenyl)silane, 3,3,3-trifluoropropyltrimethoxysilane, (triethoxysilyl)cyclohexane, perfluorooctylethyltriethoxysilane, triethoxyfluorosilane, tridecafluoro-1,1,2,2-tetrahydrooctyltriethoxysilane, pentafluorophenylpropyltrimethoxysilane, 3-(heptafluoroisopropoxy)propyltriethoxysilane, heptadecafluoro-1,1,2,2-tetrahydrodecyltriethoxysilane, triethoxy-2-thienylsilane and 3-(triethoxysilyl)furan.

Specific examples of the dialkoxysilane compound include methylhydrogendimethoxysilane, methylhydrogendiethoxysilane, dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane, vinylmethyldimethoxysilane, γ-glycidoxypropylmethyldimethoxysilane, γ-glycidoxypropylmethyldiethoxysilane, β-(3,4-epoxycyclohexyl)ethylmethyldimethoxysilane, γ-methacryloxypropylmethyldimethoxysilane, γ-methacryloxypropylmethyldiethoxysilane, γ-mercaptopropylmethyldimethoxysilane, γ-aminopropylmethyldiethoxysilane, N-(2-aminoethyl)aminopropylmethyldimethoxysilane and 3,3,3-trifluoropropylmethyldimethoxysilane. These may be used alone or in combination of two or more.

Preferred dialkoxysilane compounds include fluorine atom-containing compounds such as 3,3,3-trifluoropropylmethyldimethoxysilane.

Specific examples of the tetraalkoxysilane compound include tetraethoxysilane, tetramethoxysilane and tetrapropoxysilane. These may be used alone or in combination of two or more.

Specific examples of the silicone compound include dimethyl silicone oil, methyl phenyl silicone oil, methyl hydrogen silicone oil, alkyl-modified silicone oil, fluorine-modified silicone oil, polyether-modified silicone oil, alcohol-modified silicone oil, amino-modified silicone oil, epoxy-modified silicone oil, phenol-modified silicone oil, carboxy-modified silicone oil, mercapto-modified silicone and methacrylate-modified silicone. These may be used singly or in combination of two or more.

In the charge-transporting varnish of the invention, at least two members selected from among the above-indicated silane compounds are preferably used in combination, enabling a thin film of better flatness to be obtained.

When trialkoxysilane compounds are used in combination, preferred combinations are, for example, those indicated below:

(1) methyltrimethoxysilane and phenyltrimethoxysilane, methyltrimethoxysilane and phenyltriethoxysilane, methyltrimethoxysilane and vinyltrimethoxysilane, methyltrimethoxysilane and vinyltriethoxysilane, methyltrimethoxysilane and γ-glycidoxypropyltrimethoxysilane, methyltrimethoxysilane and γ-glycidoxypropyltriethoxysilane, methyltrimethoxysilane and (triethoxysilyl)cyclohexane, methyltrimethoxysilane and p-tolyltrimethoxysilane, methyltrimethoxysilane and p-methoxyphenyltrimethoxysilane, methyltrimethoxysilane and triethoxy-2-thienylsilane, and methyltrimethoxysilane and 3-(triethoxysilyl)furan;

(2) methyltriethoxysilane and phenyltrimethoxysilane, methyltriethoxysilane and phenyltriethoxysilane, methyltriethoxysilane and vinyltrimethoxysilane, methyltriethoxysilane and vinyltriethoxysilane, methyltriethoxysilane and γ-glycidoxypropyltrimethoxysilane, methyltriethoxysilane and γ-glycidoxypropyltriethoxysilane, methyltriethoxysilane and (triethoxysilyl)cyclohexane, methyltriethoxysilane and p-tolyltrimethoxysilane, methyltriethoxysilane and p-methoxyphenyltrimethoxysilane, methyltriethoxysilane and triethoxy-2-thienylsilane, and methyltriethoxysilane and 3-(triethoxysilyl)furan;

(3) ethyltrimethoxysilane and phenyltrimethoxysilane, ethyltrimethoxysilane and phenyltriethoxysilane, ethyltrimethoxysilane and vinyltrimethoxysilane, ethyltrimethoxysilane and vinyltriethoxysilane, ethyltrimethoxysilane and γ-glycidoxypropyltrimethoxysilane, ethyltrimethoxysilane and γ-glycidoxypropyltriethoxysilane, ethyltrimethoxysilane and (triethoxysilyl)cyclohexane, ethyltrimethoxysilane and p-tolyltrimethoxysilane, ethyltrimethoxysilane and p-methoxyphenyltrimethoxysilane, ethyltrimethoxysilane and triethoxy-2-thienylsilane, and ethyltrimethoxysilane and 3-(triethoxysilyl)furan;

(4) ethyltriethoxysilane and phenyltrimethoxysilane, ethyltriethoxysilane and phenyltriethoxysilane, ethyltriethoxysilane and vinyltrimethoxysilane, ethyltriethoxysilane and vinyltriethoxysilane, ethyltriethoxysilane and γ-glycidoxypropyltrimethoxysilane, ethyltriethoxysilane and γ-glycidoxypropyltriethoxysilane, ethyltriethoxysilane and (triethoxysilyl)cyclohexane, ethyltriethoxysilane and p-tolyltrimethoxysilane, ethyltriethoxysilane and p-methoxyphenyltrimethoxysilane, ethyltriethoxysilane and triethoxy-2-thienylsilane, and ethyltriethoxysilane and 3-(triethoxysilyl)furan;

(5) propyltrimethoxysilane and phenyltrimethoxysilane, propyltrimethoxysilane and phenyltriethoxysilane, propyltrimethoxysilane and vinyltrimethoxysilane, propyltrimethoxysilane and vinyltriethoxysilane, propyltrimethoxysilane and γ-glycidoxypropyltrimethoxysilane, propyltrimethoxysilane and γ-glycidoxypropyltriethoxysilane, propyltrimethoxysilane and (triethoxysilyl)cyclohexane, propyltrimethoxysilane and p-tolyltrimethoxysilane, propyltrimethoxysilane and p-methoxyphenyltrimethoxysilane, propyltrimethoxysilane and triethoxy-2-thienylsilane, and propyltrimethoxysilane and 3-(triethoxysilyl)furan;

(6) propyltriethoxysilane and phenyltrimethoxysilane, propyltriethoxysilane and phenyltriethoxysilane, propyltriethoxysilane and vinyltrimethoxysilane, propyltriethoxysilane and vinyltriethoxysilane, propyltriethoxysilane and γ-glycidoxypropyltrimethoxysilane, propyltriethoxysilane and γ-glycidoxypropyltriethoxysilane, propyltriethoxysilane and (triethoxysilyl)cyclohexane, propyltriethoxysilane and p-tolyltrimethoxysilane, propyltriethoxysilane and p-methoxyphenyltrimethoxysilane, propyltriethoxysilane and triethoxy-2-thienylsilane, and propyltriethoxysilane and 3-(triethoxysilyl)furan;

(7) butyltrimethoxysilane and phenyltrimethoxysilane, butyltrimethoxysilane and phenyltriethoxysilane, butyltrimethoxysilane and vinyltrimethoxysilane, butyltrimethoxysilane and vinyltriethoxysilane, butyltrimethoxysilane and γ-glycidoxypropyltrimethoxysilane, butyltrimethoxysilane and γ-glycidoxypropyltriethoxysilane, butyltrimethoxysilane and (triethoxysilyl)cyclohexane, butyltrimethoxysilane and p-tolyltrimethoxysilane, butyltrimethoxysilane and p-methoxyphenyltrimethoxysilane, butyltrimethoxysilane and triethoxy-2-thienylsilane, and butyltrimethoxysilane and 3-(triethoxysilyl)furan;

(8) butyltriethoxysilane and phenyltrimethoxysilane, butyltriethoxysilane and phenyltriethoxysilane, butyltriethoxysilane and vinyltrimethoxysilane, butyltriethoxysilane and vinyltriethoxysilane, butyltriethoxysilane and γ-glycidoxypropyltrimethoxysilane, butyltriethoxysilane and γ-glycidoxypropyltriethoxysilane, butyltriethoxysilane and (triethoxysilyl)cyclohexane, butyltriethoxysilane and p-tolyltrimethoxysilane, butyltriethoxysilane and p-methoxyphenyltrimethoxysilane, butyltriethoxysilane and triethoxy-2-thienylsilane, and butyltriethoxysilane and 3-(triethoxysilyl)furan;

(9) triethoxy(4-(trifluoromethyl)phenyl)silane and phenyltrimethoxysilane, triethoxy(4-(trifluoromethyl)phenyl)silane and phenyltriethoxysilane, triethoxy(4-(trifluoromethyl)phenyl)silane and vinyltrimethoxysilane, triethoxy(4-(trifluoromethyl)phenyl)silane and vinyltriethoxysilane, triethoxy(4-(trifluoromethyl)phenyl)silane and γ-glycidoxypropyltrimethoxysilane, triethoxy(4-(trifluoromethyl)phenyl)silane and γ-glycidoxypropyltriethoxysilane, triethoxy(4-(trifluoromethyl)phenyl)silane and (triethoxysilyl)cyclohexane, triethoxy(4-(trifluoromethyl)phenyl)silane and p-tolyltrimethoxysilane, triethoxy(4-(trifluoromethyl)phenyl)silane and p-methoxyphenyltrimethoxysilane, triethoxy(4-(trifluoromethyl)phenyl)silane and triethoxy-2-thienylsilane, and triethoxy(4-(trifluoromethyl)phenyl)silane and 3-(triethoxysilyl)furan;

(10) 3,3,3-trifluoropropyltrimethoxysilane and phenyltrimethoxysilane, 3,3,3-trifluoropropyltrimethoxysilane and phenyltriethoxysilane, 3,3,3-trifluoropropyltrimethoxysilane and vinyltrimethoxysilane, 3,3,3-trifluoropropyltrimethoxysilane and vinyltriethoxysilane, 3,3,3-trifluoropropyltrimethoxysilane and γ-glycidoxypropyltrimethoxysilane, 3,3,3-trifluoropropyltrimethoxysilane and γ-glycidoxypropyltriethoxysilane, 3,3,3-trifluoropropyltrimethoxysilane and (triethoxysilyl)cyclohexane, 3,3,3-trifluoropropyltrimethoxysilane and p-tolyltrimethoxysilane, 3,3,3-trifluoropropyltrimethoxysilane and p-methoxyphenyltrimethoxysilane, 3,3,3-trifluoropropyltrimethoxysilane and triethoxy-2-thienylsilane, and 3,3,3-trifluoropropyltrimethoxysilane and 3-(triethoxysilyl)furan;

(11) perfluorooctylethyltriethoxysilane and phenyltrimethoxysilane, perfluorooctylethyltriethoxysilane and phenyltriethoxysilane, perfluorooctylethyltriethoxysilane and vinyltrimethoxysilane, perfluorooctylethyltriethoxysilane and vinyltriethoxysilane, perfluorooctylethyltriethoxysilane and γ-glycidoxypropyltrimethoxysilane, perfluorooctylethyltriethoxysilane and γ-glycidoxypropyltriethoxysilane, perfluorooctylethyltriethoxysilane and (triethoxysilyl)cyclohexane, perfluorooctylethyltriethoxysilane and p-tolyltrimethoxysilane, perfluorooctylethyltriethoxysilane and p-methoxyphenyltrimethoxysilane, perfluorooctylethyltriethoxysilane and triethoxy-2-thienylsilane, and perfluorooctylethyltriethoxysilane and 3-(triethoxysilyl)furan;

(12) triethoxyfluorosilane and phenyltrimethoxysilane, triethoxyfluorosilane and phenyltriethoxysilane, triethoxyfluorosilane and vinyltrimethoxysilane, triethoxyfluorosilane and vinyltriethoxysilane, triethoxyfluorosilane and γ-glycidoxypropyltrimethoxysilane, triethoxyfluorosilane and γ-glycidoxypropyltriethoxysilane, triethoxyfluorosilane and (triethoxysilyl)cyclohexane, triethoxyfluorosilane and p-tolyltrimethoxysilane, triethoxyfluorosilane and p-methoxyphenyltrimethoxysilane, triethoxyfluorosilane and triethoxy-2-thienylsilane, and triethoxyfluorosilane and 3-(triethoxysilyl)furan;

(13) tridecafluoro-1,1,2,2-tetrahydrooctyltriethoxysilane and phenyltrimethoxysilane, tridecafluoro-1,1,2,2-tetrahydrooctyltriethoxysilane and phenyltriethoxysilane, tridecafluoro-1,1,2,2-tetrahydrooctyltriethoxysilane and vinyltrimethoxysilane, tridecafluoro-1,1,2,2-tetrahydrooctyltriethoxysilane and vinyltriethoxysilane, tridecafluoro-1,1,2,2-tetrahydrooctyltriethoxysilane and γ-glycidoxypropyltrimethoxysilane, tridecafluoro-1,1,2,2-tetrahydrooctyltriethoxysilane and γ-glycidoxypropyltriethoxysilane, tridecafluoro-1,1,2,2-tetrahydrooctyltriethoxysilane and (triethoxysilyl)cyclohexane, tridecafluoro-1,1,2,2-tetrahydrooctyltriethoxysilane and p-tolyltrimethoxysilane, tridecafluoro-1,1,2,2-tetrahydrooctyltriethoxysilane and p-methoxyphenyltrimethoxysilane, tridecafluoro-1,1,2,2-tetrahydrooctyltriethoxysilane and triethoxy-2-thienylsilane, and tridecafluoro-1,1,2,2-tetrahydrooctyltriethoxysilane and 3-(triethoxysilyl)furan;

(14) 3-(heptafluoroisopropoxy)propyltriethoxysilane and phenyltrimethoxysilane, 3-(heptafluoroisopropoxy)propyltriethoxysilane and phenyltriethoxysilane, 3-(heptafluoroisopropoxy)propyltriethoxysilane and vinyltrimethoxysilane, 3-(heptafluoroisopropoxy)propyltriethoxysilane and vinyltriethoxysilane, 3-(heptafluoroisopropoxy)propyltriethoxysilane and γ-glycidoxypropyltrimethoxysilane, 3-(heptafluoroisopropoxy)propyltriethoxysilane and γ-glycidoxypropyltriethoxysilane, 3-(heptafluoroisopropoxy)propyltriethoxysilane and (triethoxysilyl)cyclohexane, 3-(heptafluoroisopropoxy)propyltriethoxysilane and p-tolyltrimethoxysilane, 3-(heptafluoroisopropoxy)propyltriethoxysilane and p-methoxyphenyltrimethoxysilane, 3-(heptafluoroisopropoxy)propyltriethoxysilane and triethoxy-2-thienylsilane, and 3-(heptafluoroisopropoxy)propyltriethoxysilane and 3-(triethoxysilyl)furan;

(15) heptadecafluoro-1,1,2,2-tetrahydrodecyltriethoxysilane and phenyltrimethoxysilane, heptadecafluoro-1,1,2,2-tetrahydrodecyltriethoxysilane and phenyltriethoxysilane, heptadecafluoro-1,1,2,2-tetrahydrodecyltriethoxysilane and vinyltrimethoxysilane, heptadecafluoro-1,1,2,2-tetrahydrodecyltriethoxysilane and vinyltriethoxysilane, heptadecafluoro-1,1,2,2-tetrahydrodecyltriethoxysilane and γ-glycidoxypropyltrimethoxysilane, heptadecafluoro-1,1,2,2-tetrahydrodecyltriethoxysilane and γ-glycidoxypropyltriethoxysilane, heptadecafluoro-1,1,2,2-tetrahydrodecyltriethoxysilane and (triethoxysilyl)cyclohexane, heptadecafluoro-1,1,2,2-tetrahydrodecyltriethoxysilane and p-tolyltrimethoxysilane, heptadecafluoro-1,1,2,2-tetrahydrodecyltriethoxysilane and p-methoxyphenyltrimethoxysilane, heptadecafluoro-1,1,2,2-tetrahydrodecyltriethoxysilane and triethoxy-2-thienylsilane, and heptadecafluoro-1,1,2,2-tetrahydrodecyltriethoxysilane and 3-(triethoxysilyl)furan;

(16) triethoxy-2-thienylsilane and phenyltrimethoxysilane, triethoxy-2-thienylsilane and phenyltriethoxysilane, triethoxy-2-thienylsilane and vinyltrimethoxysilane, triethoxy-2-thienylsilane and vinyltriethoxysilane, triethoxy-2-thienylsilane and γ-glycidoxypropyltrimethoxysilane, triethoxy-2-thienylsilane and γ-glycidoxypropyltriethoxysilane, triethoxy-2-thienylsilane and (triethoxysilyl)cyclohexane, triethoxy-2-thienylsilane and p-tolyltrimethoxysilane, triethoxy-2-thienylsilane and p-methoxyphenyltrimethoxysilane, and triethoxy-2-thienylsilane and 3-(triethoxysilyl)furan;

(17) 3-(Triethoxysilyl)furan and phenyltrimethoxysilane, 3-(triethoxysilyl)furan and phenyltriethoxysilane, 3-(triethoxysilyl)furan and vinyltrimethoxysilane, 3-(triethoxysilyl)furan and vinyltriethoxysilane, 3-(triethoxysilyl)furan and γ-glycidoxypropyltrimethoxysilane, 3-(triethoxysilyl)furan and γ-glycidoxypropyltriethoxysilane, 3-(triethoxysilyl)furan and (triethoxysilyl)cyclohexane, 3-(triethoxysilyl)furan and p-tolyltrimethoxysilane, 3-(triethoxysilyl)furan and p-methoxyphenyltrimethoxysilane, and 3-(triethoxysilyl)furan and triethoxy-2-thienylsilane;

(18) phenyltrimethoxysilane and phenyltriethoxysilane, phenyltrimethoxysilane and vinyltrimethoxysilane, phenyltrimethoxysilane and vinyltriethoxysilane, phenyltrimethoxysilane and γ-glycidoxypropyltrimethoxysilane, phenyltrimethoxysilane and γ-glycidoxypropyltriethoxysilane, phenyltrimethoxysilane and (triethoxysilyl)cyclohexane, phenyltrimethoxysilane and p-tolyltrimethoxysilane, phenyltrimethoxysilane and p-methoxyphenyltrimethoxysilane, phenyltrimethoxysilane and triethoxy-2-thienylsilane, and phenyltrimethoxysilane and 3-(triethoxysilyl)furan;

(19) phenyltriethoxysilane and phenyltrimethoxysilane, phenyltriethoxysilane and vinyltrimethoxysilane, phenyltriethoxysilane and vinyltriethoxysilane, phenyltriethoxysilane and γ-glycidoxypropyltrimethoxysilane, phenyltriethoxysilane and γ-glycidoxypropyltriethoxysilane, phenyltriethoxysilane and (triethoxysilyl)cyclohexane, phenyltriethoxysilane and p-tolyltrimethoxysilane, phenyltriethoxysilane and p-methoxyphenyltrimethoxysilane, phenyltriethoxysilane and triethoxy-2-thienylsilane, and phenyltriethoxysilane and 3-(triethoxysilyl)furan;

(20) vinyltrimethoxysilane and phenyltrimethoxysilane, vinyltrimethoxysilane and phenyltriethoxysilane, vinyltrimethoxysilane and vinyltriethoxysilane, vinyltrimethoxysilane and γ-glycidoxypropyltrimethoxysilane, vinyltrimethoxysilane and γ-glycidoxypropyltriethoxysilane, vinyltrimethoxysilane and (triethoxysilyl)cyclohexane, vinyltrimethoxysilane and p-tolyltrimethoxysilane, vinyltrimethoxysilane and p-methoxyphenyltrimethoxysilane, vinyltrimethoxysilane and triethoxy-2-thienylsilane, and vinyltrimethoxysilane and 3-(triethoxysilyl)furan;

(21) vinyltriethoxysilane and phenyltrimethoxysilane, vinyltriethoxysilane and phenyltriethoxysilane, vinyltriethoxysilane and vinyltrimethoxysilane, vinyltriethoxysilane and γ-glycidoxypropyltrimethoxysilane, vinyltriethoxysilane and γ-glycidoxypropyltriethoxysilane, vinyltriethoxysilane and (triethoxysilyl)cyclohexane, vinyltriethoxysilane and p-tolyltrimethoxysilane, vinyltriethoxysilane and p-methoxyphenyltrimethoxysilane, vinyltriethoxysilane and triethoxy-2-thienylsilane, and vinyltriethoxysilane and 3-(triethoxysilyl)furan;

(22) γ-glycidoxypropyltrimethoxysilane and phenyltrimethoxysilane, γ-glycidoxypropyltrimethoxysilane and phenyltriethoxysilane, γ-glycidoxypropyltrimethoxysilane and vinyltrimethoxysilane, γ-glycidoxypropyltrimethoxysilane and vinyltriethoxysilane, γ-glycidoxypropyltrimethoxysilane and γ-glycidoxypropyltriethoxysilane, γ-glycidoxypropyltrimethoxysilane and (triethoxysilyl)cyclohexane, γ-glycidoxypropyltrimethoxysilane and p-tolyltrimethoxysilane, γ-glycidoxypropyltrimethoxysilane and p-methoxyphenyltrimethoxysilane, γ-glycidoxypropyltrimethoxysilane and triethoxy-2-thienylsilane, and γ-glycidoxypropyltriethoxysilane and 3-(triethoxysilyl)furan;

(23) γ-glycidoxypropyltriethoxysilane and phenyltrimethoxysilane, γ-glycidoxypropyltriethoxysilane and phenyltriethoxysilane, γ-glycidoxypropyltriethoxysilane and vinyltrimethoxysilane, γ-glycidoxypropyltriethoxysilane and vinyltriethoxysilane, γ-glycidoxypropyltriethoxysilane and γ-glycidoxypropyltrimethoxysilane, γ-glycidoxypropyltriethoxysilane and (triethoxysilyl)cyclohexane, γ-glycidoxypropyltriethoxysilane and p-tolyltrimethoxysilane, γ-glycidoxypropyltriethoxysilane and p-methoxyphenyltrimethoxysilane, γ-glycidoxypropyltriethoxysilane and triethoxy-2-thienylsilane, and γ-glycidoxypropyltriethoxysilane and 3-(triethoxysilyl)furan;

(24) (triethoxysilyl)cyclohexane and phenyltrimethoxysilane, (triethoxysilyl)cyclohexane and phenyltriethoxysilane, (triethoxysilyl)cyclohexane and vinyltrimethoxysilane, (triethoxysilyl)cyclohexane and vinyltriethoxysilane, (triethoxysilyl)cyclohexane and γ-glycidoxypropyltrimethoxysilane, (triethoxysilyl)cyclohexane and γ-glycidoxypropyltriethoxysilane, (triethoxysilyl)cyclohexane and p-tolyltrimethoxysilane, (triethoxysilyl)cyclohexane and p-methoxyphenyltrimethoxysilane, (triethoxysilyl)cyclohexane and triethoxy-2-thienylsilane, and (triethoxysilyl)cyclohexane and 3-(triethoxysilyl)furan;

(25) p-tolyltrimethoxysilane and phenyltrimethoxysilane, p-tolyltrimethoxysilane and phenyltriethoxysilane, p-tolyltrimethoxysilane and vinyltrimethoxysilane, p-tolyltrimethoxysilane and vinyltriethoxysilane, p-tolyltrimethoxysilane and γ-glycidoxypropyltrimethoxysilane, p-tolyltrimethoxysilane and γ-glycidoxypropyltriethoxysilane, p-tolyltrimethoxysilane and (triethoxysilyl)cyclohexane, p-tolyltrimethoxysilane and p-methoxyphenyltrimethoxysilane, p-tolyltrimethoxysilane and triethoxy-2-thienylsilane, and p-tolyltrimethoxysilane and 3-(triethoxysilyl)furan;

(26) p-methoxyphenyltrimethoxysilane and phenyltrimethoxysilane, p-methoxyphenyltrimethoxysilane and phenyltriethoxysilane, p-methoxyphenyltrimethoxysilane and vinyltrimethoxysilane, p-methoxyphenyltrimethoxysilane and vinyltriethoxysilane, p-methoxyphenyltrimethoxysilane and γ-glycidoxypropyltrimethoxysilane, p-methoxyphenyltrimethoxysilane and γ-glycidoxypropyltriethoxysilane, p-methoxyphenyltrimethoxysilane and (triethoxysilyl)cyclohexane, p-methoxyphenyltrimethoxysilane and p-tolyltrimethoxysilane, p-methoxyphenyltrimethoxysilane and triethoxy-2-thienylsilane, and p-methoxyphenyltrimethoxysilane and 3-(triethoxysilyl)furan.

Specific examples of more preferred combinations are those indicated below:

(27) methyltrimethoxysilane and phenyltrimethoxysilane, methyltrimethoxysilane and phenyltriethoxysilane, methyltrimethoxysilane and vinyltrimethoxysilane, methyltrimethoxysilane and vinyltriethoxysilane, methyltrimethoxysilane and (triethoxysilyl)cyclohexane, methyltrimethoxysilane and p-tolyltrimethoxysilane, methyltrimethoxysilane and p-methoxyphenyltrimethoxysilane, methyltrimethoxysilane and triethoxy-2-thienylsilane, and methyltrimethoxysilane and 3-(triethoxysilyl)furan;

(28) methyltriethoxysilane and phenyltrimethoxysilane, methyltriethoxysilane and phenyltriethoxysilane, methyltriethoxysilane and vinyltrimethoxysilane, methyltriethoxysilane and vinyltriethoxysilane, methyltriethoxysilane and (triethoxysilyl)cyclohexane, methyltriethoxysilane and p-tolyltrimethoxysilane, methyltriethoxysilane and p-methoxyphenyltrimethoxysilane, methyltriethoxysilane and triethoxy-2-thienylsilane, and methyltriethoxysilane and 3-(triethoxysilyl)furan;

(29) ethyltrimethoxysilane and phenyltrimethoxysilane, ethyltrimethoxysilane and phenyltriethoxysilane, ethyltrimethoxysilane and vinyltrimethoxysilane, ethyltrimethoxysilane and vinyltriethoxysilane, ethyltrimethoxysilane and (triethoxysilyl)cyclohexane, ethyltrimethoxysilane and p-tolyltrimethoxysilane, ethyltrimethoxysilane and p-methoxyphenyltrimethoxysilane, ethyltrimethoxysilane and triethoxy-2-thienylsilane, and ethyltrimethoxysilane and 3-(triethoxysilyl)furan;

(30) ethyltriethoxysilane and phenyltrimethoxysilane, ethyltriethoxysilane and phenyltriethoxysilane, ethyltriethoxysilane and vinyltrimethoxysilane, ethyltriethoxysilane and vinyltriethoxysilane, ethyltriethoxysilane and (triethoxysilyl)cyclohexane, ethyltriethoxysilane and p-tolyltrimethoxysilane, ethyltriethoxysilane and p-methoxyphenyltrimethoxysilane, ethyltriethoxysilane and triethoxy-2-thienylsilane, and ethyltriethoxysilane and 3-(triethoxysilyl)furan;

(31) propyltrimethoxysilane and phenyltrimethoxysilane, propyltrimethoxysilane and phenyltriethoxysilane, propyltrimethoxysilane and vinyltrimethoxysilane, propyltrimethoxysilane and vinyltriethoxysilane, propyltrimethoxysilane and (triethoxysilyl)cyclohexane, propyltrimethoxysilane and p-tolyltrimethoxysilane, propyltrimethoxysilane and p-methoxyphenyltrimethoxysilane, propyltrimethoxysilane and triethoxy-2-thienylsilane, and propyltrimethoxysilane and 3-(triethoxysilyl)furan;

(32) propyltriethoxysilane and phenyltrimethoxysilane, propyltriethoxysilane and phenyltriethoxysilane, propyltriethoxysilane and vinyltrimethoxysilane, propyltriethoxysilane and vinyltriethoxysilane, propyltriethoxysilane and (triethoxysilyl)cyclohexane, propyltriethoxysilane and p-tolyltrimethoxysilane, propyltriethoxysilane and p-methoxyphenyltrimethoxysilane, propyltriethoxysilane and triethoxy-2-thienylsilane, and propyltriethoxysilane and 3-(triethoxysilyl)furan;

(33) butyltrimethoxysilane and phenyltrimethoxysilane, butyltrimethoxysilane and phenyltriethoxysilane, butyltrimethoxysilane and vinyltrimethoxysilane, butyltrimethoxysilane and vinyltriethoxysilane, butyltrimethoxysilane and (triethoxysilyl)cyclohexane, butyltrimethoxysilane and p-tolyltrimethoxysilane, butyltrimethoxysilane and p-methoxyphenyltrimethoxysilane, butyltrimethoxysilane and triethoxy-2-thienylsilane, and butyltrimethoxysilane and 3-(triethoxysilyl)furan;

(34) butyltriethoxysilane and phenyltrimethoxysilane, butyltriethoxysilane and phenyltriethoxysilane, butyltriethoxysilane and vinyltrimethoxysilane, butyltriethoxysilane and vinyltriethoxysilane, butyltriethoxysilane and (triethoxysilyl)cyclohexane, butyltriethoxysilane and p-tolyltrimethoxysilane, butyltriethoxysilane and p-methoxyphenyltrimethoxysilane, butyltriethoxysilane and triethoxy-2-thienylsilane, and butyltriethoxysilane and 3-(triethoxysilyl)furan;

(35) triethoxy(4-(trifluoromethyl)phenyl)silane and phenyltrimethoxysilane, triethoxy(4-(trifluoromethyl)phenyl)silane and phenyltriethoxysilane, triethoxy(4-(trifluoromethyl)phenyl)silane and vinyltrimethoxysilane, triethoxy(4-(trifluoromethyl)phenyl)silane and vinyltriethoxysilane, triethoxy(4-(trifluoromethyl)phenyl)silane and (triethoxysilyl)cyclohexane, triethoxy(4-(trifluoromethyl)phenyl)silane and p-tolyltrimethoxysilane, triethoxy(4-(trifluoromethyl)phenyl)silane and p-methoxyphenyltrimethoxysilane, triethoxy(4-(trifluoromethyl)phenyl)silane and triethoxy-2-thienylsilane, and triethoxy(4-(trifluoromethyl)phenyl)silane and 3-(triethoxysilyl)furan;

(36) 3,3,3-trifluoropropyltrimethoxysilane and phenyltrimethoxysilane, 3,3,3-trifluoropropyltrimethoxysilane and phenyltriethoxysilane, 3,3,3-trifluoropropyltrimethoxysilane and vinyltrimethoxysilane, 3,3,3-trifluoropropyltrimethoxysilane and vinyltriethoxysilane, 3,3,3-trifluoropropyltrimethoxysilane and (triethoxysilyl)cyclohexane, 3,3,3-trifluoropropyltrimethoxysilane and p-tolyltrimethoxysilane, 3,3,3-trifluoropropyltrimethoxysilane and p-methoxyphenyltrimethoxysilane, 3,3,3-trifluoropropyltrimethoxysilane and triethoxy-2-thienylsilane, and 3,3,3-trifluoropropyltrimethoxysilane and 3-(triethoxysilyl)furan;

(37) perfluorooctylethyltriethoxysilane and phenyltrimethoxysilane, perfluorooctylethyltriethoxysilane and phenyltriethoxysilane, perfluorooctylethyltriethoxysilane and vinyltrimethoxysilane, perfluorooctylethyltriethoxysilane and vinyltriethoxysilane, perfluorooctylethyltriethoxysilane and (triethoxysilyl)cyclohexane, perfluorooctylethyltriethoxysilane and p-tolyltrimethoxysilane, perfluorooctylethyltriethoxysilane and p-methoxyphenyltrimethoxysilane, perfluorooctylethyltriethoxysilane and triethoxy-2-thienylsilane, and perfluorooctylethyltriethoxysilane and 3-(triethoxysilyl)furan;

(38) triethoxyfluorosilane and phenyltrimethoxysilane, triethoxyfluorosilane and phenyltriethoxysilane, triethoxyfluorosilane and vinyltrimethoxysilane, triethoxyfluorosilane and vinyltriethoxysilane, triethoxyfluorosilane and (triethoxysilyl)cyclohexane, triethoxyfluorosilane and p-tolyltrimethoxysilane, triethoxyfluorosilane and p-methoxyphenyltrimethoxysilane, triethoxyfluorosilane and triethoxy-2-thienylsilane, and triethoxyfluorosilane and 3-(triethoxysilyl)furan;

(39) tridecafluoro-1,1,2,2-tetrahydrooctyltriethoxysilane and phenyltrimethoxysilane, tridecafluoro-1,1,2,2-tetrahydrooctyltriethoxysilane and phenyltriethoxysilane, tridecafluoro-1,1,2,2-tetrahydrooctyltriethoxysilane and vinyltrimethoxysilane, tridecafluoro-1,1,2,2-tetrahydrooctyltriethoxysilane and vinyltriethoxysilane, tridecafluoro-1,1,2,2-tetrahydrooctyltriethoxysilane and (triethoxysilyl)cyclohexane, tridecafluoro-1,1,2,2-tetrahydrooctyltriethoxysilane and p-tolyltrimethoxysilane, tridecafluoro-1,1,2,2-tetrahydrooctyltriethoxysilane and p-methoxyphenyltrimethoxysilane, tridecafluoro-1,1,2,2-tetrahydrooctyltriethoxysilane and triethoxy-2-thienylsilane, and tridecafluoro-1,1,2,2-tetrahydrooctyltriethoxysilane and 3-(triethoxysilyl)furan;

(40) 3-(heptafluoroisopropoxy)propyltriethoxysilane and phenyltrimethoxysilane, 3-(heptafluoroisopropoxy)propyltriethoxysilane and phenyltriethoxysilane, 3-(heptafluoroisopropoxy)propyltriethoxysilane and vinyltrimethoxysilane, 3-(heptafluoroisopropoxy)propyltriethoxysilane and vinyltriethoxysilane, 3-(heptafluoroisopropoxy)propyltriethoxysilane and (triethoxysilyl)cyclohexane, 3-(heptafluoroisopropoxy)propyltriethoxysilane and p-tolyltrimethoxysilane, 3-(heptafluoroisopropoxy)propyltriethoxysilane and p-methoxyphenyltrimethoxysilane, 3-(heptafluoroisopropoxy)propyltriethoxysilane and triethoxy-2-thienylsilane, and 3-(heptafluoroisopropoxy) propyltriethoxysilane and 3-(triethoxysilyl)furan;

(41) heptadecafluoro-1,1,2,2-tetrahydrodecyltriethoxysilane and phenyltrimethoxysilane, heptadecafluoro-1,1,2,2-tetrahydrodecyltriethoxysilane and phenyltriethoxysilane, heptadecafluoro-1,1,2,2-tetrahydrodecyltriethoxysilane and vinyltrimethoxysilane, heptadecafluoro-1,1,2,2-tetrahydrodecyltriethoxysilane and vinyltriethoxysilane, heptadecafluoro-1,1,2,2-tetrahydrodecyltriethoxysilane and (triethoxysilyl)cyclohexane, heptadecafluoro-1,1,2,2-tetrahydrodecyltriethoxysilane and p-tolyltrimethoxysilane, heptadecafluoro-1,1,2,2-tetrahydrodecyltriethoxysilane and p-methoxyphenyltrimethoxysilane, heptadecafluoro-1,1,2,2-tetrahydrodecyltriethoxysilane and triethoxy-2-thienylsilane, and 3-(triethoxysilyl)furan;

(42) triethoxy-2-thienylsilane and phenyltrimethoxysilane, triethoxy-2-thienylsilane and phenyltriethoxysilane, triethoxy-2-thienylsilane and vinyltrimethoxysilane, triethoxy-2-thienylsilane and vinyltriethoxysilane, triethoxy-2-thienylsilane and (triethoxysilyl)cyclohexane, triethoxy-2-thienylsilane and p-tolyltrimethoxysilane, triethoxy-2-thienylsilane and p-methoxyphenyltrimethoxysilane, and triethoxy-2-thienylsilane and 3-(triethoxysilyl)furan;

(43) 3-(triethoxysilyl)furan and phenyltrimethoxysilane, 3-(triethoxysilyl)furan and phenyltriethoxysilane, 3-(triethoxysilyl)furan and vinyltrimethoxysilane, 3-(triethoxysilyl)furan and vinyltriethoxysilane, 3-(triethoxysilyl)furan and (triethoxysilyl)cyclohexane, 3-(triethoxysilyl)furan and p-tolyltrimethoxysilane, 3-(triethoxysilyl)furan and p-methoxyphenyltrimethoxysilane, and 3-(triethoxysilyl)furan and triethoxy-2-thienylsilane;

(44) phenyltrimethoxysilane and phenyltriethoxysilane, phenyltrimethoxysilane and vinyltrimethoxysilane, phenyltrimethoxysilane and vinyltriethoxysilane, phenyltrimethoxysilane and (triethoxysilyl)cyclohexane, phenyltrimethoxysilane and p-tolyltrimethoxysilane, phenyltrimethoxysilane and p-methoxyphenyltrimethoxysilane, phenyltrimethoxysilane and triethoxy-2-thienylsilane, and phenyltrimethoxysilane and 3-(triethoxysilyl)furan;

(45) phenyltriethoxysilane and phenyltrimethoxysilane, phenyltriethoxysilane and vinyltrimethoxysilane, phenyltriethoxysilane and vinyltriethoxysilane, phenyltriethoxysilane and (triethoxysilyl)cyclohexane, phenyltriethoxysilane and p-tolyltrimethoxysilane, phenyltriethoxysilane and p-methoxyphenyltrimethoxysilane, phenyltriethoxysilane and triethoxy-2-thienylsilane, and phenyltriethoxysilane and 3-(triethoxysilyl)furan;

(46) vinyltrimethoxysilane and phenyltrimethoxysilane, vinyltrimethoxysilane and phenyltriethoxysilane, vinyltrimethoxysilane and vinyltriethoxysilane, vinyltrimethoxysilane and (triethoxysilyl)cyclohexane, vinyltrimethoxysilane and p-tolyltrimethoxysilane, vinyltrimethoxysilane and p-methoxyphenyltrimethoxysilane, vinyltrimethoxysilane and triethoxy-2-thienylsilane, and vinyltrimethoxysilane and 3-(triethoxysilyl)furan;

(47) vinyltriethoxysilane and phenyltrimethoxysilane, vinyltriethoxysilane and phenyltriethoxysilane, vinyltriethoxysilane and vinyltrimethoxysilane, vinyltriethoxysilane and (triethoxysilyl)cyclohexane, vinyltriethoxysilane and p-tolyltrimethoxysilane, vinyltriethoxysilane and p-methoxyphenyltrimethoxysilane, vinyltriethoxysilane and triethoxy-2-thienylsilane, and vinyltriethoxysilane and 3-(triethoxysilyl)furan;

(48) (triethoxysilyl)cyclohexane and phenyltrimethoxysilane, (triethoxysilyl)cyclohexane and phenyltriethoxysilane, (triethoxysilyl)cyclohexane and vinyltrimethoxysilane, (triethoxysilyl)cyclohexane and vinyltriethoxysilane, (triethoxysilyl)cyclohexane and p-tolyltrimethoxysilane, (triethoxysilyl)cyclohexane and p-methoxyphenyltrimethoxysilane, (triethoxysilyl)cyclohexane and triethoxy-2-thienylsilane, and (triethoxysilyl)cyclohexane and 3-(triethoxysilyl)furan;

(49) p-tolyltrimethoxysilane and phenyltrimethoxysilane, p-tolyltrimethoxysilane and phenyltriethoxysilane, p-tolyltrimethoxysilane and vinyltrimethoxysilane, p-tolyltrimethoxysilane and vinyltriethoxysilane, p-tolyltrimethoxysilane and (triethoxysilyl)cyclohexane, p-tolyltrimethoxysilane and p-methoxyphenyltrimethoxysilane, p-tolyltrimethoxysilane and triethoxy-2-thienylsilane, and p-tolyltrimethoxysilane and 3-(triethoxysilyl)furan;

(50) p-Methoxyphenyltrimethoxysilane and phenyltrimethoxysilane, p-methoxyphenyltrimethoxysilane and phenyltriethoxysilane, p-methoxyphenyltrimethoxysilane and vinyltrimethoxysilane, p-methoxyphenyltrimethoxysilane and vinyltriethoxysilane, p-methoxyphenyltrimethoxysilane and (triethoxysilyl)cyclohexane, p-methoxyphenyltrimethoxysilane and p-tolyltrimethoxysilane, p-methoxyphenyltrimethoxysilane and triethoxy-2-thienylsilane, and p-methoxyphenyltrimethoxysilane and 3-(triethoxysilyl)furan.

When at least one trialkoxysilane compound and at least one tetraalkoxysilane compound are used in combination, examples of preferred combinations are indicated below:

(1) methyltrimethoxysilane and tetramethoxysilane, methyltrimethoxysilane and tetraethoxysilane, and methyltrimethoxysilane and tetrapropoxysilane;

(2) methyltriethoxysilane and tetramethoxysilane, methyltriethoxysilane and tetraethoxysilane, and methyltriethoxysilane and tetrapropoxysilane;

(3) ethyltrimethoxysilane and tetramethoxysilane, ethyltrimethoxysilane and tetraethoxysilane, and ethyltrimethoxysilane and tetrapropoxysilane;

(4) ethyltriethoxysilane and tetramethoxysilane, ethyltriethoxysilane and tetraethoxysilane, and ethyltriethoxysilane and tetrapropoxysilane;

(5) propyltrimethoxysilane and tetramethoxysilane, propyltrimethoxysilane and tetraethoxysilane, and propyltrimethoxysilane and tetrapropoxysilane;

(6) propyltriethoxysilane and tetramethoxysilane, propyltriethoxysilane and tetraethoxysilane, and propyltriethoxysilane and tetrapropoxysilane;

(7) butyltrimethoxysilane and tetramethoxysilane, butyltrimethoxysilane and tetraethoxysilane, and butyltrimethoxysilane and tetrapropoxysilane;

(8) butyltriethoxysilane and tetramethoxysilane, butyltriethoxysilane and tetraethoxysilane, and butyltriethoxysilane and tetrapropoxysilane;

(9) phenyltrimethoxysilane and tetramethoxysilane, phenyltrimethoxysilane and tetraethoxysilane, and phenyltrimethoxysilane and tetrapropoxysilane;

(10) phenyltriethoxysilane and tetramethoxysilane, phenyltriethoxysilane and tetraethoxysilane, and phenyltriethoxysilane and tetrapropoxysilane;

(11) p-tolyltrimethoxysilane and tetramethoxysilane, p-tolyltrimethoxysilane and tetraethoxysilane, and p-tolyltrimethoxysilane and tetrapropoxysilane;

(12) p-methoxyphenyltrimethoxysilane and tetramethoxysilane, p-methoxyphenyltrimethoxysilane and tetraethoxysilane, and p-methoxyphenyltrimethoxysilane and tetrapropoxysilane;

(13) vinyltrimethoxysilane and tetramethoxysilane, vinyltrimethoxysilane and tetraethoxysilane, and vinyltrimethoxysilane and tetrapropoxysilane;
(14) vinyltriethoxysilane and tetramethoxysilane, vinyltriethoxysilane and tetraethoxysilane, and vinyltriethoxysilane and tetrapropoxysilane;
(15) γ-glycidoxypropyltrimethoxysilane and tetramethoxysilane, γ-glycidoxypropyltrimethoxysilane and tetraethoxysilane, and γ-glycidoxypropyltrimethoxysilane and tetrapropoxysilane;
(16) γ-glycidoxypropyltriethoxysilane and tetramethoxysilane, γ-glycidoxypropyltriethoxysilane and tetraethoxysilane, and γ-glycidoxypropyltriethoxysilane and tetrapropoxysilane;
(17) triethoxy(4-(trifluoromethyl)phenyl)silane and tetramethoxysilane, triethoxy(4-(trifluoromethyl)phenyl)silane and tetraethoxysilane, and triethoxy(4-(trifluoromethyl)phenyl)silane and tetrapropoxysilane;
(18) (triethoxysilyl)cyclohexane and tetramethoxysilane, (triethoxysilyl)cyclohexane and tetraethoxysilane, and (triethoxysilyl)cyclohexane and tetrapropoxysilane;
(19) 3,3,3-trifluoropropyltrimethoxysilane and tetramethoxysilane, 3,3,3-trifluoropropyltrimethoxysilane and tetraethoxysilane, and 3,3,3-trifluoropropyltrimethoxysilane and tetrapropoxysilane;
(20) perfluorooctylethyltriethoxysilane and tetramethoxysilane, perfluorooctylethyltriethoxysilane and tetraethoxysilane, and perfluorooctylethyltriethoxysilane and tetrapropoxysilane;
(21) triethoxyfluorosilane and tetramethoxysilane, triethoxyfluorosilane and tetraethoxysilane, and triethoxyfluorosilane and tetrapropoxysilane;
(22) tridecafluoro-1,1,2,2-tetrahydrooctyltriethoxysilane and tetramethoxysilane, tridecafluoro-1,1,2,2-tetrahydrooctyltriethoxysilane and tetraethoxysilane, and tridecafluoro-1,1,2,2-tetrahydrooctyltriethoxysilane and tetrapropoxysilane;
(23) pentafluorophenylpropyltrimethoxysilane and tetramethoxysilane, pentafluorophenylpropyltrimethoxysilane and tetraethoxysilane, and pentafluorophenylpropyltrimethoxysilane and tetrapropoxysilane;
(24) 3-(heptafluoroisopropoxy)propyltriethoxysilane and tetramethoxysilane, 3-(heptafluoroisopropoxy)propyltriethoxysilane and tetraethoxysilane, and 3-(heptafluoroisopropoxy)propyltriethoxysilane and tetrapropoxysilane;
(25) heptadecafluoro-1,1,2,2-tetrahydrodecyltriethoxysilane and tetramethoxysilane, heptadecafluoro-1,1,2,2-tetrahydrodecyltriethoxysilane and tetraethoxysilane, and heptadecafluoro-1,1,2,2-tetrahydrodecyltriethoxysilane and tetrapropoxysilane;
(26) triethoxy-2-thienylsilane and tetramethoxysilane, triethoxy-2-thienylsilane and tetraethoxysilane, and triethoxy-2-thienylsilane and tetrapropoxysilane;
(27) 3-(triethoxysilyl)furan and tetramethoxysilane, 3-(triethoxysilyl)furan and tetraethoxysilane, and 3-(triethoxysilyl)furan and tetrapropoxysilane.

More preferred combinations are indicated below:
(28) methyltrimethoxysilane and tetramethoxysilane, methyltrimethoxysilane and tetraethoxysilane, and methyltrimethoxysilane and tetrapropoxysilane;
(29) methyltriethoxysilane and tetramethoxysilane, methyltriethoxysilane and tetraethoxysilane, and methyltriethoxysilane and tetrapropoxysilane;
(30) ethyltrimethoxysilane and tetramethoxysilane, ethyltrimethoxysilane and tetraethoxysilane, and ethyltrimethoxysilane and tetrapropoxysilane;
(31) ethyltriethoxysilane and tetramethoxysilane, ethyltriethoxysilane and tetraethoxysilane, and ethyltriethoxysilane and tetrapropoxysilane;
(32) propyltrimethoxysilane and tetramethoxysilane, propyltrimethoxysilane and tetraethoxysilane, and propyltrimethoxysilane and tetrapropoxysilane;
(33) propyltriethoxysilane and tetramethoxysilane, propyltriethoxysilane and tetraethoxysilane, and propyltriethoxysilane and tetrapropoxysilane;
(34) butyltrimethoxysilane and tetramethoxysilane, butyltrimethoxysilane and tetraethoxysilane, and butyltrimethoxysilane and tetrapropoxysilane;
(35) butyltriethoxysilane and tetramethoxysilane, butyltriethoxysilane and tetraethoxysilane, and butyltriethoxysilane and tetrapropoxysilane;
(36) phenyltrimethoxysilane and tetramethoxysilane, phenyltrimethoxysilane and tetraethoxysilane, and phenyltrimethoxysilane and tetrapropoxysilane;
(37) phenyltriethoxysilane and tetramethoxysilane, phenyltriethoxysilane and tetraethoxysilane, and phenyltriethoxysilane and tetrapropoxysilane;
(38) p-tolyltrimethoxysilane and tetramethoxysilane, p-tolyltrimethoxysilane and tetraethoxysilane, and p-tolyltrimethoxysilane and tetrapropoxysilane;
(39) p-methoxyphenyltrimethoxysilane and tetramethoxysilane, p-methoxyphenyltrimethoxysilane and tetraethoxysilane, and p-methoxyphenyltrimethoxysilane and tetrapropoxysilane;
(40) vinyltrimethoxysilane and tetramethoxysilane, vinyltrimethoxysilane and tetraethoxysilane, and vinyltrimethoxysilane and tetrapropoxysilane;
(41) vinyltriethoxysilane and tetramethoxysilane, vinyltriethoxysilane and tetraethoxysilane, and vinyltriethoxysilane and tetrapropoxysilane;
(42) triethoxy(4-(trifluoromethyl)phenyl)silane and tetramethoxysilane, triethoxy(4-(trifluoromethyl)phenyl)silane and tetraethoxysilane, and triethoxy(4-(trifluoromethyl)phenyl)silane and tetrapropoxysilane;
(43) (triethoxysilyl)cyclohexane and tetramethoxysilane, (triethoxysilyl)cyclohexane and tetraethoxysilane, and (triethoxysilyl)cyclohexane and tetrapropoxysilane;
(44) 3,3,3-trifluoropropyltrimethoxysilane and tetramethoxysilane, 3,3,3-trifluoropropyltrimethoxysilane and tetraethoxysilane, and 3,3,3-trifluoropropyltrimethoxysilane and tetrapropoxysilane;
(45) perfluorooctylethyltriethoxysilane and tetramethoxysilane, perfluorooctylethyltriethoxysilane and tetraethoxysilane, and perfluorooctylethyltriethoxysilane and tetrapropoxysilane;
(46) triethoxyfluorosilane and tetramethoxysilane, triethoxyfluorosilane and tetraethoxysilane, and triethoxyfluorosilane and tetrapropoxysilane;
(47) tridecafluoro-1,1,2,2-tetrahydrooctyltriethoxysilane and tetramethoxysilane, tridecafluoro-1,1,2,2-tetrahydrooctyltriethoxysilane and tetraethoxysilane, and tridecafluoro-1,1,2,2-tetrahydrooctyltriethoxysilane and tetrapropoxysilane;
(48) pentafluorophenylpropyltrimethoxysilane and tetramethoxysilane, pentafluorophenylpropyltrimethoxysilane and tetraethoxysilane, and pentafluorophenylpropyltrimethoxysilane and tetrapropoxysilane;
(49) 3-(heptafluoroisopropoxy)propyltriethoxysilane and tetramethoxysilane, 3-(heptafluoroisopropoxy)propyltriethoxysilane and tetraethoxysilane, and 3-(heptafluoroisopropoxy)propyltriethoxysilane and tetrapropoxysilane;
(50) heptadecafluoro-1,1,2,2-tetrahydrodecyltriethoxysilane and tetramethoxysilane, heptadecafluoro-1,1,2,2-tetrahydrodecyltriethoxysilane and tetraethoxysilane, and heptadecafluoro-1,1,2,2-tetrahydrodecyltriethoxysilane and tetrapropoxysilane;

(51) triethoxy-2-thienylsilane and tetramethoxysilane, triethoxy-2-thienylsilane and tetraethoxysilane, and triethoxy-2-thienylsilane and tetrapropoxysilane;

(52) 3-(triethoxysilyl)furan and tetramethoxysilane, 3-(triethoxysilyl)furan and tetraethoxysilane, and 3-(triethoxysilyl)furan and tetrapropoxysilane.

For preferred combinations in the case where two types of dialkoxysilane compounds are used in combination, the following examples are mentioned:

(1) methylhydrogendimethoxysilane and methylhydrogendiethoxysilane, methylhydrogendimethoxysilane and dimethyldimethoxysilane, methylhydrogendimethoxysilane and dimethyldiethoxysilane, methylhydrogendimethoxysilane and methylethyldimethoxysilane, methylhydrogendimethoxysilane and diethyldimethoxysilane, methylhydrogendimethoxysilane and diethyldiethoxysilane, methylhydrogendimethoxysilane and methylpropyldimethoxysilane, methylhydrogendimethoxysilane and methylpropyldiethoxysilane, methylhydrogendimethoxysilane and diisopropyldimethoxysilane, methylhydrogendimethoxysilane and phenylmethyldimethoxysilane, methylhydrogendimethoxysilane and vinylmethyldimethoxysilane, methylhydrogendimethoxysilane and γ-glycidoxypropylmethyldimethoxysilane, methylhydrogendimethoxysilane and γ-glycidoxypropylmethyldiethoxysilane, methylhydrogendimethoxysilane and β-(3,4-epoxycyclohexyl)ethylmethyldimethoxysilane, methylhydrogendimethoxysilane and γ-methacryloxypropylmethyldimethoxysilane, methylhydrogendimethoxysilane and γ-methacryloxypropylmethyldiethoxysilane, methylhydrogendimethoxysilane and γ-mercaptopropylmethyldimethoxysilane, methylhydrogendimethoxysilane and γ-aminopropylmethyldiethoxysilane, methylhydrogendimethoxysilane and N-(2-aminoethyl)aminopropylmethyldimethoxysilane, and methylhydrogendimethoxysilane and 3,3,3-trifluoropropylmethyldimethoxysilane;

(2) methylhydrogendiethoxysilane and dimethyldimethoxysilane, methylhydrogendiethoxysilane and dimethyldiethoxysilane, methylhydrogendiethoxysilane and methylethyldimethoxysilane, methylhydrogendiethoxysilane and diethyldimethoxysilane, methylhydrogendiethoxysilane and diethyldiethoxysilane, methylhydrogendiethoxysilane and methylpropyldimethoxysilane, methylhydrogendiethoxysilane and methylpropyldiethoxysilane, methylhydrogendiethoxysilane and diisopropyldimethoxysilane, methylhydrogendiethoxysilane and phenylmethyldimethoxysilane, methylhydrogendiethoxysilane and vinylmethyldimethoxysilane, methylhydrogendiethoxysilane and γ-glycidoxypropylmethyldimethoxysilane, methylhydrogendiethoxysilane and γ-glycidoxypropylmethyldiethoxysilane, methylhydrogendiethoxysilane and β-(3,4-epoxycyclohexyl)ethylmethyldimethoxysilane, methylhydrogendiethoxysilane and γ-methacryloxypropylmethyldimethoxysilane, methylhydrogendiethoxysilane and γ-methacryloxypropylmethyldiethoxysilane, methylhydrogendiethoxysilane and γ-mercaptopropylmethyldimethoxysilane, methylhydrogendiethoxysilane and γ-aminopropylmethyldiethoxysilane, methylhydrogendiethoxysilane and N-(2-aminoethyl)aminopropylmethyldimethoxysilane, and methylhydrogendiethoxysilane and 3,3,3-trifluoropropylmethyldimethoxysilane;

(3) dimethyldimethoxysilane and dimethyldiethoxysilane, dimethyldimethoxysilane and methylethyldimethoxysilane, dimethyldimethoxysilane and diethyldimethoxysilane, dimethyldimethoxysilane and diethyldiethoxysilane, dimethyldimethoxysilane and methylpropyldimethoxysilane, dimethyldimethoxysilane and methylpropyldiethoxysilane, dimethyldimethoxysilane and diisopropyldimethoxysilane, dimethyldimethoxysilane and phenylmethyldimethoxysilane, dimethyldimethoxysilane and vinylmethyldimethoxysilane, dimethyldimethoxysilane and γ-glycidoxypropylmethyldimethoxysilane, dimethyldimethoxysilane and γ-glycidoxypropylmethyldiethoxysilane, dimethyldimethoxysilane and β-(3,4-epoxycyclohexyl)ethylmethyldimethoxysilane, dimethyldimethoxysilane and γ-methacryloxypropylmethyldimethoxysilane, dimethyldimethoxysilane and γ-methacryloxypropylmethyldiethoxysilane, dimethyldimethoxysilane and γ-mercaptopropylmethyldimethoxysilane, dimethyldimethoxysilane and γ-aminopropylmethyldiethoxysilane, dimethyldimethoxysilane and N-(2-aminoethyl)aminopropylmethyldimethoxysilane, and dimethyldimethoxysilane and 3,3,3-trifluoropropylmethyldimethoxysilane;

(4) dimethyldiethoxysilane and methylethyldimethoxysilane, dimethyldiethoxysilane and diethyldimethoxysilane, dimethyldiethoxysilane and diethyldiethoxysilane, dimethyldiethoxysilane and methylpropyldimethoxysilane, dimethyldiethoxysilane and methylpropyldiethoxysilane, dimethyldiethoxysilane and diisopropyldimethoxysilane, dimethyldiethoxysilane and phenylmethyldimethoxysilane, dimethyldiethoxysilane and vinylmethyldimethoxysilane, dimethyldiethoxysilane and γ-glycidoxypropylmethyldimethoxysilane, dimethyldiethoxysilane and γ-glycidoxypropylmethyldiethoxysilane, dimethyldiethoxysilane and β-(3,4-epoxycyclohexyl)ethylmethyldimethoxysilane, dimethyldiethoxysilane and γ-methacryloxypropylmethyldimethoxysilane, dimethyldiethoxysilane and γ-methacryloxypropylmethyldiethoxysilane, dimethyldiethoxysilane and γ-mercaptopropylmethyldimethoxysilane, dimethyldiethoxysilane and γ-aminopropylmethyldiethoxysilane, dimethyldiethoxysilane and N-(2-aminoethyl)aminopropylmethyldimethoxysilane, and dimethyldiethoxysilane and 3,3,3-trifluoropropylmethyldimethoxysilane;

(5) methylethyldimethoxysilane and diethyldimethoxysilane, methylethyldimethoxysilane and diethyldiethoxysilane, methylethyldimethoxysilane and methylpropyldimethoxysilane, methylethyldimethoxysilane and methylpropyldiethoxysilane, methylethyldimethoxysilane and diisopropyldimethoxysilane, methylethyldimethoxysilane and phenylmethyldimethoxysilane, methylethyldimethoxysilane and vinylmethyldimethoxysilane, methylethyldimethoxysilane and γ-glycidoxypropylmethyldimethoxysilane, methylethyldimethoxysilane and γ-glycidoxypropylmethyldiethoxysilane, methylethyldimethoxysilane and β-(3,4-epoxycyclohexyl)ethylmethyldimethoxysilane, methylethyldimethoxysilane and γ-methacryloxypropylmethyldimethoxysilane, methylethyldimethoxysilane and γ-methacryloxypropylmethyldiethoxysilane, methylethyldimethoxysilane and γ-mercaptopropylmethyldimethoxysilane, methylethyldimethoxysilane and γ-aminopropylmethyldiethoxysilane, methylethyldimethoxysilane and N-(2-aminoethyl)aminopropylmethyldimethoxysilane, and methylethyldimethoxysilane and 3,3,3-trifluoropropylmethyldimethoxysilane;

(6) diethyldimethoxysilane and diethyldiethoxysilane, diethyldimethoxysilane and methylpropyldimethoxysilane, diethyldimethoxysilane and methylpropyldiethoxysilane, diethyldimethoxysilane and diisopropyldimethoxysilane, diethyldimethoxysilane and phenylmethyldimethoxysilane, diethyldimethoxysilane and vinylmethyldimethoxysilane, diethyldimethoxysilane and γ-glycidoxypropylmethyldimethoxysilane, diethyldimethoxysilane and γ-glycidoxypropylmethyldiethoxysilane, diethyldimethoxysilane and 3-(3,4-epoxycyclohexyl)ethylmethyldimethoxysilane, diethyldimethoxysilane and γ-methacryloxypropylmethyldimethoxysilane, diethyldimethoxysilane and γ-methacryloxypropylmethyldiethoxysilane, diethyldimethoxysilane and γ-mercaptopropylmethyldimethoxysilane, diethyldimethoxysilane and γ-aminopropylmethyldiethoxysilane, diethyldimethoxysilane and N-(2-aminoethyl)aminopropylmethyldimethoxysilane, and diethyldimethoxysilane and 3,3,3-trifluoropropylmethyldimethoxysilane;

(7) diethyldiethoxysilane and methylpropyldimethoxysilane, diethyldiethoxysilane and methylpropyldiethoxysilane, diethyldiethoxysilane and diisopropyldimethoxysilane, diethyldiethoxysilane and phenylmethyldimethoxysilane, diethyldiethoxysilane and vinylmethyldimethoxysilane, diethyldiethoxysilane and γ-glycidoxypropylmethyldimethoxysilane, diethyldiethoxysilane and γ-glycidoxypropylmethyldiethoxysilane, diethyldiethoxysilane and β-(3,4-epoxycyclohexyl)ethylmethyldimethoxysilane, diethyldiethoxysilane and γ-methacryloxypropylmethyldimethoxysilane, diethyldiethoxysilane and γ-methacryloxypropylmethyldiethoxysilane, diethyldiethoxysilane and γ-mercaptopropylmethyldimethoxysilane, diethyldiethoxysilane and γ-aminopropylmethyldiethoxysilane, diethyldiethoxysilane and N-(2-aminoethyl)aminopropylmethyldimethoxysilane, and diethyldiethoxysilane and 3,3,3-trifluoropropylmethyldimethoxysilane;

(8) methylpropyldimethoxysilane and methylpropyldiethoxysilane, methylpropyldimethoxysilane and diisopropyldimethoxysilane, methylpropyldimethoxysilane and phenylmethyldimethoxysilane, methylpropyldimethoxysilane and vinylmethyldimethoxysilane, methylpropyldimethoxysilane and γ-glycidoxypropylmethyldimethoxysilane, methylpropyldimethoxysilane and γ-glycidoxypropylmethyldiethoxysilane, methylpropyldimethoxysilane and β-(3,4-epoxycyclohexyl)ethylmethyldimethoxysilane, methylpropyldimethoxysilane and γ-methacryloxypropylmethyldimethoxysilane, methylpropyldimethoxysilane and γ-methacryloxypropylmethyldiethoxysilane, methylpropyldimethoxysilane and γ-mercaptopropylmethyldimethoxysilane, methylpropyldimethoxysilane and γ-aminopropylmethyldiethoxysilane, methylpropyldimethoxysilane and N-(2-aminoethyl)aminopropylmethyldimethoxysilane, and methylpropyldimethoxysilane and 3,3,3-trifluoropropylmethyldimethoxysilane;

(9) methylpropyldiethoxysilane and diisopropyldimethoxysilane, methylpropyldiethoxysilane and phenylmethyldimethoxysilane, methylpropyldiethoxysilane and vinylmethyldimethoxysilane, methylpropyldiethoxysilane and γ-glycidoxypropylmethyldimethoxysilane, methylpropyldiethoxysilane and γ-glycidoxypropylmethyldiethoxysilane, methylpropyldiethoxysilane and β-(3,4-epoxycyclohexyl)ethylmethyldimethoxysilane, methylpropyldiethoxysilane and γ-methacryloxypropylmethyldimethoxysilane, methylpropyldiethoxysilane and γ-methacryloxypropylmethyldiethoxysilane, methylpropyldiethoxysilane and γ-mercaptopropylmethyldimethoxysilane, methylpropyldiethoxysilane and γ-aminopropylmethyldiethoxysilane, methylpropyldiethoxysilane and N-(2-aminoethyl)aminopropylmethyldimethoxysilane, and methylpropyldiethoxysilane and 3,3,3-trifluoropropylmethyldimethoxysilane;

(10) diisopropyldimethoxysilane and phenylmethyldimethoxysilane, diisopropyldimethoxysilane and vinylmethyldimethoxysilane, diisopropyldimethoxysilane and γ-glycidoxypropylmethyldimethoxysilane, diisopropyldimethoxysilane and γ-glycidoxypropylmethyldiethoxysilane, diisopropyldimethoxysilane and 1-(3,4-epoxycyclohexyl)ethylmethyldimethoxysilane, diisopropyldimethoxysilane and γ-methacryloxypropylmethyldimethoxysilane, diisopropyldimethoxysilane and γ-methacryloxypropylmethyldiethoxysilane, diisopropyldimethoxysilane and γ-mercaptopropylmethyldimethoxysilane, diisopropyldimethoxysilane and γ-aminopropylmethyldiethoxysilane, diisopropyldimethoxysilane and N-(2-aminoethyl)aminopropylmethyldimethoxysilane, and diisopropyldimethoxysilane and 3,3,3-trifluoropropylmethyldimethoxysilane;

(11) phenylmethyldimethoxysilane and vinylmethyldimethoxysilane, phenylmethyldimethoxysilane and γ-glycidoxypropylmethyldimethoxysilane, phenylmethyldimethoxysilane and γ-glycidoxypropylmethyldiethoxysilane, phenylmethyldimethoxysilane and β-(3,4-epoxycyclohexyl)ethylmethyldimethoxysilane, phenylmethyldimethoxysilane and γ-methacryloxypropylmethyldimethoxysilane, phenylmethyldimethoxysilane and γ-methacryloxypropylmethyldiethoxysilane, phenylmethyldimethoxysilane and γ-mercaptopropylmethyldimethoxysilane, phenylmethyldimethoxysilane and γ-aminopropylmethyldiethoxysilane, phenylmethyldimethoxysilane and N-(2-aminoethyl)aminopropylmethyldimethoxysilane, and phenylmethyldimethoxysilane and 3,3,3-trifluoropropylmethyldimethoxysilane;

(12) vinylmethyldimethoxysilane and γ-glycidoxypropylmethyldimethoxysilane, vinylmethyldimethoxysilane and γ-glycidoxypropylmethyldiethoxysilane, vinylmethyldimethoxysilane and β-(3,4-epoxycyclohexyl)ethylmethyldimethoxysilane, vinylmethyldimethoxysilane and γ-methacryloxypropylmethyldimethoxysilane, vinylmethyldimethoxysilane and γ-methacryloxypropylmethyldiethoxysilane, vinylmethyldimethoxysilane and γ-mercaptopropylmethyldimethoxysilane, vinylmethyldimethoxysilane and γ-aminopropylmethyldiethoxysilane, vinylmethyldimethoxysilane and N-(2-aminoethyl)aminopropylmethyldimethoxysilane, and vinylmethyldimethoxysilane and 3,3,3-trifluoropropylmethyldimethoxysilane;

(13) γ-glycidoxypropylmethyldimethoxysilane and γ-glycidoxypropylmethyldiethoxysilane, γ-glycidoxypropylmethyldimethoxysilane and β-(3,4-epoxycyclohexyl)ethylmethyldimethoxysilane, γ-glycidoxypropylmethyldimethoxysilane and γ-methacryloxypropylmethyldimethoxysilane, γ-glycidoxypropylmethyldimethoxysilane and γ-methacryloxypropylmethyldiethoxysilane, γ-glycidoxypropylmethyldimethoxysilane and γ-mercaptopropylmethyldimethoxysilane, γ-glycidoxypropylmethyldimethoxysilane and γ-aminopropylmethyldiethoxysilane, γ-glycidoxypropylmethyldimethoxysilane and N-(2-aminoethyl)aminopropylmethyldimethoxysilane, and γ-glycidoxypropylmethyldimethoxysilane and 3,3,3-trifluoropropylmethyldimethoxysilane;

(14) γ-glycidoxypropylmethyldiethoxysilane and β-(3,4-epoxycyclohexyl)ethylmethyldimethoxysilane, γ-glycidoxypropylmethyldiethoxysilane and γ-methacryloxypropylmethyldimethoxysilane, γ-glycidoxypropylmethyldiethoxysilane and γ-methacryloxypropylmethyldiethoxysilane, γ-glycidoxypropylmethyldiethoxysilane and γ-mercaptopropylmethyldimethoxysilane, γ-glycidoxypropylmethyldiethoxysilane and γ-aminopropylmethyldiethoxysilane, γ-glycidoxypropylmethyldiethoxysilane and N-(2-aminoethyl)aminopropylmethyldimethoxysilane, and γ-glycidoxypropylmethyldiethoxysilane and 3,3,3-trifluoropropylmethyldimethoxysilane;

(15) β-(3,4-epoxycyclohexyl)ethylmethyldimethoxysilane and γ-methacryloxypropylmethyldimethoxysilane, β-(3,4-epoxycyclohexyl)ethylmethyldimethoxysilane and γ-methacryloxypropylmethyldiethoxysilane, β-(3,4-epoxycyclohexyl)ethylmethyldimethoxysilane and γ-mercaptopropylmethyldimethoxysilane, β-(3,4-epoxycyclohexyl)ethylmethyldimethoxysilane and γ-aminopropylmethyldiethoxysilane, β-(3,4-epoxycyclohexyl)ethylmethyldimethoxysilane and N-(2-aminoethyl)aminopropylmethyldimethoxysilane, and β-(3,4-epoxycyclohexyl)ethylmethyldimethoxysilane and 3,3,3-trifluoropropylmethyldimethoxysilane;

(16) γ-methacryloxypropylmethyldimethoxysilane and γ-methacryloxypropylmethyldiethoxysilane, γ-methacryloxypropylmethyldiethoxysilane and γ-mercaptopropylmethyldimethoxysilane, γ-methacryloxypropylmethyldimethoxysilane and γ-aminopropylmethyldiethoxysilane, γ-methacryloxypropylmethyldimethoxysilane and N-(2-aminoethyl)aminopropylmethyldimethoxysilane, and γ-methacryloxypropylmethyldimethoxysilane and 3,3,3-trifluoropropylmethyldimethoxysilane;

(17) γ-methacryloxypropylmethyldiethoxysilane and γ-mercaptopropylmethyldimethoxysilane, γ-methacryloxypropylmethyldiethoxysilane and γ-aminopropylmethyldiethoxysilane, γ-methacryloxypropylmethyldiethoxysilane and N-(2-aminoethyl)aminopropylmethyldimethoxysilane, and γ-methacryloxypropylmethyldiethoxysilane and 3,3,3-trifluoropropylmethyldimethoxysilane;

(18) γ-mercaptopropylmethyldimethoxysilane and γ-aminopropylmethyldiethoxysilane, γ-mercaptopropylmethyldimethoxysilane and N-(2-aminoethyl)aminopropylmethyldimethoxysilane, and γ-mercaptopropylmethyldimethoxysilane and 3,3,3-trifluoropropylmethyldimethoxysilane;

(19) γ-aminopropylmethyldiethoxysilane and N-(2-aminoethyl)aminopropylmethyldimethoxysilane, and γ-aminopropylmethyldiethoxysilane and 3,3,3-trifluoropropylmethyldimethoxysilane;

(20) N-(2-aminoethyl)aminopropylmethyldimethoxysilane and 3,3,3-trifluoropropylmethyldimethoxysilane.

When at least one dialkoxysilane compound and at least one trialkoxysilane compound are used in combination, preferred combinations are indicated below:

(1) methylhydrogendimethoxysilane and methyltrimethoxysilane, methylhydrogendimethoxysilane and methyltriethoxysilane, methylhydrogendimethoxysilane and ethyltrimethoxysilane, methylhydrogendimethoxysilane and ethyltriethoxysilane, methylhydrogendimethoxysilane and propyltrimethoxysilane, methylhydrogendimethoxysilane and propyltriethoxysilane, methylhydrogendimethoxysilane and butyltrimethoxysilane, methylhydrogendimethoxysilane and butyltriethoxysilane, methylhydrogendimethoxysilane and pentyltrimethoxysilane, methylhydrogendimethoxysilane and pentyltriethoxysilane, methylhydrogendimethoxysilane and heptyltrimethoxysilane, methylhydrogendimethoxysilane and heptyltriethoxysilane, methylhydrogendimethoxysilane and octyltrimethoxysilane, methylhydrogendimethoxysilane and octyltriethoxysilane, methylhydrogendimethoxysilane and dodecyltrimethoxysilane, methylhydrogendimethoxysilane and dodecyltriethoxysilane, methylhydrogendimethoxysilane and hexadecyltrimethoxysilane, methylhydrogendimethoxysilane and hexadecyltriethoxysilane, methylhydrogendimethoxysilane and octadecyltrimethoxysilane, methylhydrogendimethoxysilane and octadecyltriethoxysilane, methylhydrogendimethoxysilane and phenyltrimethoxysilane, methylhydrogendimethoxysilane and phenyltriethoxysilane, methylhydrogendimethoxysilane and vinyltrimethoxysilane, methylhydrogendimethoxysilane and vinyltriethoxysilane, methylhydrogendimethoxysilane and γ-aminopropyltrimethoxysilane, methylhydrogendimethoxysilane and γ-aminopropyltriethoxysilane, methylhydrogendimethoxysilane and γ-glycidoxypropyltrimethoxysilane, methylhydrogendimethoxysilane and γ-glycidoxypropyltriethoxysilane, methylhydrogendimethoxysilane and γ-methacryloxypropyltrimethoxysilane, methylhydrogendimethoxysilane and γ-methacryloxypropyltriethoxysilane, methylhydrogendimethoxysilane and triethoxy(4-(trifluoromethyl)phenyl)silane, methylhydrogendimethoxysilane and 3,3,3-trifluoropropyltrimethoxysilane, methylhydrogendimethoxysilane and (triethoxysilyl)cyclohexane, methylhydrogendimethoxysilane and perfluorooctylethyltriethoxysilane, methylhydrogendimethoxysilane and triethoxyfluorosilane, methylhydrogendimethoxysilane and tridecafluoro-1,1,2,2-tetrahydrooctyltriethoxysilane, methylhydrogendimethoxysilane and pentafluorophenylpropyltrimethoxysilane, methylhydrogendimethoxysilane and 3-(heptafluoroisopropoxy)propyltriethoxysilane, methylhydrogendimethoxysilane and heptadecafluoro-1,1,2,2-tetrahydrodecyltriethoxysilane, methylhydrogendimethoxysilane and triethoxy-2-thienylsilane, and methylhydrogendimethoxysilane and 3-(triethoxysilyl)furan;

(2) methylhydrogendiethoxysilane and methyltrimethoxysilane, methylhydrogendiethoxysilane and methyltriethoxysilane, methylhydrogendiethoxysilane and ethyltrimethoxysilane, methylhydrogendiethoxysilane and ethyltriethoxysilane, methylhydrogendiethoxysilane and propyltrimethoxysilane, methylhydrogendiethoxysilane and propyltriethoxysilane, methylhydrogendiethoxysilane and butyltrimethoxysilane, methylhydrogendiethoxysilane and butyltriethoxysilane, methylhydrogendiethoxysilane and pentyltrimethoxysilane, methylhydrogendiethoxysilane and pentyltriethoxysilane, methylhydrogendiethoxysilane and heptyltrimethoxysilane, methylhydrogendiethoxysilane and heptyltriethoxysilane, methylhydrogendiethoxysilane and octyltrimethoxysilane, methylhydrogendiethoxysilane and octyltriethoxysilane, methylhydrogendiethoxysilane and dodecyltrimethoxysilane, methylhydrogendiethoxysilane and dodecyltriethoxysilane, methylhydrogendiethoxysilane and hexadecyltrimethoxysilane, methylhydrogendiethoxysilane and hexadecyltriethoxysilane, methylhydrogendiethoxysilane and octadecyltrimethoxysilane, methylhydrogendiethoxysilane and octadecyltriethoxysilane, methylhydrogendiethoxysilane and phenyltrimethoxysilane, methylhydrogendiethoxysilane and phenyltriethoxysilane, methylhydrogendiethoxysilane and vinyltrimethoxysilane, methylhydrogendiethoxysilane and vinyltriethoxysilane, methylhydrogendiethoxysilane and γ-aminopropyltrimethoxysilane, methylhydrogendiethoxysilane and γ-aminopropyltriethoxysilane, methylhydrogendiethoxysilane and γ-glycidoxypropyltrimethoxysilane, methylhydrogendiethoxysilane and γ-glycidoxypropyltriethoxysilane, methylhydrogendiethoxysilane and γ-methacryloxypropyltrimethoxysilane, methylhydrogendiethoxysilane and γ-methacryloxypropyltriethoxysilane, methylhydrogendiethoxysilane and triethoxy(4-(trifluoromethyl)phenyl)silane, methylhydrogendiethoxysilane and 3,3,3-trifluoropropyltrimethoxysilane, methylhydrogendiethoxysilane and (triethoxysilyl)cyclohexane, methylhydrogendiethoxysilane and perfluorooctylethyltriethoxysilane, methylhydrogendiethoxysilane and triethoxyfluorosilane, methylhydrogendiethoxysilane and tridecafluoro-1,1,2,2-tetrahydrooctyltriethoxysilane, methylhydrogendiethoxysilane and pentafluorophenylpropyltrimethoxysilane, methylhydrogendiethoxysilane and 3-(heptafluoroisopropoxy)propyltriethoxysilane, methylhydrogendiethoxysilane and heptadecafluoro-1,1,2,2-tetrahydrodecyltriethoxysilane, methylhydrogendiethoxysilane and triethoxy-2-thienylsilane, and methylhydrogendiethoxysilane and 3-(triethoxysilyl)furan;

(3) dimethyldimethoxysilane and methyltrimethoxysilane, dimethyldimethoxysilane and methyltriethoxysilane, dimethyldimethoxysilane and ethyltrimethoxysilane, dimethyldimethoxysilane and ethyltriethoxysilane, dimethyldimethoxysilane and propyltrimethoxysilane, dimethyldimethoxysilane and propyltriethoxysilane, dimethyldimethoxysilane and butyltrimethoxysilane, dimethyldimethoxysilane and butyltriethoxysilane, dimethyldimethoxysilane and pentyltrimethoxysilane, dimethyldimethoxysilane and pentyltriethoxysilane, dimethyldimethoxysilane and heptyltrimethoxysilane, dimethyldimethoxysilane and heptyltriethoxysilane, dimethyldimethoxysilane and octyltrimethoxysilane, dimethyldimethoxysilane and octyltriethoxysilane, dimethyldimethoxysilane and dodecyltrimethoxysilane, dimethyldimethoxysilane and dodecyltriethoxysilane, dimethyldimethoxysilane and hexadecyltrimethoxysilane, dimethyldimethoxysilane and hexadecyltriethoxysilane, dimethyldimethoxysilane and octadecyltrimethoxysilane, dimethyldimethoxysilane and octadecyltriethoxysilane, dimethyldimethoxysilane and phenyltrimethoxysilane, dimethyldimethoxysilane and phenyltriethoxysilane, dimethyldimethoxysilane and vinyltrimethoxysilane, dimethyldimethoxysilane and vinyltriethoxysilane, dimethyldimethoxysilane and γ-aminopropyltrimethoxysilane, dimethyldimethoxysilane and γ-aminopropyltriethoxysilane, dimethyldimethoxysilane and γ-glycidoxypropyltrimethoxysilane, dimethyldimethoxysilane and γ-glycidoxypropyltriethoxysilane, dimethyldimethoxysilane and γ-methacryloxypropyltrimethoxysilane, dimethyldimethoxysilane and γ-methacryloxypropyltriethoxysilane, dimethyldimethoxysilane and triethoxy(4-(trifluoromethyl)phenyl)silane, dimethyldimethoxysilane and 3,3,3-trifluoropropyltrimethoxysilane, dimethyldimethoxysilane and (triethoxysilyl)cyclohexane, dimethyldimethoxysilane and perfluorooctylethyltriethoxysilane, dimethyldimethoxysilane and triethoxyfluorosilane, dimethyldimethoxysilane and tridecafluoro-1,1,2,2-tetrahydrooctyltriethoxysilane, dimethyldimethoxysilane and pentafluorophenylpropyltrimethoxysilane, dimethyldimethoxysilane and 3-(heptafluoroisopropoxy)propyltriethoxysilane, dimethyldimethoxysilane and heptadecafluoro-1,1,2,2-tetrahydrodecyltriethoxysilane, dimethyldimethoxysilane and triethoxy-2-thienylsilane, and dimethyldimethoxysilane and 3-(triethoxysilyl)furan;

(4) dimethyldiethoxysilane and methyltrimethoxysilane, dimethyldiethoxysilane and methyltriethoxysilane, dimethyldiethoxysilane and ethyltrimethoxysilane, dimethyldiethoxysilane and ethyltriethoxysilane, dimethyldiethoxysilane and propyltrimethoxysilane, dimethyldiethoxysilane and propyltriethoxysilane, dimethyldiethoxysilane and butyltrimethoxysilane, dimethyldiethoxysilane and butyltriethoxysilane, dimethyldiethoxysilane and pentyltrimethoxysilane, dimethyldiethoxysilane and pentyltriethoxysilane, dimethyldiethoxysilane and heptyltrimethoxysilane, dimethyldiethoxysilane and heptyltriethoxysilane, dimethyldiethoxysilane and octyltrimethoxysilane, dimethyldiethoxysilane and octyltriethoxysilane, dimethyldiethoxysilane and dodecyltrimethoxysilane, dimethyldiethoxysilane and dodecyltriethoxysilane, dimethyldiethoxysilane and hexadecyltrimethoxysilane, dimethyldiethoxysilane and hexadecyltriethoxysilane, dimethyldiethoxysilane and octadecyltrimethoxysilane, dimethyldiethoxysilane and octadecyltriethoxysilane, dimethyldiethoxysilane and phenyltrimethoxysilane, dimethyldiethoxysilane and phenyltriethoxysilane, dimethyldiethoxysilane and vinyltrimethoxysilane, dimethyldiethoxysilane and vinyltriethoxysilane, dimethyldiethoxysilane and γ-aminopropyltrimethoxysilane, dimethyldiethoxysilane and γ-aminopropyltriethoxysilane, dimethyldiethoxysilane and γ-glycidoxypropyltrimethoxysilane, dimethyldiethoxysilane and γ-glycidoxypropyltriethoxysilane, dimethyldiethoxysilane and γ-methacryloxypropyltrimethoxysilane, dimethyldiethoxysilane and γ-methacryloxypropyltriethoxysilane, dimethyldiethoxysilane and triethoxy(4-(trifluoromethyl)phenyl)silane, dimethyldiethoxysilane and 3,3,3-trifluoropropyltrimethoxysilane, dimethyldiethoxysilane and (triethoxysilyl)cyclohexane, dimethyldiethoxysilane and perfluorooctylethyltriethoxysilane, dimethyldiethoxysilane and triethoxyfluorosilane, dimethyldiethoxysilane and tridecafluoro-1,1,2,2-tetrahydrooctyltriethoxysilane, dimethyldiethoxysilane and pentafluorophenylpropyltrimethoxysilane, dimethyldiethoxysilane and 3-(heptafluoroisopropoxy)propyltriethoxysilane, dimethyldiethoxysilane and heptadecafluoro-1,1,2,2-tetrahydrodecyltriethoxysilane, dimethyldiethoxysilane and triethoxy-2-thienylsilane, and dimethyldiethoxysilane and 3-(triethoxysilyl)furan;

(5) methylethyldimethoxysilane and methyltrimethoxysilane, methylethyldimethoxysilane and methyltriethoxysilane, methylethyldimethoxysilane and ethyltrimethoxysilane, methylethyldimethoxysilane and ethyltriethoxysilane, methylethyldimethoxysilane and propyltrimethoxysilane, methylethyldimethoxysilane and propyltriethoxysilane, methylethyldimethoxysilane and butyltrimethoxysilane, methylethyldimethoxysilane and butyltriethoxysilane, methylethyldimethoxysilane and pentyltrimethoxysilane, methylethyldimethoxysilane and pentyltriethoxysilane, methylethyldimethoxysilane and heptyltrimethoxysilane, methylethyldimethoxysilane and heptyltriethoxysilane, methylethyldimethoxysilane and octyltrimethoxysilane, methylethyldimethoxysilane and octyltriethoxysilane, methylethyldimethoxysilane and dodecyltrimethoxysilane, methylethyldimethoxysilane and dodecyltriethoxysilane, methylethyldimethoxysilane and hexadecyltrimethoxysilane, methylethyldimethoxysilane and hexadecyltriethoxysilane, methylethyldimethoxysilane and octadecyltrimethoxysilane, methylethyldimethoxysilane and octadecyltriethoxysilane, methylethyldimethoxysilane and phenyltrimethoxysilane, methylethyldimethoxysilane and phenyltriethoxysilane, methylethyldimethoxysilane and vinyltrimethoxysilane, methylethyldimethoxysilane and vinyltriethoxysilane, methylethyldimethoxysilane and γ-aminopropyltrimethoxysilane, methylethyldimethoxysilane and γ-aminopropyltriethoxysilane, methylethyldimethoxysilane and γ-glycidoxypropyltrimethoxysilane, methylethyldimethoxysilane and γ-glycidoxypropyltriethoxysilane, methylethyldimethoxysilane and γ-methacryloxypropyltrimethoxysilane, methylethyldimethoxysilane and γ-methacryloxypropyltriethoxysilane, methylethyldimethoxysilane and triethoxy(4-(trifluoromethyl)phenyl)silane, methylethyldimethoxysilane and 3,3,3-trifluoropropyltrimethoxysilane, methylethyldimethoxysilane and (triethoxysilyl)cyclohexane, methylethyldimethoxysilane and perfluorooctylethyltriethoxysilane, methylethyldimethoxysilane and triethoxyfluorosilane, methylethyldimethoxysilane and tridecafluoro-1,1,2,2-tetrahydrooctyltriethoxysilane, methylethyldimethoxysilane and pentafluorophenylpropyltrimethoxysilane, methylethyldimethoxysilane and 3-(heptafluoroisopropoxy)propyltriethoxysilane, methylethyldimethoxysilane and heptadecafluoro-1,1,2,2-tetrahydrodecyltriethoxysilane, methylethyldimethoxysilane and triethoxy-2-thienylsilane, and methylethyldimethoxysilane and 3-(triethoxysilyl)furan;

(6) diethyldimethoxysilane and methyltrimethoxysilane, diethyldimethoxysilane and methyltriethoxysilane, diethyldimethoxysilane and ethyltrimethoxysilane, diethyldimethoxysilane and ethyltriethoxysilane, diethyldimethoxysilane and propyltrimethoxysilane, diethyldimethoxysilane and propyltriethoxysilane, diethyldimethoxysilane and butyltrimethoxysilane, diethyldimethoxysilane and butyltriethoxysilane, diethyldimethoxysilane and pentyltrimethoxysilane, diethyldimethoxysilane and pentyltriethoxysilane, diethyldimethoxysilane and heptyltrimethoxysilane, diethyldimethoxysilane and heptyltriethoxysilane, diethyldimethoxysilane and octyltrimethoxysilane, diethyldimethoxysilane and octyltriethoxysilane, diethyldimethoxysilane and dodecyltrimethoxysilane, diethyldimethoxysilane and dodecyltriethoxysilane, diethyldimethoxysilane and hexadecyltrimethoxysilane, diethyldimethoxysilane and hexadecyltriethoxysilane, diethyldimethoxysilane and octadecyltrimethoxysilane, diethyldimethoxysilane and octadecyltriethoxysilane, diethyldimethoxysilane and phenyltrimethoxysilane, diethyldimethoxysilane and phenyltriethoxysilane, diethyldimethoxysilane and vinyltrimethoxysilane, diethyldimethoxysilane and vinyltriethoxysilane, diethyldimethoxysilane and γ-aminopropyltrimethoxysilane, diethyldimethoxysilane and γ-aminopropyltriethoxysilane, diethyldimethoxysilane and γ-glycidoxypropyltrimethoxysilane, diethyldimethoxysilane and γ-glycidoxypropyltriethoxysilane, diethyldimethoxysilane and γ-methacryloxypropyltrimethoxysilane, diethyldimethoxysilane and γ-methacryloxypropyltriethoxysilane, diethyldimethoxysilane and triethoxy(4-(trifluoromethyl)phenyl)silane, diethyldimethoxysilane and 3,3,3-trifluoropropyltrimethoxysilane, diethyldimethoxysilane and (triethoxysilyl)cyclohexane, diethyldimethoxysilane and perfluorooctylethyltriethoxysilane, diethyldimethoxysilane and triethoxyfluorosilane, diethyldimethoxysilane and tridecafluoro-1,1,2,2-tetrahydrooctyltriethoxysilane, diethyldimethoxysilane and pentafluorophenylpropyltrimethoxysilane, diethyldimethoxysilane and 3-(heptafluoroisopropoxy)propyltriethoxysilane, diethyldimethoxysilane and heptadecafluoro-1,1,2,2-tetrahydrodecyltriethoxysilane, diethyldimethoxysilane and triethoxy-2-thienylsilane, and diethyldimethoxysilane and 3-(triethoxysilyl)furan;

(7) diethyldiethoxysilane and methyltrimethoxysilane, diethyldiethoxysilane and methyltriethoxysilane, diethyldiethoxysilane and ethyltrimethoxysilane, diethyldiethoxysilane and ethyltriethoxysilane, diethyldiethoxysilane and propyltrimethoxysilane, diethyldiethoxysilane and propyltriethoxysilane, diethyldiethoxysilane and butyltrimethoxysilane, diethyldiethoxysilane and butyltriethoxysilane, diethyldiethoxysilane and pentyltrimethoxysilane, diethyldiethoxysilane and pentyltriethoxysilane, diethyldiethoxysilane and heptyltrimethoxysilane, diethyldiethoxysilane and heptyltriethoxysilane, diethyldiethoxysilane and octyltrimethoxysilane, diethyldiethoxysilane and octyltriethoxysilane, diethyldiethoxysilane and dodecyltrimethoxysilane, diethyldiethoxysilane and dodecyltriethoxysilane, diethyldiethoxysilane and hexadecyltrimethoxysilane, diethyldiethoxysilane and hexadecyltriethoxysilane, diethyldiethoxysilane and octadecyltrimethoxysilane, diethyldiethoxysilane and octadecyltriethoxysilane, diethyldiethoxysilane and phenyltrimethoxysilane, diethyldiethoxysilane and phenyltriethoxysilane, diethyldiethoxysilane and vinyltrimethoxysilane, diethyldiethoxysilane and vinyltriethoxysilane, diethyldiethoxysilane and γ-aminopropyltrimethoxysilane, diethyldiethoxysilane and γ-aminopropyltriethoxysilane, diethyldiethoxysilane and γ-glycidoxypropyltrimethoxysilane, diethyldiethoxysilane and γ-glycidoxypropyltriethoxysilane, diethyldiethoxysilane and γ-methacryloxypropyltrimethoxysilane, diethyldiethoxysilane and γ-methacryloxypropyltriethoxysilane, diethyldiethoxysilane and triethoxy(4-(trifluoromethyl)phenyl)silane, diethyldiethoxysilane and 3,3,3-trifluoropropyltrimethoxysilane, diethyldiethoxysilane and (triethoxysilyl)cyclohexane, diethyldiethoxysilane and perfluorooctylethyltriethoxysilane, diethyldiethoxysilane and triethoxyfluorosilane, diethyldiethoxysilane and tridecafluoro-1,1,2,2-tetrahydrooctyltriethoxysilane, diethyldiethoxysilane and pentafluorophenylpropyltrimethoxysilane, diethyldiethoxysilane and 3-(heptafluoroisopropoxy)propyltriethoxysilane, diethyldiethoxysilane and heptadecafluoro-1,1,2,2-tetrahydrodecyltriethoxysilane, diethyldiethoxysilane and triethoxy-2-thienylsilane, and diethyldiethoxysilane and 3-(triethoxysilyl)furan;

(8) methylpropyldimethoxysilane and methyltrimethoxysilane, methylpropyldimethoxysilane and methyltriethoxysilane, methylpropyldimethoxysilane and ethyltrimethoxysilane, methylpropyldimethoxysilane and ethyltriethoxysilane, methylpropyldimethoxysilane and propyltrimethoxysilane, methylpropyldimethoxysilane and propyltriethoxysilane, methylpropyldimethoxysilane and butyltrimethoxysilane, methylpropyldimethoxysilane and butyltriethoxysilane, methylpropyldimethoxysilane and pentyltrimethoxysilane, methylpropyldimethoxysilane and pentyltriethoxysilane, methylpropyldimethoxysilane and heptyltrimethoxysilane, methylpropyldimethoxysilane and heptyltriethoxysilane, methylpropyldimethoxysilane and octyltrimethoxysilane, methylpropyldimethoxysilane and octyltriethoxysilane, methylpropyldimethoxysilane and dodecyltrimethoxysilane, methylpropyldimethoxysilane and dodecyltriethoxysilane, methylpropyldimethoxysilane and hexadecyltrimethoxysilane, methylpropyldimethoxysilane and hexadecyltriethoxysilane, methylpropyldimethoxysilane and octadecyltrimethoxysilane, methylpropyldimethoxysilane and octadecyltriethoxysilane, methylpropyldimethoxysilane and phenyltrimethoxysilane, methylpropyldimethoxysilane and phenyltriethoxysilane, methylpropyldimethoxysilane and vinyltrimethoxysilane, methylpropyldimethoxysilane and vinyltriethoxysilane, methylpropyldimethoxysilane and γ-aminopropyltrimethoxysilane, methylpropyldimethoxysilane and γ-aminopropyltriethoxysilane, methylpropyldimethoxysilane and γ-glycidoxypropyltrimethoxysilane, methylpropyldimethoxysilane and γ-glycidoxypropyltriethoxysilane, methylpropyldimethoxysilane and γ-methacryloxypropyltrimethoxysilane, methylpropyldimethoxysilane and γ-methacryloxypropyltriethoxysilane, methylpropyldimethoxysilane and triethoxy(4-(trifluoromethyl)phenyl)silane, methylpropyldimethoxysilane and 3,3,3-trifluoropropyltrimethoxysilane, methylpropyldimethoxysilane and (triethoxysilyl)cyclohexane, methylpropyldimethoxysilane and perfluorooctylethyltriethoxysilane, methylpropyldimethoxysilane and triethoxyfluorosilane, methylpropyldimethoxysilane and tridecafluoro-1,1,2,2-tetrahydrooctyltriethoxysilane, methylpropyldimethoxysilane and pentafluorophenylpropyltrimethoxysilane, methylpropyldimethoxysilane and 3-(heptafluoroisopropoxy)propyltriethoxysilane, methylpropyldimethoxysilane and heptadecafluoro-1,1,2,2-tetrahydrodecyltriethoxysilane, methylpropyldimethoxysilane and triethoxy-2-thienylsilane, and methylpropyldimethoxysilane and 3-(triethoxysilyl)furan;

(9) methylpropyldiethoxysilane and methyltrimethoxysilane, methylpropyldiethoxysilane and methyltriethoxysilane, methylpropyldiethoxysilane and ethyltrimethoxysilane, methylpropyldiethoxysilane and ethyltriethoxysilane, methylpropyldiethoxysilane and propyltrimethoxysilane, methylpropyldiethoxysilane and propyltriethoxysilane, methylpropyldiethoxysilane and butyltrimethoxysilane, methylpropyldiethoxysilane and butyltriethoxysilane, methylpropyldiethoxysilane and pentyltrimethoxysilane, methylpropyldiethoxysilane and pentyltriethoxysilane, methylpropyldiethoxysilane and heptyltrimethoxysilane, methylpropyldiethoxysilane and heptyltriethoxysilane, methylpropyldiethoxysilane and octyltrimethoxysilane, methylpropyldiethoxysilane and octyltriethoxysilane, methylpropyldiethoxysilane and dodecyltrimethoxysilane, methylpropyldiethoxysilane and dodecyltriethoxysilane, methylpropyldiethoxysilane and hexadecyltrimethoxysilane, methylpropyldiethoxysilane and hexadecyltriethoxysilane, methylpropyldiethoxysilane and octadecyltrimethoxysilane, methylpropyldiethoxysilane and octadecyltriethoxysilane, methylpropyldiethoxysilane and phenyltrimethoxysilane, methylpropyldiethoxysilane and phenyltriethoxysilane, methylpropyldiethoxysilane and vinyltrimethoxysilane, methylpropyldiethoxysilane and vinyltriethoxysilane, methylpropyldiethoxysilane and γ-aminopropyltrimethoxysilane, methylpropyldiethoxysilane and γ-aminopropyltriethoxysilane, methylpropyldiethoxysilane and γ-glycidoxypropyltrimethoxysilane, methylpropyldiethoxysilane and γ-glycidoxypropyltriethoxysilane, methylpropyldiethoxysilane and γ-methacryloxypropyltrimethoxysilane, methylpropyldiethoxysilane and γ-methacryloxypropyltriethoxysilane, methylpropyldiethoxysilane and triethoxy(4-(trifluoromethyl)phenyl)silane, methylpropyldiethoxysilane and 3,3,3-trifluoropropyltrimethoxysilane, methylpropyldiethoxysilane and (triethoxysilyl)cyclohexane, methylpropyldiethoxysilane and perfluorooctylethyltriethoxysilane, methylpropyldiethoxysilane and triethoxyfluorosilane, methylpropyldiethoxysilane and tridecafluoro-1,1,2,2-tetrahydrooctyltriethoxysilane, methylpropyldiethoxysilane and pentafluorophenylpropyltrimethoxysilane, methylpropyldiethoxysilane and 3-(heptafluoroisopropoxy)propyltriethoxysilane, methylpropyldiethoxysilane and heptadecafluoro-1,1,2,2-tetrahydrodecyltriethoxysilane, methylpropyldiethoxysilane and triethoxy-2-thienylsilane, and methylpropyldiethoxysilane and 3-(triethoxysilyl)furan;

(10) diisopropyldimethoxysilane and methyltrimethoxysilane, diisopropyldimethoxysilane and methyltriethoxysilane, diisopropyldimethoxysilane and ethyltrimethoxysilane, diisopropyldimethoxysilane and ethyltriethoxysilane, diisopropyldimethoxysilane and propyltrimethoxysilane, diisopropyldimethoxysilane and propyltriethoxysilane, diisopropyldimethoxysilane and butyltrimethoxysilane, diisopropyldimethoxysilane and butyltriethoxysilane, diisopropyldimethoxysilane and pentyltrimethoxysilane, diisopropyldimethoxysilane and pentyltriethoxysilane, diisopropyldimethoxysilane and heptyltrimethoxysilane, diisopropyldimethoxysilane and heptyltriethoxysilane, diisopropyldimethoxysilane and octyltrimethoxysilane, diisopropyldimethoxysilane and octyltriethoxysilane, diisopropyldimethoxysilane and dodecyltrimethoxysilane, diisopropyldimethoxysilane and dodecyltriethoxysilane, diisopropyldimethoxysilane and hexadecyltrimethoxysilane, diisopropyldimethoxysilane and hexadecyltriethoxysilane, diisopropyldimethoxysilane and octadecyltrimethoxysilane, diisopropyldimethoxysilane and octadecyltriethoxysilane, diisopropyldimethoxysilane and phenyltrimethoxysilane, diisopropyldimethoxysilane and phenyltriethoxysilane, diisopropyldimethoxysilane and vinyltrimethoxysilane, diisopropyldimethoxysilane and vinyltriethoxysilane, diisopropyldimethoxysilane and γ-aminopropyltrimethoxysilane, diisopropyldimethoxysilane and γ-aminopropyltriethoxysilane, diisopropyldimethoxysilane and γ-glycidoxypropyltrimethoxysilane, diisopropyldimethoxysilane and γ-glycidoxypropyltriethoxysilane, diisopropyldimethoxysilane and γ-methacryloxypropyltrimethoxysilane, diisopropyldimethoxysilane and γ-methacryloxypropyltriethoxysilane, diisopropyldimethoxysilane and triethoxy(4-(trifluoromethyl)phenyl)silane, diisopropyldimethoxysilane and 3,3,3-trifluoropropyltrimethoxysilane, diisopropyldimethoxysilane and (triethoxysilyl)cyclohexane, diisopropyldimethoxysilane and perfluorooctylethyltriethoxysilane, diisopropyldimethoxysilane and triethoxyfluorosilane, diisopropyldimethoxysilane and tridecafluoro-1,1,2,2-tetrahydrooctyltriethoxysilane, diisopropyldimethoxysilane and pentafluorophenylpropyltrimethoxysilane, diisopropyldimethoxysilane and 3-(heptafluoroisopropoxy)propyltriethoxysilane, diisopropyldimethoxysilane and heptadecafluoro-1,1,2,2-tetrahydrodecyltriethoxysilane, diisopropyldimethoxysilane and triethoxy-2-thienylsilane, and diisopropyldimethoxysilane and 3-(triethoxysilyl)furan;

(11) phenylmethyldimethoxysilane and methyltrimethoxysilane, phenylmethyldimethoxysilane and methyltriethoxysilane, phenylmethyldimethoxysilane and ethyltrimethoxysilane, phenylmethyldimethoxysilane and ethyltriethoxysilane, phenylmethyldimethoxysilane and propyltrimethoxysilane, phenylmethyldimethoxysilane and propyltriethoxysilane, phenylmethyldimethoxysilane and butyltrimethoxysilane, phenylmethyldimethoxysilane and butyltriethoxysilane, phenylmethyldimethoxysilane and pentyltrimethoxysilane, phenylmethyldimethoxysilane and pentyltriethoxysilane, phenylmethyldimethoxysilane and heptyltrimethoxysilane, phenylmethyldimethoxysilane and heptyltriethoxysilane, phenylmethyldimethoxysilane and octyltrimethoxysilane, phenylmethyldimethoxysilane and octyltriethoxysilane, phenylmethyldimethoxysilane and dodecyltrimethoxysilane, phenylmethyldimethoxysilane and dodecyltriethoxysilane, phenylmethyldimethoxysilane and hexadecyltrimethoxysilane, phenylmethyldimethoxysilane and hexadecyltriethoxysilane, phenylmethyldimethoxysilane and octadecyltrimethoxysilane, phenylmethyldimethoxysilane and octadecyltriethoxysilane, phenylmethyldimethoxysilane and phenyltrimethoxysilane, phenylmethyldimethoxysilane and phenyltriethoxysilane, phenylmethyldimethoxysilane and vinyltrimethoxysilane, phenylmethyldimethoxysilane and vinyltriethoxysilane, phenylmethyldimethoxysilane and γ-aminopropyltrimethoxysilane, phenylmethyldimethoxysilane and γ-aminopropyltriethoxysilane, phenylmethyldimethoxysilane and γ-glycidoxypropyltrimethoxysilane, phenylmethyldimethoxysilane and γ-glycidoxypropyltriethoxysilane, phenylmethyldimethoxysilane and γ-methacryloxypropyltrimethoxysilane, phenylmethyldimethoxysilane and γ-methacryloxypropyltriethoxysilane, phenylmethyldimethoxysilane and triethoxy(4-(trifluoromethyl)phenyl)silane, phenylmethyldimethoxysilane and 3,3,3-trifluoropropyltrimethoxysilane, phenylmethyldimethoxysilane and (triethoxysilyl)cyclohexane, phenylmethyldimethoxysilane and perfluorooctylethyltriethoxysilane, phenylmethyldimethoxysilane and triethoxyfluorosilane, phenylmethyldimethoxysilane and tridecafluoro-1,1,2,2-tetrahydrooctyltriethoxysilane, phenylmethyldimethoxysilane and pentafluorophenylpropyltrimethoxysilane, phenylmethyldimethoxysilane and 3-(heptafluoroisopropoxy)propyltriethoxysilane, phenylmethyldimethoxysilane and heptadecafluoro-1,1,2,2-tetrahydrodecyltriethoxysilane, phenylmethyldimethoxysilane and triethoxy-2-thienylsilane, and phenylmethyldimethoxysilane and 3-(triethoxysilyl)furan;

(12) vinylmethyldimethoxysilane and methyltrimethoxysilane, vinylmethyldimethoxysilane and methyltriethoxysilane, vinylmethyldimethoxysilane and ethyltrimethoxysilane, vinylmethyldimethoxysilane and ethyltriethoxysilane, vinylmethyldimethoxysilane and propyltrimethoxysilane, vinylmethyldimethoxysilane and propyltriethoxysilane, vinylmethyldimethoxysilane and butyltrimethoxysilane, vinylmethyldimethoxysilane and butyltriethoxysilane, vinylmethyldimethoxysilane and pentyltrimethoxysilane, vinylmethyldimethoxysilane and pentyltriethoxysilane, vinylmethyldimethoxysilane and heptyltrimethoxysilane, vinylmethyldimethoxysilane and heptyltriethoxysilane, vinylmethyldimethoxysilane and octyltrimethoxysilane, vinylmethyldimethoxysilane and octyltriethoxysilane, vinylmethyldimethoxysilane and dodecyltrimethoxysilane, vinylmethyldimethoxysilane and dodecyltriethoxysilane, vinylmethyldimethoxysilane and hexadecyltrimethoxysilane, vinylmethyldimethoxysilane and hexadecyltriethoxysilane, vinylmethyldimethoxysilane and octadecyltrimethoxysilane, vinylmethyldimethoxysilane and octadecyltriethoxysilane, vinylmethyldimethoxysilane and phenyltrimethoxysilane, vinylmethyldimethoxysilane and phenyltriethoxysilane, vinylmethyldimethoxysilane and vinyltrimethoxysilane, vinylmethyldimethoxysilane and vinyltriethoxysilane, vinylmethyldimethoxysilane and γ-aminopropyltrimethoxysilane, vinylmethyldimethoxysilane and γ-aminopropyltriethoxysilane, vinylmethyldimethoxysilane and γ-glycidoxypropyltrimethoxysilane, vinylmethyldimethoxysilane and γ-glycidoxypropyltriethoxysilane, vinylmethyldimethoxysilane and γ-methacryloxypropyltrimethoxysilane, vinylmethyldimethoxysilane and γ-methacryloxypropyltriethoxysilane, vinylmethyldimethoxysilane and triethoxy(4-(trifluoromethyl)phenyl)silane, vinylmethyldimethoxysilane and 3,3,3-trifluoropropyltrimethoxysilane, vinylmethyldimethoxysilane and (triethoxysilyl)cyclohexane, vinylmethyldimethoxysilane and perfluorooctylethyltriethoxysilane, vinylmethyldimethoxysilane and triethoxyfluorosilane, vinylmethyldimethoxysilane and tridecafluoro-1,1,2,2-tetrahydrooctyltriethoxysilane, vinylmethyldimethoxysilane and pentafluorophenylpropyltrimethoxysilane, vinylmethyldimethoxysilane and 3-(heptafluoroisopropoxy)propyltriethoxysilane, vinylmethyldimethoxysilane and heptadecafluoro-1,1,2,2-tetrahydrodecyltriethoxysilane, vinylmethyldimethoxysilane and triethoxy-2-thienylsilane, and vinylmethyldimethoxysilane and 3-(triethoxysilyl)furan;

(13) γ-glycidoxypropylmethyldimethoxysilane and methyltrimethoxysilane, γ-glycidoxypropylmethyldimethoxysilane and methyltriethoxysilane, γ-glycidoxypropylmethyldimethoxysilane and ethyltrimethoxysilane, γ-glycidoxypropylmethyldimethoxysilane and ethyltriethoxysilane, γ-glycidoxypropylmethyldimethoxysilane and propyltrimethoxysilane, γ-glycidoxypropylmethyldimethoxysilane and propyltriethoxysilane, γ-glycidoxypropylmethyldimethoxysilane and butyltrimethoxysilane, γ-glycidoxypropylmethyldimethoxysilane and butyltriethoxysilane, γ-glycidoxypropylmethyldimethoxysilane and pentyltrimethoxysilane, γ-glycidoxypropylmethyldimethoxysilane and pentyltriethoxysilane, γ-glycidoxypropylmethyldimethoxysilane and heptyltrimethoxysilane, γ-glycidoxypropylmethyldimethoxysilane and heptyltriethoxysilane, γ-glycidoxypropylmethyldimethoxysilane and octyltrimethoxysilane, γ-glycidoxypropylmethyldimethoxysilane and octyltriethoxysilane, γ-glycidoxypropylmethyldimethoxysilane and dodecyltrimethoxysilane, γ-glycidoxypropylmethyldimethoxysilane and dodecyltriethoxysilane, γ-glycidoxypropylmethyldimethoxysilane and hexadecyltrimethoxysilane, γ-glycidoxypropylmethyldimethoxysilane and hexadecyltriethoxysilane, γ-glycidoxypropylmethyldimethoxysilane and octadecyltrimethoxysilane, γ-glycidoxypropylmethyldimethoxysilane and octadecyltriethoxysilane, γ-glycidoxypropylmethyldimethoxysilane and phenyltrimethoxysilane, γ-glycidoxypropylmethyldimethoxysilane and phenyltriethoxysilane, γ-glycidoxypropylmethyldimethoxysilane and vinyltrimethoxysilane, γ-glycidoxypropylmethyldimethoxysilane and vinyltriethoxysilane, γ-glycidoxypropylmethyldimethoxysilane and γ-aminopropyltrimethoxysilane, γ-glycidoxypropylmethyldimethoxysilane and γ-aminopropyltriethoxysilane, γ-glycidoxypropylmethyldimethoxysilane and γ-glycidoxypropyltrimethoxysilane, γ-glycidoxypropylmethyldimethoxysilane and γ-glycidoxypropyltriethoxysilane, γ-glycidoxypropylmethyldimethoxysilane and γ-methacryloxypropyltrimethoxysilane, γ-glycidoxypropylmethyldimethoxysilane and γ-methacryloxypropyltriethoxysilane, γ-glycidoxypropylmethyldimethoxysilane and triethoxy(4-(trifluoromethyl)phenyl)silane, γ-glycidoxypropylmethyldimethoxysilane and 3,3,3-trifluoropropyltrimethoxysilane, γ-glycidoxypropylmethyldimethoxysilane and (triethoxysilyl)cyclohexane, γ-glycidoxypropylmethyldimethoxysilane and perfluorooctylethyltriethoxysilane, γ-glycidoxypropylmethyldimethoxysilane and triethoxyfluorosilane, γ-glycidoxypropylmethyldimethoxysilane and tridecafluoro-1,1,2,2-tetrahydrooctyltriethoxysilane, γ-glycidoxypropylmethyldimethoxysilane and pentafluorophenylpropyltrimethoxysilane, γ-glycidoxypropylmethyldimethoxysilane and 3-(heptafluoroisopropoxy)propyltriethoxysilane, γ-glycidoxypropylmethyldimethoxysilane and heptadecafluoro-1,1,2,2-tetrahydrodecyltriethoxysilane, γ-glycidoxypropylmethyldimethoxysilane and triethoxy-2-thienylsilane, and γ-glycidoxypropylmethyldimethoxysilane and 3-(triethoxysilyl)furan;

(14) γ-glycidoxypropylmethyldiethoxysilane and methyltrimethoxysilane, γ-glycidoxypropylmethyldiethoxysilane and methyltriethoxysilane, γ-glycidoxypropylmethyldiethoxysilane and ethyltrimethoxysilane, γ-glycidoxypropylmethyldiethoxysilane and ethyltriethoxysilane, γ-glycidoxypropylmethyldiethoxysilane and propyltrimethoxysilane, γ-glycidoxypropylmethyldiethoxysilane and propyltriethoxysilane, γ-glycidoxypropylmethyldiethoxysilane and butyltrimethoxysilane, γ-glycidoxypropylmethyldiethoxysilane and butyltriethoxysilane, γ-glycidoxypropylmethyldiethoxysilane and pentyltrimethoxysilane, γ-glycidoxypropylmethyldiethoxysilane and pentyltriethoxysilane, γ-glycidoxypropylmethyldiethoxysilane and heptyltrimethoxysilane, γ-glycidoxypropylmethyldiethoxysilane and heptyltriethoxysilane, γ-glycidoxypropylmethyldiethoxysilane and octyltrimethoxysilane, γ-glycidoxypropylmethyldiethoxysilane and octyltriethoxysilane, γ-glycidoxypropylmethyldiethoxysilane and dodecyltrimethoxysilane, γ-glycidoxypropylmethyldiethoxysilane and dodecyltriethoxysilane, γ-glycidoxypropylmethyldiethoxysilane and hexadecyltrimethoxysilane, γ-glycidoxypropylmethyldiethoxysilane and hexadecyltriethoxysilane, γ-glycidoxypropylmethyldiethoxysilane and octadecyltrimethoxysilane, γ-glycidoxypropylmethyldiethoxysilane and octadecyltriethoxysilane, γ-glycidoxypropylmethyldiethoxysilane and phenyltrimethoxysilane, γ-glycidoxypropylmethyldiethoxysilane and phenyltriethoxysilane, γ-glycidoxypropylmethyldiethoxysilane and vinyltrimethoxysilane, γ-glycidoxypropylmethyldiethoxysilane and vinyltriethoxysilane γ-glycidoxypropylmethyldiethoxysilane and γ-aminopropyltrimethoxysilane γ-glycidoxypropylmethyldiethoxysilane and γ-aminopropyltriethoxysilane, γ-glycidoxypropylmethyldiethoxysilane and γ-glycidoxypropyltrimethoxysilane, γ-glycidoxypropylmethyldiethoxysilane, and γ-glycidoxypropyltriethoxysilane, γ-glycidoxypropylmethyldiethoxysilane and γ-methacryloxypropyltrimethoxysilane, γ-glycidoxypropylmethyldiethoxysilane and γ-methacryloxypropyltriethoxysilane, γ-glycidoxypropylmethyldiethoxysilane and triethoxy(4-(trifluoromethyl)phenyl)silane, γ-glycidoxypropylmethyldiethoxysilane and 3,3,3-trifluoropropyltrimethoxysilane, γ-glycidoxypropylmethyldiethoxysilane and (triethoxysilyl)cyclohexane, γ-glycidoxypropylmethyldiethoxysilane and perfluorooctylethyltriethoxysilane, γ-glycidoxypropylmethyldiethoxysilane and triethoxyfluorosilane, γ-glycidoxypropylmethyldiethoxysilane and tridecafluoro-1,1,2,2-tetrahydrooctyltriethoxysilane, γ-glycidoxypropylmethyldiethoxysilane and pentafluorophenylpropyltrimethoxysilane, γ-glycidoxypropylmethyldiethoxysilane and 3-(heptafluoroisopropoxy)propyltriethoxysilane, γ-glycidoxypropylmethyldiethoxysilane and heptadecafluoro-1,1,2,2-tetrahydrodecyltriethoxysilane, γ-glycidoxypropylmethyldiethoxysilane and triethoxy-2-thienylsilane, and γ-glycidoxypropylmethyldiethoxysilane and 3-(triethoxysilyl)furan;

(15) β-(3,4-epoxycyclohexyl)ethylmethyldimethoxysilane and methyltrimethoxysilane, β-(3,4-epoxycyclohexyl)ethylmethyldimethoxysilane and methyltriethoxysilane, β-(3,4-epoxycyclohexyl)ethylmethyldimethoxysilane and ethyltrimethoxysilane, β-(3,4-epoxycyclohexyl)ethylmethyldimethoxysilane and ethyltriethoxysilane, β-(3,4-epoxycyclohexyl)ethylmethyldimethoxysilane and propyltrimethoxysilane, β-(3,4-epoxycyclohexyl)ethylmethyldimethoxysilane and propyltriethoxysilane, β-(3,4-epoxycyclohexyl)ethylmethyldimethoxysilane and butyltrimethoxysilane, β-(3,4-epoxycyclohexyl)ethylmethyldimethoxysilane and butyltriethoxysilane, β-(3,4-epoxycyclohexyl)ethylmethyldimethoxysilane and pentyltrimethoxysilane, β-(3,4-epoxycyclohexyl)ethylmethyldimethoxysilane and pentyltriethoxysilane, β-(3,4-epoxycyclohexyl)ethylmethyldimethoxysilane and heptyltrimethoxysilane, β-(3,4-epoxycyclohexyl)ethylmethyldimethoxysilane and heptyltriethoxysilane, β-(3,4-epoxycyclohexyl)ethylmethyldimethoxysilane and octyltrimethoxysilane, β-(3,4-epoxycyclohexyl)ethylmethyldimethoxysilane and octyltriethoxysilane, β-(3,4-epoxycyclohexyl)ethylmethyldimethoxysilane and dodecyltrimethoxysilane, β-(3,4-epoxycyclohexyl)ethylmethyldimethoxysilane and dodecyltriethoxysilane, β-(3,4-epoxycyclohexyl)ethylmethyldimethoxysilane and hexadecyltrimethoxysilane, β-(3,4-epoxycyclohexyl)ethylmethyldimethoxysilane and hexadecyltriethoxysilane, β-(3,4-epoxycyclohexyl)ethylmethyldimethoxysilane and octadecyltrimethoxysilane, β-(3,4-epoxycyclohexyl)ethylmethyldimethoxysilane and octadecyltriethoxysilane, β-(3,4-epoxycyclohexyl)ethylmethyldimethoxysilane and phenyltrimethoxysilane, β-(3,4-epoxycyclohexyl)ethylmethyldimethoxysilane and phenyltriethoxysilane, β-(3,4-epoxycyclohexyl)ethylmethyldimethoxysilane and vinyltrimethoxysilane, β-(3,4-epoxycyclohexyl)ethylmethyldimethoxysilane and vinyltriethoxysilane, β-(3,4-epoxycyclohexyl)ethylmethyldimethoxysilane and γ-aminopropyltrimethoxysilane, β-(3,4-epoxycyclohexyl)ethylmethyldimethoxysilane and γ-aminopropyltriethoxysilane, β-(3,4-epoxycyclohexyl)ethylmethyldimethoxysilane and γ-glycidoxypropyltrimethoxysilane, β-(3,4-epoxycyclohexyl)ethylmethyldimethoxysilane and γ-glycidoxypropyltriethoxysilane, β-(3,4-epoxycyclohexyl)ethylmethyldimethoxysilane and γ-methacryloxypropyltrimethoxysilane, β-(3,4-epoxycyclohexyl)ethylmethyldimethoxysilane and γ-methacryloxypropyltriethoxysilane, β-(3,4-epoxycyclohexyl)ethylmethyldimethoxysilane and triethoxy(4-(trifluoromethyl)phenyl)silane, β-(3,4-epoxycyclohexyl)ethylmethyldimethoxysilane and 3,3,3-trifluoropropyltrimethoxysilane, β-(3,4-epoxycyclohexyl)ethylmethyldimethoxysilane and (triethoxysilyl)cyclohexane, β-(3,4-epoxycyclohexyl)ethylmethyldimethoxysilane and perfluorooctylethyltriethoxysilane, β-(3,4-epoxycyclohexyl)ethylmethyldimethoxysilane and triethoxyfluorosilane, β-(3,4-epoxycyclohexyl)ethylmethyldimethoxysilane and tridecafluoro-1,1,2,2-tetrahydrooctyltriethoxysilane, β-(3,4-epoxycyclohexyl)ethylmethyldimethoxysilane and pentafluorophenylpropyltrimethoxysilane, β-(3,4-epoxycyclohexyl)ethylmethyldimethoxysilane and 3-(heptafluoroisopropoxy)propyltriethoxysilane, β-(3,4-epoxycyclohexyl)ethylmethyldimethoxysilane and heptadecafluoro-1,1,2,2-tetrahydrodecyltriethoxysilane, β-(3,4-epoxycyclohexyl)ethylmethyldimethoxysilane and triethoxy-2-thienylsilane, and β-(3,4-epoxycyclohexyl)ethylmethyldimethoxysilane and 3-(triethoxysilyl)furan;

(16) γ-methacryloxypropylmethyldimethoxysilane and methyltrimethoxysilane, γ-methacryloxypropylmethyldimethoxysilane and methyltriethoxysilane, γ-methacryloxypropylmethyldimethoxysilane and ethyltrimethoxysilane, γ-methacryloxypropylmethyldimethoxysilane and ethyltriethoxysilane, γ-methacryloxypropylmethyldimethoxysilane and propyltrimethoxysilane, γ-methacryloxypropylmethyldimethoxysilane and propyltriethoxysilane, γ-methacryloxypropylmethyldimethoxysilane and butyltrimethoxysilane, γ-methacryloxypropylmethyldimethoxysilane and butyltriethoxysilane, γ-methacryloxypropylmethyldimethoxysilane and pentyltrimethoxysilane, γ-methacryloxypropylmethyldimethoxysilane and pentyltriethoxysilane, γ-methacryloxypropylmethyldimethoxysilane and heptyltrimethoxysilane, γ-methacryloxypropylmethyldimethoxysilane and heptyltriethoxysilane, γ-methacryloxypropylmethyldimethoxysilane and octyltrimethoxysilane, γ-methacryloxypropylmethyldimethoxysilane and octyltriethoxysilane, γ-methacryloxypropylmethyldimethoxysilane and dodecyltrimethoxysilane, γ-methacryloxypropylmethyldimethoxysilane and dodecyltriethoxysilane, γ-methacryloxypropylmethyldimethoxysilane and hexadecyltrimethoxysilane, γ-methacryloxypropylmethyldimethoxysilane and hexadecyltriethoxysilane, γ-methacryloxypropylmethyldimethoxysilane and octadecyltrimethoxysilane, γ-methacryloxypropylmethyldimethoxysilane and octadecyltriethoxysilane, γ-methacryloxypropylmethyldimethoxysilane and phenyltrimethoxysilane, γ-methacryloxypropylmethyldimethoxysilane and phenyltriethoxysilane, γ-methacryloxypropylmethyldimethoxysilane and vinyltrimethoxysilane, γ-methacryloxypropylmethyldimethoxysilane and vinyltriethoxysilane, γ-methacryloxypropylmethyldimethoxysilane and γ-aminopropyltrimethoxysilane, γ-methacryloxypropylmethyldimethoxysilane and γ-aminopropyltriethoxysilane, γ-methacryloxypropylmethyldimethoxysilane and γ-glycidoxypropyltrimethoxysilane, γ-methacryloxypropylmethyldimethoxysilane and γ-glycidoxypropyltriethoxysilane, γ-methacryloxypropylmethyldimethoxysilane and γ-methacryloxypropyltrimethoxysilane, γ-methacryloxypropylmethyldimethoxysilane and γ-methacryloxypropyltriethoxysilane, γ-methacryloxypropylmethyldimethoxysilane and triethoxy(4-(trifluoromethyl)phenyl)silane, γ-methacryloxypropylmethyldimethoxysilane and 3,3,3-trifluoropropyltrimethoxysilane, γ-methacryloxypropylmethyldimethoxysilane and (triethoxysilyl)cyclohexane, γ-methacryloxypropylmethyldimethoxysilane and perfluorooctylethyltriethoxysilane, γ-methacryloxypropylmethyldimethoxysilane and triethoxyfluorosilane, γ-methacryloxypropylmethyldimethoxysilane and tridecafluoro-1,1,2,2-tetrahydrooctyltriethoxysilane, γ-methacryloxypropylmethyldimethoxysilane and pentafluorophenylpropyltrimethoxysilane, γ-methacryloxypropylmethyldimethoxysilane and 3-(heptafluoroisopropoxy)propyltriethoxysilane, γ-methacryloxypropylmethyldimethoxysilane and heptadecafluoro-1,1,2,2-tetrahydrodecyltriethoxysilane, γ-methacryloxypropylmethyldimethoxysilane and triethoxy-2-thienylsilane, and γ-methacryloxypropylmethyldimethoxysilane and 3-(triethoxysilyl)furan;

(17) γ-methacryloxypropylmethyldiethoxysilane and methyltrimethoxysilane, γ-methacryloxypropylmethyldiethoxysilane and methyltriethoxysilane, γ-methacryloxypropylmethyldiethoxysilane and ethyltrimethoxysilane, γ-methacryloxypropylmethyldiethoxysilane and ethyltriethoxysilane, γ-methacryloxypropylmethyldiethoxysilane and propyltrimethoxysilane, γ-methacryloxypropylmethyldiethoxysilane and propyltriethoxysilane, γ-methacryloxypropylmethyldiethoxysilane and butyltrimethoxysilane, γ-methacryloxypropylmethyldiethoxysilane and butyltriethoxysilane, γ-methacryloxypropylmethyldiethoxysilane and pentyltrimethoxysilane, γ-methacryloxypropylmethyldiethoxysilane and pentyltriethoxysilane, γ-methacryloxypropylmethyldiethoxysilane and heptyltrimethoxysilane, γ-methacryloxypropylmethyldiethoxysilane and heptyltriethoxysilane, γ-methacryloxypropylmethyldiethoxysilane and octyltrimethoxysilane, γ-methacryloxypropylmethyldiethoxysilane and octyltriethoxysilane, γ-methacryloxypropylmethyldiethoxysilane and dodecyltrimethoxysilane, γ-methacryloxypropylmethyldiethoxysilane and dodecyltriethoxysilane, γ-methacryloxypropylmethyldiethoxysilane and hexadecyltrimethoxysilane, γ-methacryloxypropylmethyldiethoxysilane and hexadecyltriethoxysilane, γ-methacryloxypropylmethyldiethoxysilane and octadecyltrimethoxysilane, γ-methacryloxypropylmethyldiethoxysilane and octadecyltriethoxysilane, γ-methacryloxypropylmethyldiethoxysilane and phenyltrimethoxysilane, γ-methacryloxypropylmethyldiethoxysilane and phenyltriethoxysilane, γ-methacryloxypropylmethyldiethoxysilane and vinyltrimethoxysilane, γ-methacryloxypropylmethyldiethoxysilane and vinyltriethoxysilane, γ-methacryloxypropylmethyldiethoxysilane and γ-aminopropyltrimethoxysilane, γ-methacryloxypropylmethyldiethoxysilane and γ-aminopropyltriethoxysilane, γ-methacryloxypropylmethyldiethoxysilane and γ-glycidoxypropyltrimethoxysilane, γ-methacryloxypropylmethyldiethoxysilane and γ-glycidoxypropyltriethoxysilane, γ-methacryloxypropylmethyldiethoxysilane and γ-methacryloxypropyltrimethoxysilane, γ-methacryloxypropylmethyldiethoxysilane and γ-methacryloxypropyltriethoxysilane, γ-methacryloxypropylmethyldiethoxysilane and triethoxy(4-(trifluoromethyl)phenyl)silane, γ-methacryloxypropylmethyldiethoxysilane and 3,3,3-trifluoropropyltrimethoxysilane, γ-methacryloxypropylmethyldiethoxysilane and (triethoxysilyl)cyclohexane, γ-methacryloxypropylmethyldiethoxysilane and perfluorooctylethyltriethoxysilane, γ-methacryloxypropylmethyldiethoxysilane and triethoxyfluorosilane, γ-methacryloxypropylmethyldiethoxysilane and tridecafluoro-1,1,2,2-tetrahydrooctyltriethoxysilane, γ-methacryloxypropylmethyldiethoxysilane and pentafluorophenylpropyltrimethoxysilane, γ-methacryloxypropylmethyldiethoxysilane and 3-(heptafluoroisopropoxy)propyltriethoxysilane, γ-methacryloxypropylmethyldiethoxysilane and heptadecafluoro-1,1,2,2-tetrahydrodecyltriethoxysilane, γ-methacryloxypropylmethyldiethoxysilane and triethoxy-2-thienylsilane, and γ-methacryloxypropylmethyldiethoxysilane and 3-(triethoxysilyl)furan;

(18) γ-mercaptopropylmethyldimethoxysilane and methyltrimethoxysilane, γ-mercaptopropylmethyldimethoxysilane and methyltriethoxysilane, γ-mercaptopropylmethyldimethoxysilane and ethyltrimethoxysilane, γ-mercaptopropylmethyldimethoxysilane and ethyltriethoxysilane, γ-mercaptopropylmethyldimethoxysilane and propyltrimethoxysilane, γ-mercaptopropylmethyldimethoxysilane and propyltriethoxysilane, γ-mercaptopropylmethyldimethoxysilane and butyltrimethoxysilane, γ-mercaptopropylmethyldimethoxysilane and butyltriethoxysilane, γ-mercaptopropylmethyldimethoxysilane and pentyltrimethoxysilane, γ-mercaptopropylmethyldimethoxysilane and pentyltriethoxysilane, γ-mercaptopropylmethyldimethoxysilane and heptyltrimethoxysilane, γ-mercaptopropylmethyldimethoxysilane and heptyltriethoxysilane, γ-mercaptopropylmethyldimethoxysilane and octyltrimethoxysilane, γ-mercaptopropylmethyldimethoxysilane and octyltriethoxysilane, γ-mercaptopropylmethyldimethoxysilane and dodecyltrimethoxysilane, γ-mercaptopropylmethyldimethoxysilane and dodecyltriethoxysilane, γ-mercaptopropylmethyldimethoxysilane and hexadecyltrimethoxysilane, γ-mercaptopropylmethyldimethoxysilane and hexadecyltriethoxysilane, γ-mercaptopropylmethyldimethoxysilane and octadecyltrimethoxysilane, γ-mercaptopropylmethyldimethoxysilane and octadecyltriethoxysilane, γ-mercaptopropylmethyldimethoxysilane and phenyltrimethoxysilane, γ-mercaptopropylmethyldimethoxysilane and phenyltriethoxysilane, γ-mercaptopropylmethyldimethoxysilane and vinyltrimethoxysilane, γ-mercaptopropylmethyldimethoxysilane and vinyltriethoxysilane, γ-mercaptopropylmethyldimethoxysilane and γ-aminopropyltrimethoxysilane, γ-mercaptopropylmethyldimethoxysilane and γ-aminopropyltriethoxysilane, γ-mercaptopropylmethyldimethoxysilane and γ-glycidoxypropyltrimethoxysilane, γ-mercaptopropylmethyldimethoxysilane and γ-glycidoxypropyltriethoxysilane, γ-mercaptopropylmethyldimethoxysilane and γ-methacryloxypropyltrimethoxysilane, γ-mercaptopropylmethyldimethoxysilane and γ-methacryloxypropyltriethoxysilane, γ-mercaptopropylmethyldimethoxysilane and triethoxy(4-(trifluoromethyl)phenyl)silane, γ-mercaptopropylmethyldimethoxysilane and 3,3,3-trifluoropropyltrimethoxysilane, γ-mercaptopropylmethyldimethoxysilane and (triethoxysilyl)cyclohexane, γ-mercaptopropylmethyldimethoxysilane and perfluorooctylethyltriethoxysilane, γ-mercaptopropylmethyldimethoxysilane and triethoxyfluorosilane, γ-mercaptopropylmethyldimethoxysilane and tridecafluoro-1,1,2,2-tetrahydrooctyltriethoxysilane, γ-mercaptopropylmethyldimethoxysilane and pentafluorophenylpropyltrimethoxysilane, γ-mercaptopropylmethyldimethoxysilane and 3-(heptafluoroisopropoxy)propyltriethoxysilane, γ-mercaptopropylmethyldimethoxysilane and heptadecafluoro-1,1,2,2-tetrahydrodecyltriethoxysilane, γ-mercaptopropylmethyldimethoxysilane and triethoxy-2-thienylsilane, and γ-mercaptopropylmethyldimethoxysilane and 3-(triethoxysilyl)furan;

(19) γ-aminopropylmethyldiethoxysilane and methyltrimethoxysilane, γ-aminopropylmethyldiethoxysilane and methyltriethoxysilane, γ-aminopropylmethyldiethoxysilane and ethyltrimethoxysilane, γ-aminopropylmethyldiethoxysilane and ethyltriethoxysilane, γ-aminopropylmethyldiethoxysilane and propyltrimethoxysilane, γ-aminopropylmethyldiethoxysilane and propyltriethoxysilane, γ-aminopropylmethyldiethoxysilane and butyltrimethoxysilane, γ-aminopropylmethyldiethoxysilane and butyltriethoxysilane, γ-aminopropylmethyldiethoxysilane and pentyltrimethoxysilane, γ-aminopropylmethyldiethoxysilane and pentyltriethoxysilane, γ-aminopropylmethyldiethoxysilane and heptyltrimethoxysilane, γ-aminopropylmethyldiethoxysilane and heptyltriethoxysilane, γ-aminopropylmethyldiethoxysilane and octyltrimethoxysilane, γ-aminopropylmethyldiethoxysilane and octyltriethoxysilane, γ-aminopropylmethyldiethoxysilane and dodecyltrimethoxysilane, γ-aminopropylmethyldiethoxysilane and dodecyltriethoxysilane, γ-aminopropylmethyldiethoxysilane and hexadecyltrimethoxysilane, γ-aminopropylmethyldiethoxysilane and hexadecyltriethoxysilane, γ-aminopropylmethyldiethoxysilane and octadecyltrimethoxysilane, γ-aminopropylmethyldiethoxysilane and octadecyltriethoxysilane, γ-aminopropylmethyldiethoxysilane and phenyltrimethoxysilane, γ-aminopropylmethyldiethoxysilane and phenyltriethoxysilane, γ-aminopropylmethyldiethoxysilane and vinyltrimethoxysilane, γ-aminopropylmethyldiethoxysilane and vinyltriethoxysilane, γ-aminopropylmethyldiethoxysilane and γ-aminopropyltrimethoxysilane, γ-aminopropylmethyldiethoxysilane and γ-aminopropyltriethoxysilane, γ-aminopropylmethyldiethoxysilane and γ-glycidoxypropyltrimethoxysilane, γ-aminopropylmethyldiethoxysilane and γ-glycidoxypropyltriethoxysilane, γ-aminopropylmethyldiethoxysilane and γ-methacryloxypropyltrimethoxysilane, γ-aminopropylmethyldiethoxysilane and γ-methacryloxypropyltriethoxysilane, γ-aminopropylmethyldiethoxysilane and triethoxy(4-(trifluoromethyl)phenyl)silane, γ-aminopropylmethyldiethoxysilane and 3,3,3-trifluoropropyltrimethoxysilane, γ-aminopropylmethyldiethoxysilane and (triethoxysilyl)cyclohexane, γ-aminopropylmethyldiethoxysilane and perfluorooctylethyltriethoxysilane, γ-aminopropylmethyldiethoxysilane and triethoxyfluorosilane, γ-aminopropylmethyldiethoxysilane and tridecafluoro-1,1,2,2-tetrahydrooctyltriethoxysilane, γ-aminopropylmethyldiethoxysilane and pentafluorophenylpropyltrimethoxysilane, γ-aminopropylmethyldiethoxysilane and 3-(heptafluoroisopropoxy)propyltriethoxysilane, γ-aminopropylmethyldiethoxysilane and heptadecafluoro-1,1,2,2-tetrahydrodecyltriethoxysilane, γ-aminopropylmethyldiethoxysilane and triethoxy-2-thienylsilane, and γ-aminopropylmethyldiethoxysilane and 3-(triethoxysilyl)furan;

(20) N-(2-aminoethyl)aminopropylmethyldimethoxysilane and methyltrimethoxysilane, N-(2-aminoethyl)aminopropylmethyldimethoxysilane and methyltriethoxysilane, N-(2-aminoethyl)aminopropylmethyldimethoxysilane and ethyltrimethoxysilane, N-(2-aminoethyl)aminopropylmethyldimethoxysilane and ethyltriethoxysilane, N-(2-aminoethyl)aminopropylmethyldimethoxysilane and propyltrimethoxysilane, N-(2-aminoethyl) aminopropylmethyldimethoxysilane and propyltriethoxysilane, N-(2-aminoethyl)aminopropylmethyldimethoxysilane and butyltrimethoxysilane, N-(2-aminoethyl)aminopropylmethyldimethoxysilane and butyltriethoxysilane, N-(2-aminoethyl)aminopropylmethyldimethoxysilane and pentyltrimethoxysilane, N-(2-aminoethyl)aminopropylmethyldimethoxysilane and pentyltriethoxysilane, N-(2-aminoethyl) aminopropylmethyldimethoxysilane and heptyltrimethoxysilane, N-(2-aminoethyl)aminopropylmethyldimethoxysilane and heptyltriethoxysilane, N-(2-aminoethyl)aminopropylmethyldimethoxysilane and octyltrimethoxysilane, N-(2-aminoethyl)aminopropylmethyldimethoxysilane and octyltriethoxysilane, N-(2-aminoethyl)aminopropylmethyldimethoxysilane and dodecyltrimethoxysilane, N-(2-aminoethyl)aminopropylmethyldimethoxysilane and dodecyltriethoxysilane, N-(2-aminoethyl)aminopropylmethyldimethoxysilane and hexadecyltrimethoxysilane, N-(2-aminoethyl)aminopropylmethyldimethoxysilane and hexadecyltriethoxysilane, N-(2-aminoethyl)aminopropylmethyldimethoxysilane and octadecyltrimethoxysilane, N-(2-aminoethyl)aminopropylmethyldimethoxysilane and octadecyltriethoxysilane, N-(2-aminoethyl)aminopropylmethyldimethoxysilane and phenyltrimethoxysilane, N-(2-aminoethyl)aminopropylmethyldimethoxysilane and phenyltriethoxysilane, N-(2-aminoethyl)aminopropylmethyldimethoxysilane and vinyltrimethoxysilane, N-(2-aminoethyl)aminopropylmethyldimethoxysilane and vinyltriethoxysilane, N-(2-aminoethyl)aminopropylmethyldimethoxysilane and γ-aminopropyltrimethoxysilane, N-(2-aminoethyl)aminopropylmethyldimethoxysilane and γ-aminopropyltriethoxysilane, N-(2-aminoethyl)aminopropylmethyldimethoxysilane and γ-glycidoxypropyltrimethoxysilane, N-(2-aminoethyl)aminopropylmethyldimethoxysilane and γ-glycidoxypropyltriethoxysilane, N-(2-aminoethyl)aminopropylmethyldimethoxysilane and γ-methacryloxypropyltrimethoxysilane, N-(2-aminoethyl)aminopropylmethyldimethoxysilane and γ-methacryloxypropyltriethoxysilane, N-(2-aminoethyl)aminopropylmethyldimethoxysilane and triethoxy(4-(trifluoromethyl)phenyl)silane, N-(2-aminoethyl)aminopropylmethyldimethoxysilane and 3,3,3-trifluoropropyltrimethoxysilane, N-(2-aminoethyl)aminopropylmethyldimethoxysilane and (triethoxysilyl)cyclohexane, N-(2-aminoethyl)aminopropylmethyldimethoxysilane and perfluorooctylethyltriethoxysilane, N-(2-aminoethyl)aminopropylmethyldimethoxysilane and triethoxyfluorosilane, N-(2-aminoethyl)aminopropylmethyldimethoxysilane and tridecafluoro-1,1,2,2-tetrahydrooctyltriethoxysilane, N-(2-aminoethyl)aminopropyl methyldimethoxysilane and pentafluorophenylpropyltrimethoxysilane, N-(2-aminoethyl)aminopropylmethyldimethoxysilane and 3-(heptafluoroisopropoxy)propyltriethoxysilane, N-(2-aminoethyl)aminopropylmethyldimethoxysilane and heptadecafluoro-1,1,2,2-tetrahydrodecyltriethoxysilane, N-(2-aminoethyl)aminopropylmethyldimethoxysilane and triethoxy-2-thienylsilane, and N-(2-aminoethyl)aminopropylmethyldimethoxysilane and 3-(triethoxysilyl)furan;

(21) 3,3,3-trifluoropropylmethyldimethoxysilane and methyltrimethoxysilane, 3,3,3-trifluoropropylmethyldimethoxysilane and methyltriethoxysilane, 3,3,3-trifluoropropylmethyldimethoxysilane and ethyltrimethoxysilane, 3,3,3-trifluoropropylmethyldimethoxysilane and ethyltriethoxysilane, 3,3,3-trifluoropropylmethyldimethoxysilane and propyltrimethoxysilane, 3,3,3-trifluoropropylmethyldimethoxysilane and propyltriethoxysilane, 3,3,3-trifluoropropylmethyldimethoxysilane and butyltrimethoxysilane, 3,3,3-trifluoropropylmethyldimethoxysilane and butyltriethoxysilane, 3,3,3-trifluoropropylmethyldimethoxysilane and pentyltrimethoxysilane, 3,3,3-trifluoropropylmethyldimethoxysilane and pentyltriethoxysilane, 3,3,3-trifluoropropylmethyldimethoxysilane and heptyltrimethoxysilane, 3,3,3-trifluoropropylmethyldimethoxysilane and heptyltriethoxysilane, 3,3,3-trifluoropropylmethyldimethoxysilane and octyltrimethoxysilane, 3,3,3-trifluoropropylmethyldimethoxysilane and octyltriethoxysilane, 3,3,3-trifluoropropylmethyldimethoxysilane and dodecyltrimethoxysilane, 3,3,3-trifluoropropylmethyldimethoxysilane and dodecyltriethoxysilane, 3,3,3-trifluoropropylmethyldimethoxysilane and hexadecyltrimethoxysilane, 3,3,3-trifluoropropylmethyldimethoxysilane and hexadecyltriethoxysilane, 3,3,3-trifluoropropylmethyldimethoxysilane and octadecyltrimethoxysilane, 3,3,3-trifluoropropylmethyldimethoxysilane and octadecyltriethoxysilane, 3,3,3-trifluoropropyl methyldimethoxysilane and phenyltrimethoxysilane, 3,3,3-trifluoropropylmethyldimethoxysilane and phenyltriethoxysilane, 3,3,3-trifluoropropylmethyldimethoxysilane and vinyltrimethoxysilane, 3,3,3-trifluoropropylmethyldimethoxysilane and vinyltriethoxysilane, 3,3,3-trifluoropropylmethyldimethoxysilane and γ-aminopropyltrimethoxysilane, 3,3,3-trifluoropropylmethyldimethoxysilane and γ-aminopropyltriethoxysilane, 3,3,3-trifluoropropylmethyldimethoxysilane and γ-glycidoxypropyltrimethoxysilane, 3,3,3-trifluoropropyl methyldimethoxysilane and γ-glycidoxypropyltriethoxysilane, 3,3,3-trifluoropropylmethyldimethoxysilane and γ-methacryloxypropyltrimethoxysilane, 3,3,3-trifluoropropylmethyldimethoxysilane and γ-methacryloxypropyltriethoxysilane, 3,3,3-trifluoropropylmethyldimethoxysilane and triethoxy (4-(trifluoromethyl)phenyl)silane, 3,3,3-trifluoropropylmethyldimethoxysilane and 3,3,3-trifluoropropyltrimethoxysilane, 3,3,3-trifluoropropylmethyldimethoxysilane and (triethoxysilyl)cyclohexane, 3,3,3-trifluoropropylmethyldimethoxysilane and perfluorooctylethyltriethoxysilane, 3,3,3-trifluoropropylmethyldimethoxysilane and triethoxyfluorosilane, 3,3,3-trifluoropropylmethyldimethoxysilane and tridecafluoro-1,1,2,2-tetrahydrooctyltriethoxysilane, 3,3,3-trifluoropropylmethyl dimethoxysilane and pentafluorophenylpropyltrimethoxysilane, 3,3,3-trifluoropropylmethyldimethoxysilane and 3-(heptafluoroisopropoxy)propyltriethoxysilane, 3,3,3-trifluoropropylmethyldimethoxysilane and heptadecafluoro-1,1,2,2-tetrahydrodecyltriethoxysilane, 3,3,3-trifluoropropylmethyldimethoxysilane and triethoxy-2-thienylsilane, and 3,3,3-trifluoropropyl methyldimethoxysilane and 3-(triethoxysilyl)furan.

When at least one dialkoxysilane compound and at least one tetraalkoxysilane compound are used in combination, examples of preferred combinations are indicated below:

(1) tetramethylsilane and methylhydrogendimethoxysilane, tetramethylsilane and methylhydrogendiethoxysilane, tetramethylsilane and dimethyldimethoxysilane, tetramethylsilane and dimethyldiethoxysilane, tetramethylsilane and methylethyldimethoxysilane, tetramethylsilane and diethyldimethoxysilane, tetramethylsilane and diethyldiethoxysilane, tetramethylsilane and methylpropyldimethoxysilane, tetramethylsilane and methylpropyldiethoxysilane, tetramethylsilane and diisopropyldimethoxysilane, tetramethylsilane and phenylmethyldimethoxysilane, tetramethylsilane and vinylmethyldimethoxysilane, tetramethylsilane and γ-glycidoxypropylmethyldimethoxysilane, tetramethylsilane and γ-glycidoxypropylmethyldiethoxysilane, tetramethylsilane and β-(3,4-epoxycyclohexyl)ethylmethyldimethoxysilane, tetramethylsilane and γ-methacryloxypropylmethyldimethoxysilane, tetramethylsilane and γ-methacryloxypropylmethyldiethoxysilane, tetramethylsilane and γ-mercaptopropylmethyldimethoxysilane, tetramethylsilane and γ-aminopropylmethyldiethoxysilane, tetramethylsilane and N-(2-aminoethyl)aminopropylmethyldimethoxysilane, and tetramethylsilane and 3,3,3-trifluoropropylmethyldimethoxysilane;

(2) tetraethylsilane and methylhydrogendimethoxysilane, tetraethylsilane and methylhydrogendiethoxysilane, tetraethylsilane and dimethyldimethoxysilane, tetraethylsilane and dimethyldiethoxysilane, tetraethylsilane and methylethyldimethoxysilane, tetraethylsilane and diethyldimethoxysilane, tetraethylsilane and diethyldiethoxysilane, tetraethylsilane and methylpropyldimethoxysilane, tetraethylsilane and methylpropyldiethoxysilane, tetraethylsilane and diisopropyldimethoxysilane, tetraethylsilane and phenylmethyldimethoxysilane, tetraethylsilane and vinylmethyldimethoxysilane, tetraethylsilane and γ-glycidoxypropylmethyldimethoxysilane, tetraethylsilane and γ-glycidoxypropylmethyldiethoxysilane, tetraethylsilane and β-(3,4-epoxycyclohexyl)ethylmethyldimethoxysilane, tetraethylsilane and γ-methacryloxypropylmethyldimethoxysilane, tetraethylsilane and γ-methacryloxypropylmethyldiethoxysilane, tetraethylsilane and γ-mercaptopropylmethyldimethoxysilane, tetraethylsilane and γ-aminopropylmethyldiethoxysilane, tetraethylsilane and N-(2-aminoethyl)aminopropylmethyldimethoxysilane, and 3,3,3-trifluoropropylmethyldimethoxysilane;

(3) tetrapropoxysilane and methylhydrogendimethoxysilane, tetrapropoxysilane and methylhydrogendiethoxysilane, tetrapropoxysilane and dimethyldimethoxysilane, tetrapropoxysilane and dimethyldiethoxysilane, tetrapropoxysilane and methylethyldimethoxysilane, tetrapropoxysilane and diethyldimethoxysilane, tetrapropoxysilane and diethyldiethoxysilane, tetrapropoxysilane and methylpropyldimethoxysilane, tetrapropoxysilane and methylpropyldiethoxysilane, tetrapropoxysilane and diisopropyldimethoxysilane, tetrapropoxysilane and phenylmethyldimethoxysilane, tetrapropoxysilane and vinylmethyldimethoxysilane, tetrapropoxysilane and γ-glycidoxypropylmethyldimethoxysilane, tetrapropoxysilane and γ-glycidoxypropylmethyldiethoxysilane, tetrapropoxysilane and β-(3,4-epoxycyclohexyl)ethylmethyldimethoxysilane, tetrapropoxysilane and γ-methacryloxypropylmethyldimethoxysilane, tetrapropoxysilane and γ-methacryloxypropylmethyldiethoxysilane, tetrapropoxysilane and γ-mercaptopropylmethyldimethoxysilane, tetrapropoxysilane and γ-aminopropylmethyldiethoxysilane, tetrapropoxysilane and N-(2-aminoethyl)aminopropylmethyldimethoxysilane, and tetrapropoxysilane and 3,3,3-trifluoropropylmethyldimethoxysilane.

Examples of the organic solvent used in the charge-transporting varnish include N,N-dimethylformamide (153° C.), N,N-dimethylacetamide (165° C.), N-methylpyrrolidone (202° C.), 1,3-dimethyl-2-imidazolidinone (225° C.), dimethylsulfoxide (189° C.), N-cyclohexyl-2-pyrolidinone (284° C.), aromatic hydrocarbons [such as benzene (80° C.), toluene (111° C.), ethylbenzene (136° C.), p-xylene (138° C.), o-xylene (138° C.) and styrene (145° C.)], ketones [such as acetone (56° C.), methyl ethyl ketone (80° C.), methyl isopropyl ketone (94° C.), diethyl ketone (102° C.), methyl isobutyl ketone (117° C.), methyl normal butyl ketone (127° C.), cyclohexanone (155° C.) and ethyl normal amyl ketone (167° C.)], esters [such as ethyl acetate (77° C.), isopropyl acetate (85° C.), normal propyl acetate (101° C.), iso-butyl acetate (116° C.), normal butyl acetate (125° C.), normal amyl acetate (142° C.), methyl caproate (151° C.), 2-methylpentyl acetate (162° C.) and normal butyl lactate (186° C.)], glycol esters and glycol ethers [such as ethylene glycol dimethyl ether (85° C.), propylene glycol monomethyl ether (119° C.), ethylene glycol monomethyl ether (124° C.), propylene glycol monoethyl ether (132° C.), ethylene glycol monoethyl ether (136° C.), ethylene glycol monoisopropyl ether (144° C.), ethylene glycol methyl ether acetate (145° C.), propylene glycol monomethyl ether acetate (146° C.), ethylene glycol ethyl ether acetate (156° C.), diethylene glycol dimethyl ether (162° C.), propylene glycol monobutyl ether (170° C.), ethylene glycol monobutyl ether (171° C.), diethylene glycol diethyl ether (188° C.), dipropylene glycol monomethyl ether (189° C.), diethylene glycol monomethyl ether (194° C.), dipropylene glycol monoethyl ether (198° C.), diethylene glycol monoethyl ether (202° C.), triethylene glycol dimethyl ether (216° C.), diethylene glycol monoethyl ether acetate (217° C.) and diethylene glycol (244° C.)], alcohols [such as methanol (65° C.), ethanol (78° C.), isopropanol (82° C.), tert-butanol (83° C.), allyl alcohol (97° C.), normal propanol (97° C.), 2-methyl-2-butanol (102° C.), isobutanol (108° C.), normal butanol (117° C.), 2-methyl-1-butanol (130° C.), 1-pentanol (137° C.), 2-methyl-1-pentanol (148° C.), 2-ethylhexanol (185° C.), 1-octanol (196° C.), ethylene glycol (197° C.), hexylene glycol (198° C.), trimethylene glycol (214° C.), 1-methoxy-2-butanol (135° C.), cyclohexanol (161° C.), diacetone alcohol (166° C.), furfuryl alcohol (170° C.), tetrahydrofurfuryl alcohol (178° C.), propylene glycol (187° C.), benzyl alcohol (205° C.) and 1,3-butanediol (208° C.)], phenols [such as anisole (154° C.), phenol (182° C.) and m-cresol (202° C.)], and ethers and carboxylic acids [such as isopropyl ether (68° C.), 1,4-dioxane (101° C.), acetic acid (117° C.) and γ-butyrolactone (204° C.)].

These organic solvents may be used alone or in combination of two or more.

In the practice of the invention, solvents having a high solvent power to dissolve a charge transporting material and an electron-accepting material can be used. Such solvents having a high solvent power include water, methanol, N,N-dimethylformamide, N,N-dimethylacetamide, N-methylpyrrolidone, 1,3-dimethyl-2-imidazolidinone, dimethylsulfoxide, chloroform and toluene. These solvents may be used alone or in admixture of two or more. The amount of the solvent may be in the range of 5 to 100 wt % relative to the total of solvents used in the varnish.

It will be noted that the charge-transporting varnish is preferably in a state of complete dissolution or uniform dispersion in such a solvent as indicated above.

The charge-transporting varnish of the invention preferably includes at least one type of high-viscosity organic solvent having a viscosity of 10 to 200 mPa·s, preferably 50 to 150 mPa·s, at 20° C. and a boiling point of 50 to 300° C., preferably 150 to 250° C., at a normal pressure.

Example of the high-viscosity solvent includes cyclohexanol, ethylene glycol, ethylene glycol diglycidyl ether, 1,3-octylene glycol diethylene glycol, dipropylene glycol, triethylene glycol, tripropylene glycol, 1,3-butanediol, 2,3-butanediol, 1,4-butanediol, propylene glycol and hexylene glycol.

The ratio of the high-viscosity solvent to the total of solvents used in the varnish of the invention is preferably within a range in which no solid precipitates and is preferably in the range of 5 to 80 wt % in so far as no solid precipitates.

For the purposes of improving wettability to substrates, controlling the surface tension of solvent, controlling polarity and controlling a boiling point, other type of solvent, which can impart flatness to the film upon baking, can be mixed in the range of 1 to 90 wt %, preferably 1 to 50 wt %, relative to the total of the solvents used in the varnish.

Examples of such solvents include butyl cellosolve, diethylene glycol diethyl ether, dipropylene glycol monomethyl ether, ethyl carbitol, diacetone alcohol, γ-butyrolactone and ethyl lactate.

The solid content of the charge-transporting varnish is preferably in the range of 0.001 to 50 wt %, more preferably 0.01 to 20 wt %, in view of coating operations of the varnish.

In the charge-transporting varnish of the invention, the storage stability of the varnish becomes better in some case when the silane compound exists in the form of a small oligomer or oligomer or polymer rather than a silane monomer. Accordingly, the charge-transporting varnish of the invention may contain water for hydrolyzing and condensing the silane compound.

In this case, the amount of water is preferably in the range of 0.0001 to 10 wt %, more preferably 0.001 to 5 wt %, relative to the total organic solvents in the varnish.

The charge-transporting varnish stated hereinabove is coated onto a substrate and the solvent is evaporated, thereby forming a charge-transporting thin film on the substrate.

The coating methods of the varnish include, but are not limited to, a spin coating method, a transfer printing method, a roll coating method, brushing, an ink jet method and a spraying method.

The solvent evaporation method is not limited to, and the evaporation may be carried out, for example, by use of a hot plate or oven in an appropriate atmosphere, i.e., in air, in an inert gas such as nitrogen or in vacuum. In this way, a thin film having a uniform film-formed face can be obtained.

The baking temperature is not limited so far as solvents can be evaporated, and ranges preferably from 40 to 250° C. In this case, for the purposes of causing more uniform film-forming properties to be developed and a reaction on the substrate to proceed, two or more temperature change may be made.

The thickness of the charge-transporting thin film is not limited. For use as a charge-injecting layer inside an organic EL element, the thickness is preferably in the range of 5 to 200 nm. For changing a film thickness, there may be used methods of changing a solid concentration in a varnish, changing an amount of a coating solution on a substrate, and the like.

When an OLED element is made by use of the charge-transporting varnish of the invention, materials and making methods used therefor are those set forth below, but are not limited thereto.

The electrode substrate used is preferably cleaned beforehand by rinsing with a liquid such as a detergent, alcohol and pure water. For instance, an anode substrate may be preferably subjected to a surface treatment such as ozone treatment and oxygen-plasma treatment immediately before use. In this connection, however, if an anode material is made primarily of an organic matter, the surface treatment may not be carried out.

When a hole-transporting varnish is used for an OLED element, the following procedure can be used.

The hole-transporting varnish is coated onto an anode substrate, followed by evaporation and baking in the same manner as set forth above to form a hole-transporting thin film on the electrode. This is introduced into a vacuum deposition apparatus, followed by successive deposition of a hole-transporting layer, an emission layer, an electron-transporting layer, an electron-injecting layer and a cathode metal to provide an OLED element. In order to control an emitting region, a carrier block layer may be provided between arbitrary layers.

Examples of the anode material include a transparent electrode materials such as indium tin oxide (ITO) and indium zinc oxide (IZO), which may be preferably subjected to flattening treatment. Additionally, polythiophene derivatives and polyaniline derivatives having high charge transportability may also be used.

Examples of materials forming a hole-transporting layer include triarylamines such as a (triphenylamine) dimer derivative (TPD), (α-naphthyldiphenylamine)dimer (α-NPD) and [(triphenylamine)dimer]spirodimer (spiro-TAD), starburst amines such as 4,4',4"-tris[3-methylphenyl (phenyl)amino]-triphenylamine (m-MTDATA) and 4,4',4"-tris[1-naphthyl-(phenyl)amino]triphenylamine (1-TNATA), and oligothiophenes such as 5,5"-bis-{4-[bis(4-methylphenyl)amino]phenyl}-2,2':5',2"-terthiophene (BMA-3T).

Examples of materials forming an emission layer include tris(8-quinolinolate)aluminum(III) ($Alq_3$), bis(8-quinolinolate)zinc(II) ($Znq_2$), bis(2-methyl-8-quinolinolate)(p-phenylphenolate)aluminum(III) (BAlq) and 4,4'-bis(2,2-diphenylvinyl)biphenyl (DPVBi). An electron-transporting material or a hole-transporting material and a light-emitting dopant may be subjected to co-deposition to form an emission layer.

Examples of the electron-transporting materials include $Alq_3$, BAlq, DPVBi, 2-(4-biphenyl)-5-(4-t-butyl-phenyl)-1,3,4-oxadiazole (PBD), a triazole derivative (TAZ), bathocuproine (BCP) and a silole derivative.

Examples of the light-emitting dopant include quinacridone, rubrene, coumarin 540, 4-(dicyanomethylene)-2-methyl-6-(p-dimethylaminostyryl)-4H-pyrane (DCM), tris(2-phenylpyridine)iridium(III) ($Ir(ppy)_3$), (1,10-phenathroline)-tris(4,4,4-trifluoro-1-(2-thienyl)-butane-1,3-dionate) europium(III) ($Eu(TTA)_3phen$).

Examples of materials forming the carrier block layer include PBZ, TAZ and BCP.

Examples of materials forming the electron-injecting layer include lithium oxide ($Li_2O$), magnesium oxide (MgO), alumina ($Al_2O_3$), lithium fluoride (LiF), magnesium fluoride ($MgF_2$), strontium fluoride ($SrF_2$), Liq, Liq(acac), lithium acetate and lithium benzoate.

Examples of cathode materials include aluminum, magnesium-silver alloys, aluminum-lithium alloys, lithium, sodium, potassium and cesium.

When an electron-transporting varnish is used as an OLED element, the following procedure can be used.

The electron transporting varnish is coated onto a cathode substrate to form an electron-transporting thin film and introduced into a vacuum deposition apparatus, followed by forming an electron transporting layer, an emission layer, a hole transporting layer and a hole injecting layer using such materials as set forth above, respectively. Thereafter, an anode material is formed as a film by a method such as sputtering to provide an OLED element.

Although the method of making a PLED element using the charge-transporting varnish of the invention is not limited, the following procedure can be mentioned.

In the making of the above OLED element, the vacuum deposition operations of the hole-transporting layer, emission-layer, electron-transporting layer and electron-injecting layer are replaced by the formation of a light-emitting charge-transporting polymer layer, thereby making a PLED element containing a charge transporting thin film formed from the charge-transporting varnish of the invention.

More particularly, the charge-transporting varnish (hole-transporting varnish) is coated onto an anode substrate to form a hole transporting thin film according to such a method as set forth above, on which a light-emitting charge-transporting polymer layer is formed, followed by vacuum deposition of a cathode electrode to provide a PLED element.

Alternatively, the charge-transporting varnish (electron-transporting varnish) may be coated onto a cathode substrate to form an electron-transporting thin film according to such a method as set out before, on which an light-emitting charge transporting polymer layer is formed, followed by forming an anode electrode by a method such as sputtering, vacuum deposition and spin coating, thereby providing a PLED element.

The cathode and anode materials may be those used for the making of the OLED element, which may be subjected to similar cleaning and surface treatments.

For the formation of the light-emitting charge transporting polymer layer, there is mentioned a method of dissolving or uniformly dispersing a light-emitting charge transporting polymer material with or without an emission dopant in a solvent and coating onto an electrode substrate on which a hole-injecting layer has been formed, followed by evaporation of the solvent to form a film.

Examples of the light-emitting charge-transporting polymer material include polyfluorene derivatives such as poly(9,9-dialkylfluorene) (PDAF), polyphenylenevinylene derivatives such as poly(2-methoxy-5-(2'-ethylhexoxy)-1,4-phenylenevinylene) (MEH-PPV), polythiophene derivatives such as poly(3-alkylthiophene) (PAT), and polyvinylcarbazoles (PVCz).

Examples of the solvent include toluene, xylene and chloroform. For the dissolution or uniform dispersion, there are used methods of agitation, heated agitation and ultrasonic dispersion.

Examples of the coating methods include, but are not limited to, an ink-jet method, a spraying method, a dipping method, a spin coating method, a transfer printing method, a roll coating method and brushing. It will be noted that the coating is preferably performed in an inert gas such as nitrogen and argon.

The solvent evaporation method may include a method of heating with an oven or hot plate in an inert gas or in vacuum.

EXAMPLES

The invention is further described by way of References, Examples and Comparative Examples, although the invention is not limited thereto.

Reference 1

The following phenyltetraaniline (hereinafter abbreviated as PTA) was synthesized from p-hydroxydiphenylamine and p-phenylenediamine according to Bulletin of Chemical Society of Japan, 1994, Vol. 67, pp. 1749-1752 (yield: 85%).

[Chemical Formula 9]

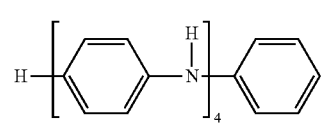

Reference 2

The following naphthalenedisulfonic acid compound (hereinafter abbreviated as NSO-2) was synthesized from sodium 1-naphthol-3,6-disulfonate and perfluorobiphenyl according to WO 2006/025343 (yield: 81%).

[Chemical Formual 10]

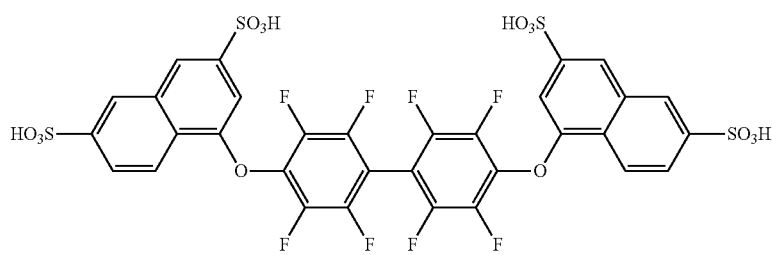

Reference 3

A structure-bearing ITO substrate was prepared by use of a positive photosensitive polyimide. A pattern on a 25×25 mm ITO solid substrate with a thickness of 0.7 mm had a film thickness of 10 nm with lines (widths of the polyimide) of 30 μm and pixel widths (between the structures) of 50×100 μm.

Figure 2:
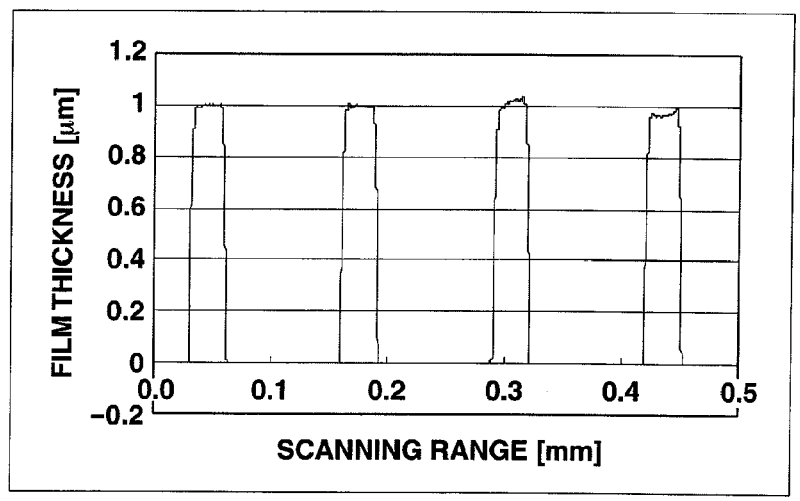
FIG. 2 is a view showing the results of measurement of the ITO portion of the structure-bearing substrate made in Reference 3.
Figure 3:
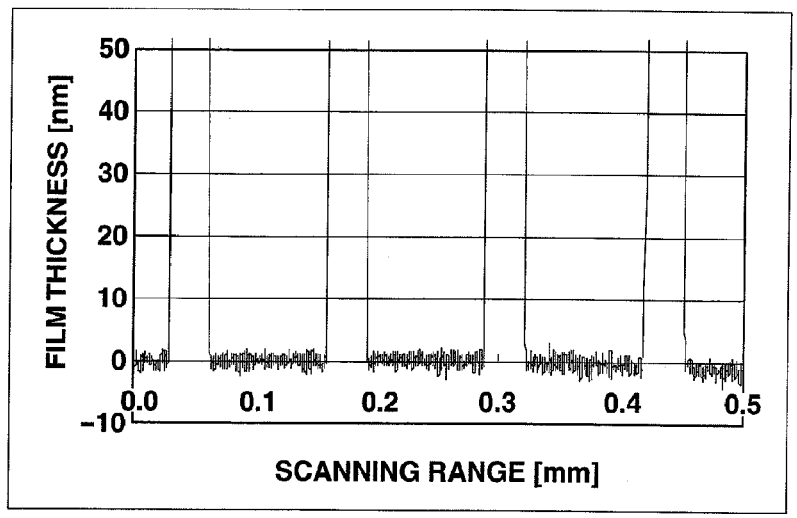
FIG. 3 is a view showing the results of measurement of the ITO portion of the structure-bearing substrate made in Reference 3.

The shape of the photosensitive polyimide structure (structure-bearing ITO substrate) was measured by use of a microfigure measuring instrument, SUREFCORDER ET 4000A, made by Kosaka Laboratory Ltd. The measuring conditions included a measuring range of 0.5 mm, a feed rate of 0.05 mm/sec and a needle contact pressure or measuring force of 10 μN. The structure-bearing ITO substrate was observed by use of a confocal laser microscope (Real Time Scanning Laser Microscope 1LM21D, made by Lasertech Corporation). The confocal laser microphotograph of the structure-bearing ITO substrate is shown in FIG. 1. The results of the measurement of the ITO portion of the structure-bearing substrate are shown in FIGS. 2 and 3, respectively.

Comparative Example 1

0.150 g (0.340 mmol) of PTA synthesized in Reference 1 and 0.307 g (0.340 mmol) of NSO-2 synthesized in Reference 2 were completely dissolved in 75 g of 1,3-dimethyl-2-imidazolidinone (hereinafter abbreviated as DMI) in a nitrogen atmosphere. The resulting solution was mixed with 15.0 g of 2,3-butanediol (hereinafter abbreviated as 2,3-BD) and then with 7.5 g of hexyl acetate (hereinafter abbreviated as nHAc) and agitated to prepare a charge-transporting varnish (solid content: 1.5 wt %).

The prepared varnish was spray-coated by use of a spray coating device (NVD-200, made by Fujimori Gijyutu Kenkyusho, K.K.) onto the structure-bearing ITO substrate, prepared in Reference 3 and subjected to UV-03 treatment for 1 minute.

The coating conditions of the spray coating device were set at an intended film thickness of 30 nm, X and Y scan directions of 200 mm, X and Y offsets of 0 mm, a scan pitch of 12 mm, a gap of 100 mm, a nozzle speed of 300 mm/second, an amount of nitrogen of 5 L/min, a chemical supply of 0.6 mL/min, a coating waiting time of 5 sec, and a takt time of 30 seconds.

After the coating, baking was carried out on a hot plate at 50° C. for 5 minutes and subsequently at 230° C. for 15 minutes in air to form a charge-transporting thin film.

Figure 4:
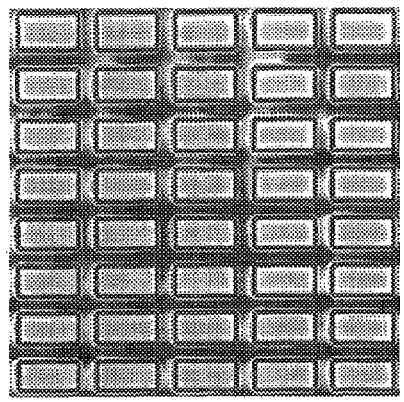
FIG. 4 is a confocal laser microphotograph of a charge transporting thin film made in Comparative Example 1.
Figure 5:
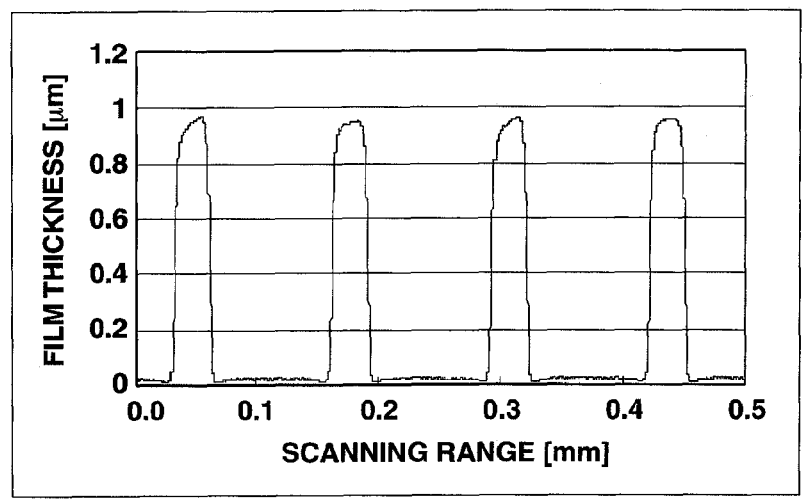
FIG. 5 is a view showing the results of measuring a film thickness distribution of the charge transporting thin film made in Comparative Example 1.
Figure 6:
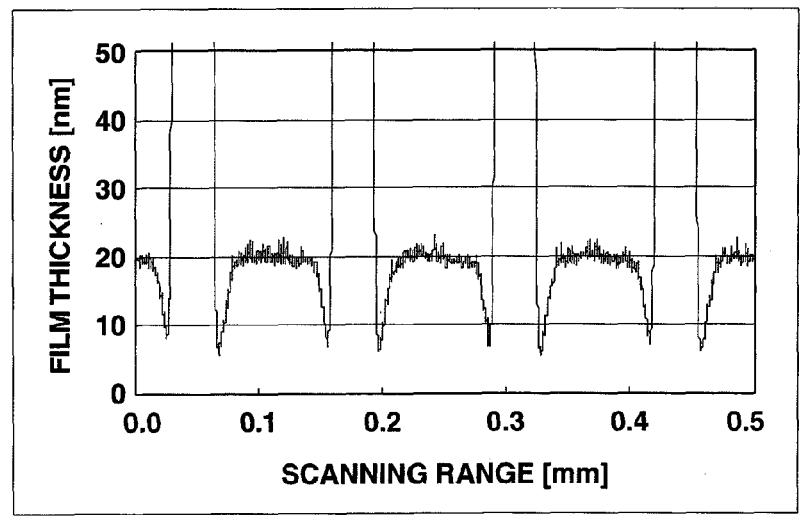
FIG. 6 is a view showing the results of measuring a film thickness distribution of the charge transporting thin film made in Comparative Example 1.

The confocal laser microphotograph of the charge-transporting thin film coated on the structure-bearing substrate is shown in FIG. 4. The results of the measurement of the film thickness distribution of the charge-transporting thin film of Comparative Example 1 are shown in FIGS. 5 and 6, respectively.

Figure 7:
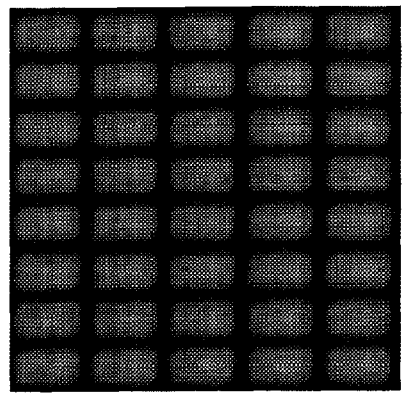
FIG. 7 is a view showing a light-emitting face of an OLED made in Comparative Example 1.

Next, the substrate was introduced into a vacuum deposition apparatus, followed by successive deposition of α-NPD, Alq$_3$, LiF and Al to obtain an OLED element. The film thicknesses were 30 nm, 50 nm, 1 nm and 120 nm, respectively, and the deposition operations were conducted when the pressure arrived at $8\times10^{-4}$ Pa or below. The deposition rates were 0.3 to 0.4 nm/sec except for LiF and 0.02 to 0.04 nm/sec for LiF. Move operations during the deposition operation steps were carried out in vacuum. The emission face of the resulting OLED element is shown in FIG. 7.

Example 1

0.150 g (0.340 mmol) of PTA synthesized in Reference 1 0.307 g and (0.340 mmol) of NSO-2 synthesized in Reference 2 were completely dissolved in 17.5 g of DMI in a nitrogen atmosphere. The resulting solution was mixed with 15.0 g of 2,3-BD and then with 7.5 g of nHAc and agitated. Finally, 0.046 g of a mixed solvent of trimethoxy(3,3,3-trifluoropropyl)silane and tri(methoxyphenyl)silane at 1:2 (ratio by weight) was added, thereby preparing a charge-transporting varnish (solid content: 1.5 wt %).

Using the prepared varnish, a charge-transporting thin film was formed in the same manner and under the same conditions as in Comparative Example 1.

Figure 8:
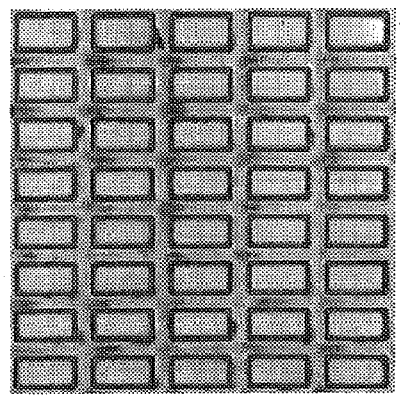
FIG. 8 is a confocal laser microphotograph of a charge transporting thin film made in Example 1.
Figure 9:
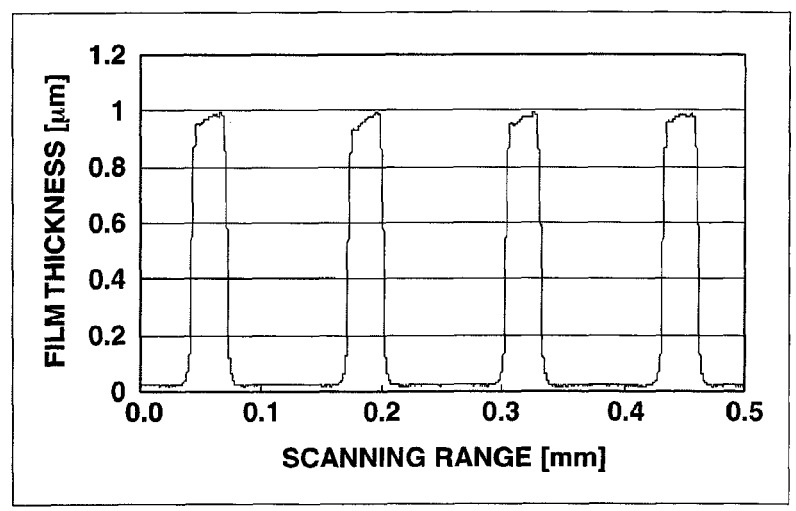
FIG. 9 is a view showing the results of measuring a film thickness distribution of the charge transporting thin film made in Example 1.
Figure 10:
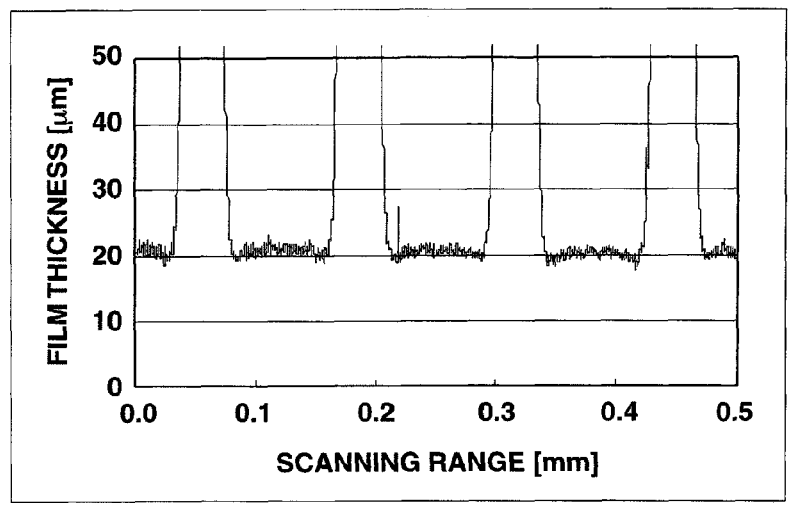
FIG. 10 is a view showing the results of measuring a film thickness distribution of the charge transporting thin film made in Example 1.

FIG. 8 shows a confocal laser microphotograph of the charge-transporting thin film coated onto a structure-bearing substrate. FIGS. 9 and 10 show the results of measurement of a thickness distribution of the charge-transporting thin film of Example 1.

Figure 11:
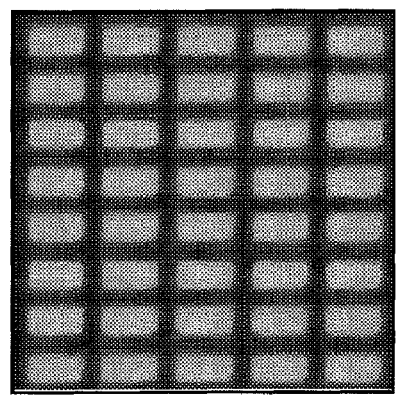
FIG. 11 is a view showing a light-emitting face of an OLED made in Example 1.

Next, the substrate was introduced into a vacuum deposition apparatus, followed by successive deposition of α-NPD, Alq$_3$, LiF and Al, thereby obtaining an OLED element. The emission face of the resulting OLED element is shown in FIG. 11.

As shown in FIGS. 4 to 11, it turns out that the varnish of Example 1 is able to form a film uniformly in the pixels compared with that of Comparative Example 1, and the resulting element enables light to be emitted evenly.

Comparative Example 2

0.0601 g (0.136 mmol) of PTA synthesized in Reference 1 and 0.1226 g (0.136 mmol) of NSO-2 synthesized in Reference 2 were completely dissolved in 14.0 g of DMI in a nitrogen atmosphere. The resulting solution was mixed with 6.0 g of cyclohexanol (hereinafter abbreviated as CHA) and then with 2.0 g of 2,3-BD and agitated, thereby preparing a charge-transporting varnish (solid content: 1.5 wt %).

Using this varnish, a uniform thin film having a thickness of about 30 nm was formed on an ITO glass substrate by a spin coating method, followed by introduction into a vacuum deposition apparatus and successive deposition of α-NPD, Alq$_3$, LiF and Al in the same manner as in Comparative Example 1, thereby obtaining an OLED element.

Example 2

0.0601 g (0.136 mmol) of PTA synthesized in Reference 1 and 0.1226 g (0.136 mmol) of NSO-2 synthesized in Reference 2 were completely dissolved in 14.0 g of DMI in an atmosphere of nitrogen. The resulting solution was admixed with 6.0 g of CHA and subsequently with 2.0 g of 2,3-BD and agitated. Finally, 0.018 g of a mixed solvent of trimethoxy(3,3,3-trifluoropropyl)silane and tri(methoxyphenyl)silane at 1:2 (ratio by weight) was added, thereby preparing a charge-transporting varnish (solid content: 1.5 wt %).

Using this varnish, a uniform thin film having a thickness of about 30 nm was formed on an ITO glass substrate by a spin coating method, followed by introduction into a vacuum deposition apparatus and successive deposition of α-NPD, Alq$_3$, LiF and Al in the same manner as in Comparative Example 1, thereby obtaining an OLED element.

Figure 12:
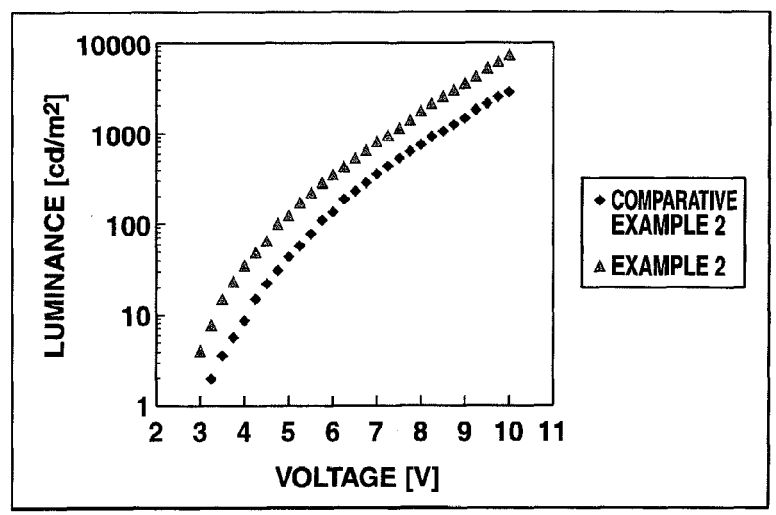
FIG. 12 is a view showing a voltage-luminance characteristic of OLED elements made in Examples 2 and Comparative Example 2.
Figure 13:
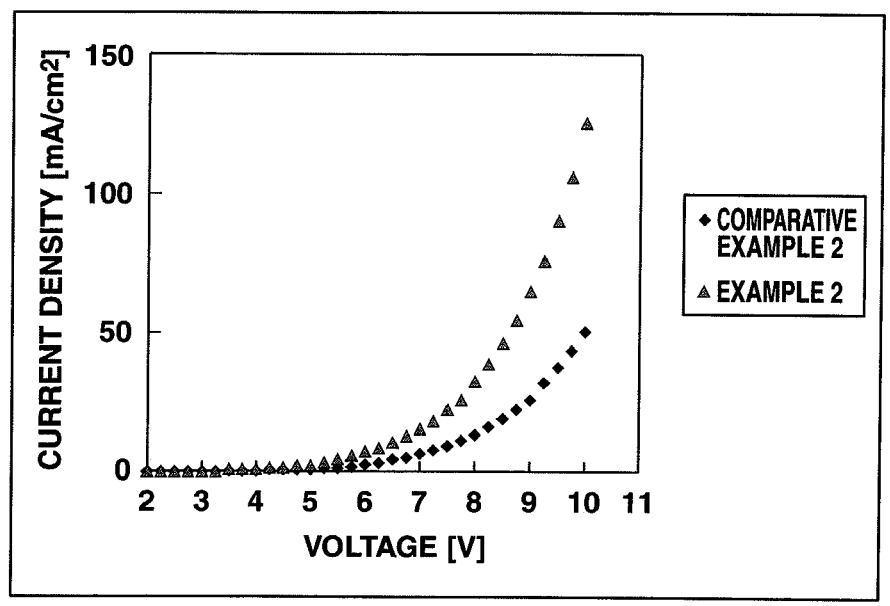
FIG. 13 is a view showing a voltage-current density characteristic of OLED elements made in Example 2 and Comparative Example 2.

The characteristics of the OLED elements obtained in Example 2 and Comparative Example 2 were evaluated. The results are shown in FIGS. 12 and 13. The characteristics of the OLED were measured by use of an organic EL emission efficiency measuring device (EL1003, made by Precise Gauges Co., Ltd.)

As shown in FIGS. 12, 13, it turns out the OLED element obtained in Example 2 is more excellent in voltage-luminance and voltage-current density than the element of Comparative Example 2.

The invention claimed is:

1. A charge-transporting varnish comprising an oligoaniline derivative represented by the general formula (1) or a quinonediimide derivative that is an oxidized product thereof, an electron-accepting dopant substance or a hole accepting dopant substance, a silane compound, and a solvent

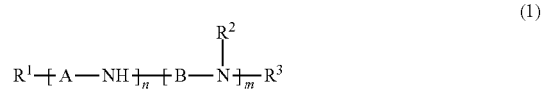

(1)

wherein $R^1$, $R^2$ and $R^3$ are each independently a hydrogen atom, a halogen atom, a hydroxyl group, an amino group, a silanol group, a thiol group, a carboxyl group, a phosphoric group, a phosphoric ester group, an ester group, a thioester group, an amide group, a nitro group, a monovalent hydrocarbon group, an organooxy group, an organoamino group, an organosilyl group, an organothio group, an acyl group or a sulfonic group, A and B are each independently a divalent group represented by the general formula (2) or (3):

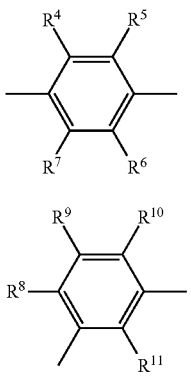
(2)

(3)

wherein $R^4$-$R^{11}$ are each independently a hydrogen atom, a halogen atom, a hydroxyl group, an amino group, a silanol group, a thiol group, a carboxyl group, a phosphoric group, a phosphoric ester group, an ester group, a thioester group, an amide group, a nitro group, a monovalent hydrocarbon group, an organooxy group, an organoamino group, an organosilyl group, an organothio group, an acyl group or a sulfonic group, and m and n are each independently an integer of 1 or over with the proviso that m+n≤20, wherein said silane compound is at least one selected from the group consisting of dialkoxysilane compounds, trialkoxysilane compounds, tetraalkoxysilane compounds and silicone compounds.

2. The charge-transporting varnish of claim 1, wherein said oligoaniline derivative or quinonediimine derivative that is an oxidized product thereof is an oligoaniline derivative represented by the general formula (4) or an quinonediimine derivative that is an oxidized product thereof,

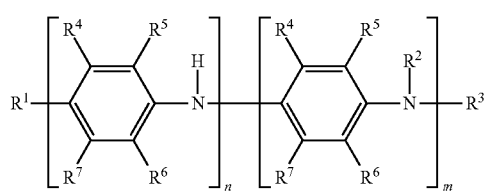
(4)

wherein $R^1$-$R^7$, m and n are as defined above.

3. The charge-transporting varnish of claim 1, wherein said electron-accepting dopant substance is an arylsulfonic acid derivative represent by the formula (5):

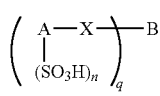
(5)

wherein X is O, S or NH, A is a naphthalene ring or anthracene ring that may have a substituent other than X and n is the number of $SO_3H$ groups, B is an unsubstituted or substituted hydrocarbon group, a 1,3,5-triazine group or an unsubstituted or substituted group represented by the following group (6) or (7):

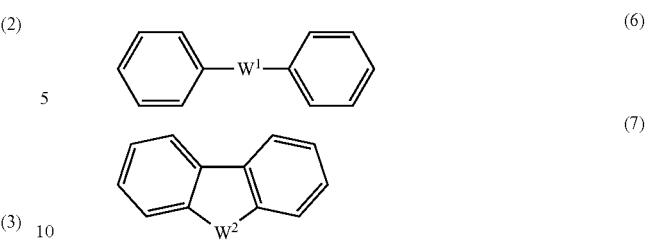
(6)

(7)

wherein $W^1$ and $W^2$ are each independently O, S, S(O), S($O_2$), or unsubstituted or substituent group-bonded N, Si, P or P(O), n is the number of sulfonic acid groups bonded to A with the proviso that n is an integer satisfying 1≤n≤4, and q is the bond number between B and X with the proviso that q is an integer satisfying 1≤q.

4. The charge-transporting varnish of claim 1, wherein said solvent is an organic solvent.

5. The charge-transporting varnish of claim 4, which comprises 0.0001 to 10 wt % of water relative to said organic solvent.

6. The charge-transporting varnish of claim 1, wherein a proportion of silane compound is in the range of 1 to 50 wt % relative to the total weight of solids in said charge-transporting varnish.

7. A charge transporting thin film prepared from the charge-transporting varnish of any one of claims 1 to 6.

8. An organic electroluminescence element having the charge transporting thin film of claim 7.

9. The charge-transporting varnish of claim 1, wherein said silane compound is at least two selected from the group consisting of dialkoxysilane compounds, trialkoxysilane compounds, tetraalkoxysilane compounds and silicone compounds.

10. The charge-transporting varnish of claim 1, wherein said silane compound is at least one selected from the group consisting of dialkoxysilane compounds, trialkoxysilane compounds and tetraalkoxysilane compounds.

11. The charge-transporting varnish of claim 10, wherein said silane compound is at least one selected from the group consisting of trialkoxysilane compound represented by the formula (9), dialkoxysilane compound represented by the formula (10), and tetraalkoxysilane compound represented by the formula (11):

$Y^1Si(OY^2)_3$ (9)

$Y^3Y^4Si(OY^5)_2$ (10)

$Si(OY^6)_4$ (11)

wherein $Y^1$ is a halogen atom, a hydrogen atom, or an alkyl group having 1 to 12 carbon atoms, an alkenyl group having 2 to 12 carbon atoms, an alkynyl group having 2 to 12 carbon atoms, an aryl group or a heteroaryl group, each of which may be substituted with Z, $Y^2$ is an alkyl group having 1 to 12 carbon atoms, $Y^3$ and $Y^4$ are each independently a halogen atom, or an alkyl group having 1 to 12 carbon atoms, an alkenyl group having 2 to 12 carbon atoms, an alkynyl group having 2 to 12 carbon atoms, an aryl group or a heteroaryl group, each of which may be substituted with Z, $Y^5$ is an alkyl group having 1 to 12 carbon atoms, $Y^6$ is an alkyl group having 1 to 12 carbon atoms, and Z is a halogen atom, a haloalkyl group having 1 to 12 carbon atoms, an alkyl group having 1 to 12 carbon atom, a hydroxyl group, a mercapto group, an amino group, a haloalkoxy group having 1 to 12 carbon atoms, an alkoxy group having 1 to 12 carbon atoms, an alkenyl group having 2 to 12 carbon atoms, a haloalkenyl group having 2 to 12 carbon atoms, an alkynyl group having 2 to 12 carbon atoms, a haloalkynyl group having 2 to 12 carbon atoms, an alkylthio group having 1 to 12 carbon atoms, a monoalkylamino group having 1 to 12 carbon atoms, a dialkylamino group having 2 to 12 carbon atoms, an alkylcarbonyl group having 2 to 12 carbon atoms, an alkenylcarbonyl group having 3 to 12 carbon atoms, an alkynylcarbonyl group having 3 to 12 carbon atoms, an alkylcarbonyloxy group having 2 to 12 carbon atoms, an alkenylcarbonyloxy group having 3 to 12 carbon atoms, an alkynylcarbonyloxy group having 3 to 12 carbon atoms, an aryl group, a halogenated aryl group, a heteroaryl group, or a halogenated heteroaryl group.

12. The charge-transporting varnish of claim 11, wherein said silane compound is at least two selected from the group consisting of trialkoxysilane compound represented by the formula (9), dialkoxysilane compound represented by the formula (10), and tetraalkoxysilane compound represented by the formula (11).

\* \* \* \* \*